United States Patent
Chen et al.

(10) Patent No.: US 9,405,203 B2
(45) Date of Patent: Aug. 2, 2016

(54) PIXEL BLENDING FOR MULTIPLE CHARGED-PARTICLE BEAM LITHOGRAPHY

(71) Applicant: Applied Materials, Inc., Santa Clara, CA (US)

(72) Inventors: Jang Fung Chen, Cupertino, CA (US); Thomas Laidig, Richmond, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/203,371

(22) Filed: Mar. 10, 2014

(65) Prior Publication Data

US 2014/0192334 A1    Jul. 10, 2014

Related U.S. Application Data

(63) Continuation-in-part of application No. 12/475,114, filed on May 29, 2009, now Pat. No. 8,670,106, which is a continuation-in-part of application No.
(Continued)

(51) Int. Cl.
  *G03F 7/20* (2006.01)

(52) U.S. Cl.
  CPC .......... *G03F 7/70275* (2013.01); *G03F 7/2059* (2013.01); *G03F 7/704* (2013.01);
  (Continued)

(58) Field of Classification Search
  CPC . G03F 7/2051; G03F 7/2059; G03F 7/70375; G03F 7/70383; G03F 7/704; G03F 7/70466; G03F 7/70508; G03F 7/70291
  See application file for complete search history.

(56) References Cited

U.S. PATENT DOCUMENTS

| 4,808,285 | A | * | 2/1989 | Chen et al. | .............. 204/157.15 |
| 5,607,801 | A | * | 3/1997 | Nozue | ................... B82Y 10/00 |
| | | | | | 430/22 |

(Continued)

FOREIGN PATENT DOCUMENTS

| CN | 1918517 A | 2/2007 |
| CN | 101176042 A | 5/2008 |

(Continued)

OTHER PUBLICATIONS

English translation of Chinese Office Action for Application No. 201180042657.9 dated Oct. 10, 2014; 11 total pages.

(Continued)

*Primary Examiner* — Thomas R Artman
(74) *Attorney, Agent, or Firm* — Patterson & Sheridan, LLP

(57) ABSTRACT

System and method for applying mask data patterns to substrate in a lithography manufacturing process are disclosed. In one embodiment, the method includes providing a parallel imaging writer system, where the parallel imaging writer system includes a plurality of multiple charged-particle beam (MCB) imaging units arranged in one or more parallel arrays, receiving a mask data pattern to be written to a substrate, processing the mask data pattern to form a plurality of partitioned mask data patterns corresponding to different areas of the substrate, identifying one or more objects in an area of the substrate to be imaged by corresponding MCB imaging units, and performing multiple exposures to image the one or more objects in the area of the substrate by controlling the plurality of MCB imaging units to write the plurality of partitioned mask data patterns in parallel.

4 Claims, 38 Drawing Sheets

Related U.S. Application Data

12/337,504, filed on Dec. 17, 2008, now Pat. No. 8,253,923.

(60) Provisional application No. 61/099,495, filed on Sep. 23, 2008, provisional application No. 61/162,286, filed on Mar. 21, 2009.

(52) U.S. Cl.
CPC ........ *G03F 7/70291* (2013.01); *G03F 7/70466* (2013.01); *G03F 7/70508* (2013.01); *G03F 7/70791* (2013.01)

(56) References Cited

U.S. PATENT DOCUMENTS

| | | | |
|---|---|---|---|
| 5,668,624 A | | 9/1997 | Naraki et al. |
| 5,878,152 A | | 3/1999 | Sussman |
| 6,512,573 B2 | | 1/2003 | Furter |
| 7,167,296 B2 | | 1/2007 | Meisburger |
| 7,285,365 B2 | | 10/2007 | Ekberg |
| 7,302,111 B2 | | 11/2007 | Olsson et al. |
| 7,747,977 B1 * | | 6/2010 | Lapanik et al. ............. 716/50 |
| 7,800,811 B2 | | 9/2010 | Lous |
| 8,159,649 B2 | | 4/2012 | Kato |
| 2003/0209676 A1 | | 11/2003 | Loschner et al. |
| 2004/0119021 A1 | | 6/2004 | Parker et al. |
| 2006/0169910 A1 | | 8/2006 | Frosien et al. |
| 2007/0194431 A1 | | 8/2007 | Corisis et al. |
| 2013/0003029 A1 | | 1/2013 | Laidig |

FOREIGN PATENT DOCUMENTS

| | | |
|---|---|---|
| CN | 101375372 A | 2/2009 |
| CN | 100465796 C | 3/2009 |
| CN | 100470298 C | 3/2009 |
| TW | 512257 B | 12/2002 |
| WO | 2010/036524 A1 | 4/2010 |

OTHER PUBLICATIONS

PCT Notification of Transmittal of the International Search Report and the Written Opinion of the International Searching Authority for International Application No. PCT/US2015/017668 dated May 29, 2015; 11 total pages.

* cited by examiner

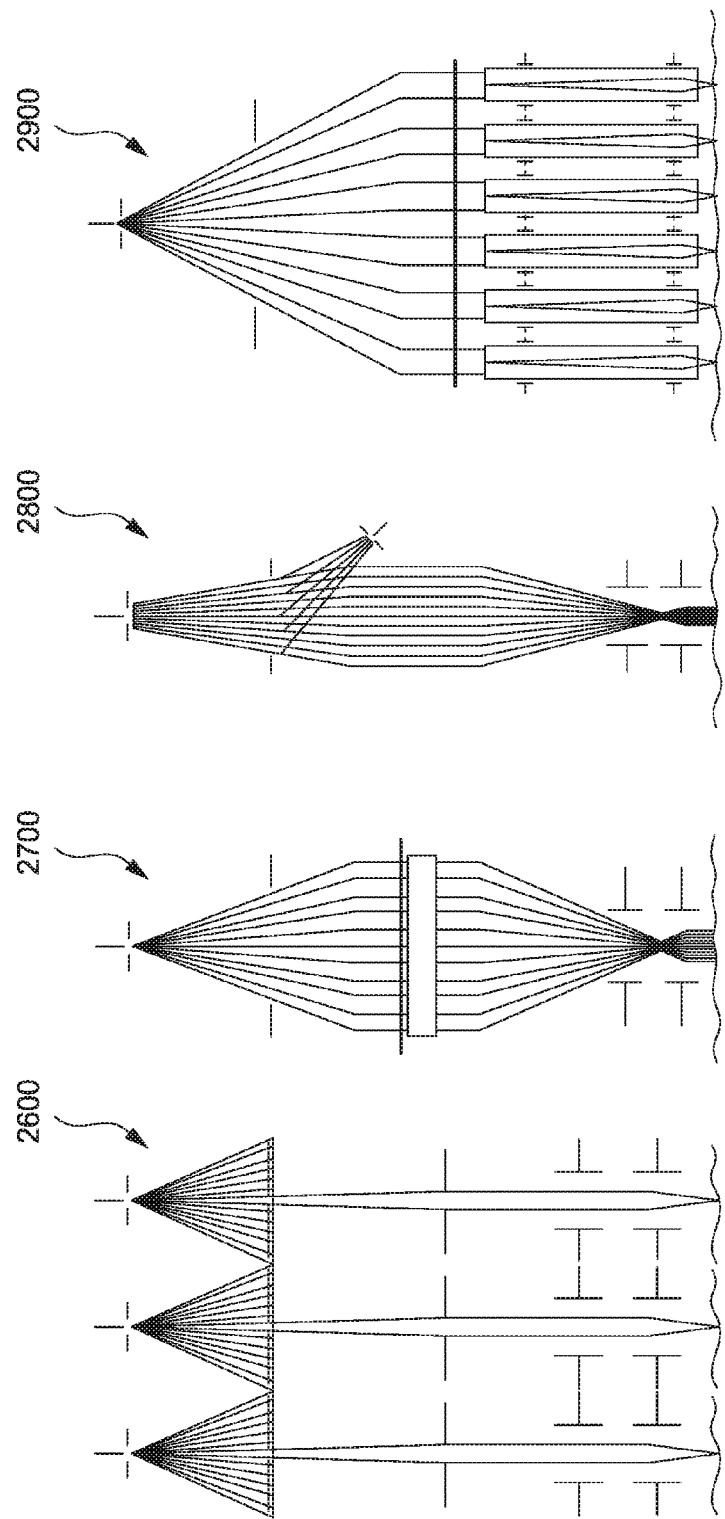

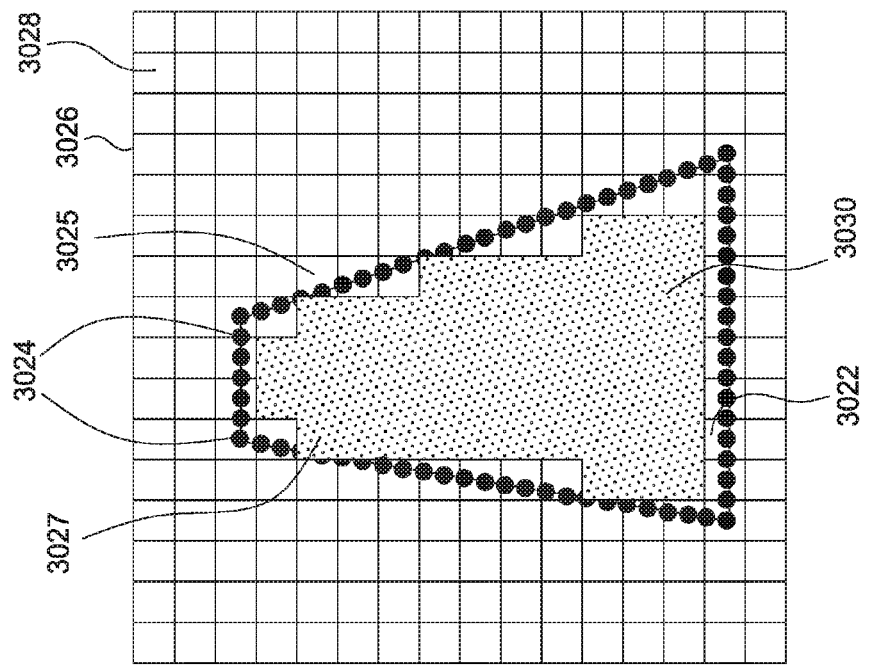
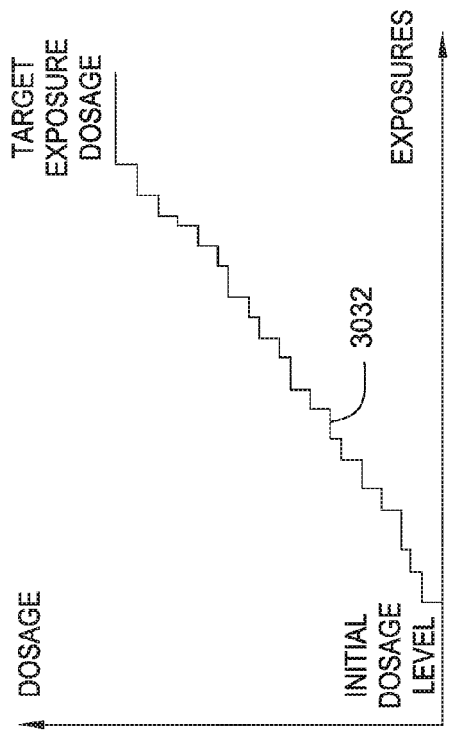
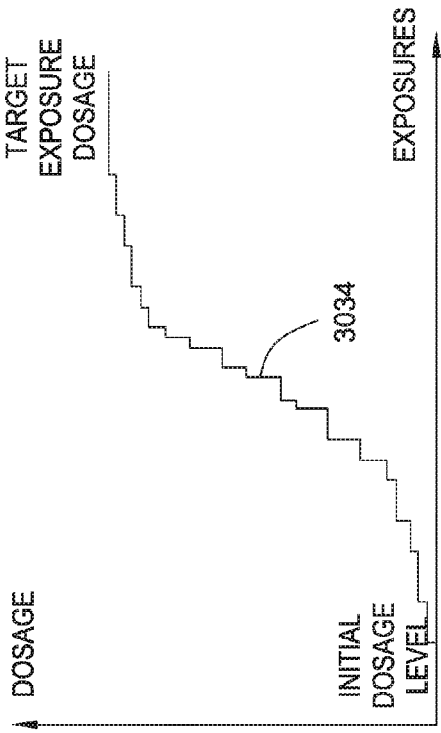

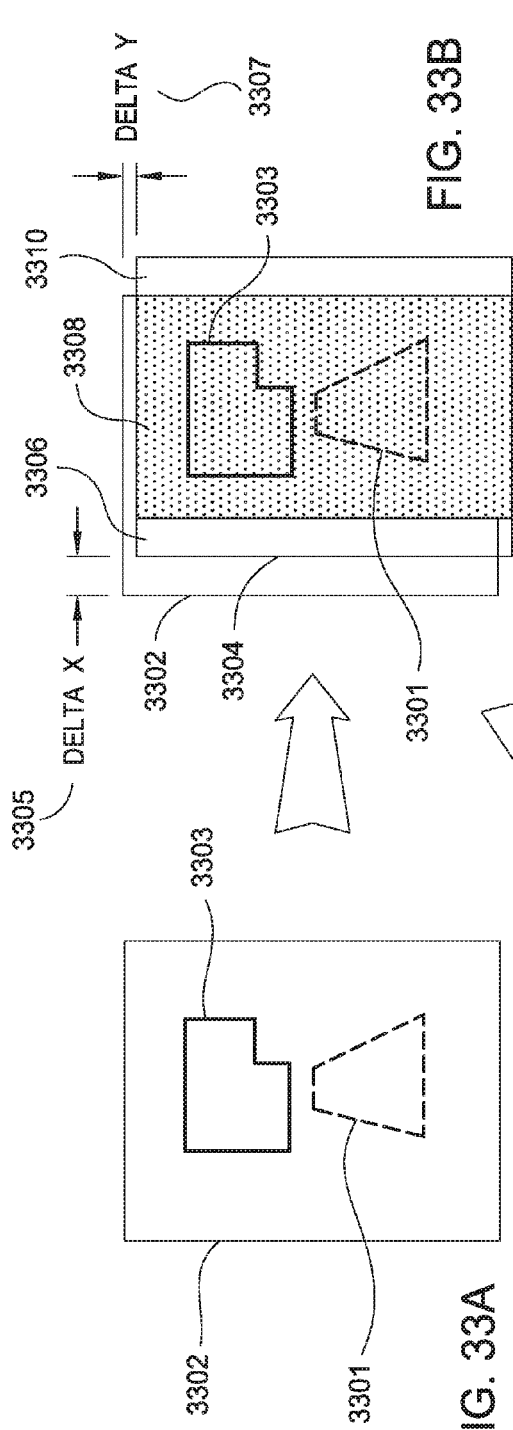
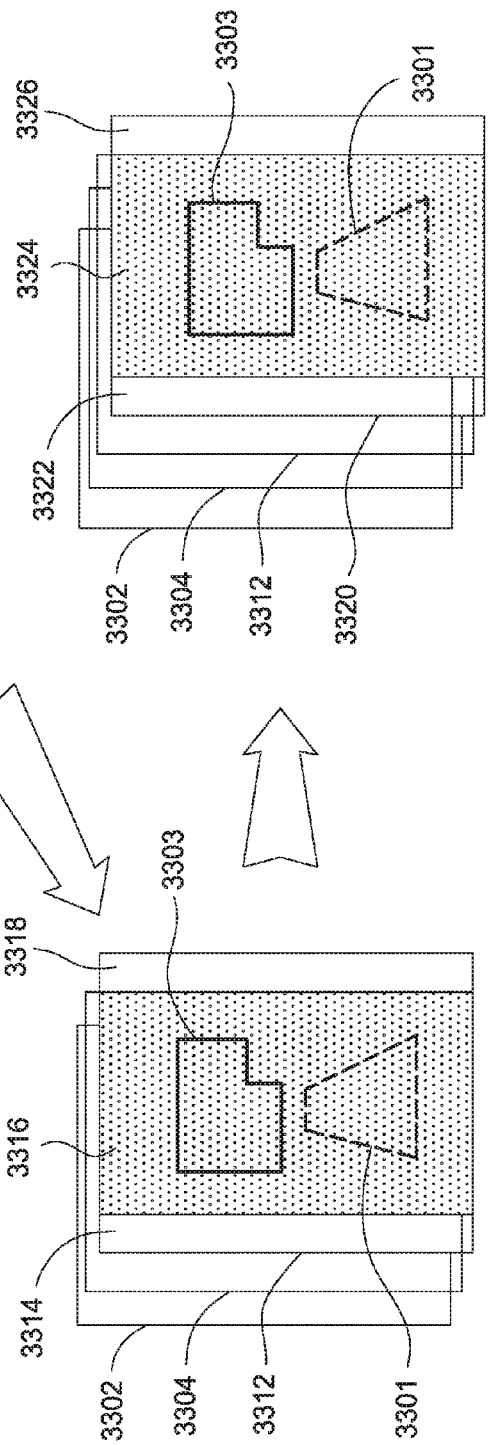
FIG. 33A  FIG. 33B  FIG. 33C  FIG. 33D

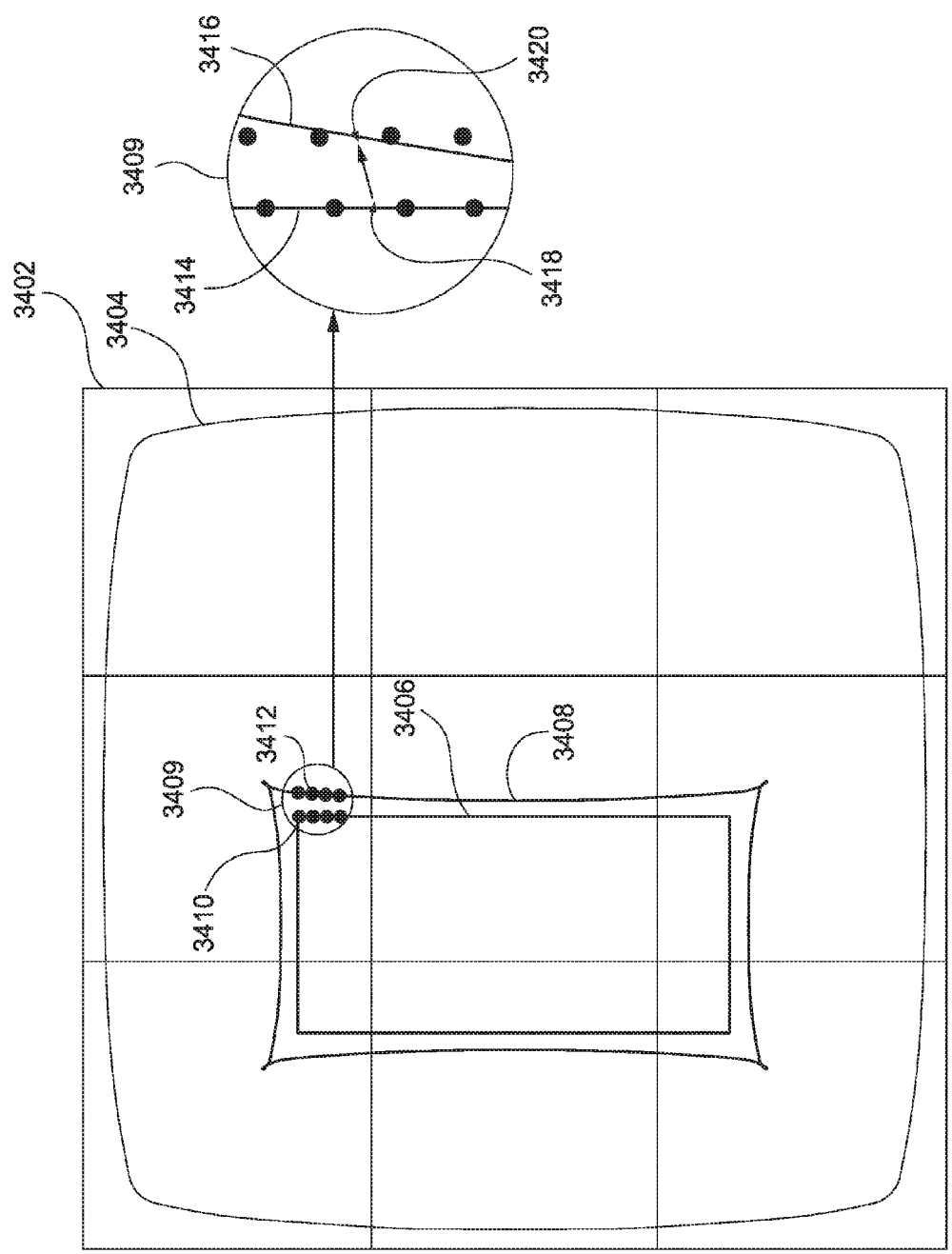

PIXEL BLENDING FOR MULTIPLE CHARGED-PARTICLE BEAM LITHOGRAPHY

CROSS REFERENCE TO RELATED APPLICATIONS

This application is a continuation-in-part of, and claims priority under 35 U.S.C. §120 to U.S. non-provisional application bearing Ser. No. 12/475,114, filed May 29, 2009, which claim benefit of non-provisional patent application bearing Ser. No. 12/337,504, filed Dec. 17, 2008, which claims the benefit of U.S. provisional application No. 61/099,495, "An Optical Imaging Writer System," filed Sep. 23, 2008. U.S. non-provisional patent application Ser. No. 12/475,114 also claims the benefit of provisional application bearing Ser. No. 61/162,286, filed Mar. 21, 2009. The aforementioned United States applications are hereby incorporated by reference in their entirety.

FIELD OF THE INVENTION

The present invention relates to the field of lithography for manufacturing. In particular, the present invention relates to system and method for applying mask data patterns to substrate in a lithography manufacturing process.

BACKGROUND OF THE INVENTION

Fast-paced technology progress in semiconductor integrated circuit (IC) industry has benefited well for the manufacturing of active matrix liquid crystal display (AMLCD) TV and computer monitor displays. In the recent years, the size of LCD TV and computer monitor displays has grown to be larger and yet more affordable.

In the semiconductor IC industry, a technology generation is defined by the critical dimension (CD) of the circuit design rules. As each technology generation progresses, the IC of the later generation has smaller feature CD target and tighter tolerance. For the Flat Panel Display (FPD) industry, on the other hand, a technology generation is classified by the physical dimension of substrate used in manufacturing. In one example, the substrate sizes (in millimeter×millimeter) of FPDs sixth generation (G6) in 2005, eighth generation (G8) in 2007, and tenth generation (G10) in 2009 are 1500×1800, 2160×2460, and 2880×3080 respectively.

The lithography challenges in terms of making semiconductor ICs and FPD substrates are both trying to make larger sizes more affordable. However, they are entirely different from the manufacturing perspective. For the IC industry, a primary challenge is small CD features can be produced on a round 300 mm wafer. The goal is to pack as many transistors as possible for achieving better functionalities in the same die size. But for the FPD industry, one primary challenge is how large an entire rectangle substrate can be processed. The larger FPD substrate can be processed in a manufacturing line, the bigger size TVs or monitors can be produced with lower cost. The typical LCD TVs and monitors are designed with more sophisticated thin film transistor (TFT) for better performance. Still, the TFT CD target remains in the same specification range. In one viewpoint, one of the main challenges for FPD manufacturing is to keep throughput in pace with justifiable economics for each successive generation. Achieving profitable process yield is a key consideration, and the manufacturing process window needs to be preserved.

Conventionally, lithography technologies for manufacturing of FPD are derived from lithography process technologies for making semiconductor ICs. Majority of lithography exposure tools used for making FPD substrates are projection stepper and/or scanner systems. These are either 2-times reduction or 1-to-1 projection from mask to substrate. In order to project mask patterns to the substrate, the mask must first be made with the acceptable CD specifications. The FPD mask manufacturing process is similar to the one used for manufacturing semiconductor ICs, with the exception that the mask size for making semiconductor ICs is about 150 mm or 6 inches per side, whereas the mask size for manufacturing FPD, in one example, may be nearly 8-times larger per side, or physically more than one meter per side.

FIG. 1 illustrates a conventional configuration of projection exposure tool used for scanning mask patterns onto FPD substrate. In this configuration, the exposure sources used are mainly high pressure mercury (Hg) short-arc lamps. The incoming illumination light is reflected by a light folding mirror 102, and the reflected light passes through a mask 104, a projection lens 106 before it reaches a FPD substrate 108. The concern of using this conventional mask-based exposure tool configuration as shown in FIG. 1 for the upcoming FPD lithography manufacturing is the issue of handling the increasing physical size of masks. In one example, for the G8 FPD, the size of a mask is about 1080 mm×1230 mm. The area size of G8 substrate is four times larger. The TFT CD feature specification is in the range of 3 microns±10%. The CD control for TFT over more-than-two-meters per side of G8 substrate is more challenging than controlling specifications for printing advanced IC features on a 300 mm silicon wafer. The challenge facing the FPD industry is to build such a mask-based exposure tool cost effectively for the upcoming FPD generations while preserving acceptable lithography process window.

To mitigate CD uniformity issue over the entire FPD exposure field, one approach is to use multiple exposures method. The nominal exposure is composed of several component exposures in adequate proportions. Each component exposure uses pre-selected wavelength for illumination along with the corresponding projection lens for scanning and stepping. More than one projection lenses need to be included in this type of exposure tool but only single illumination source is equipped. This is due to the need of using high powered Hg short-arc illumination sources in kilo Watts (KW) for throughput. The selection of exposure wavelength can be done by applying adequate filter to the source. In one example, this multi-wavelength exposure method relaxes the negative impact on CD uniformity over a G8 substrate hence allowing more economical quality of lens and illumination set-up to be used.

In using multi-wavelength exposures, it is necessary to specify more stringent CD target and uniformity on the mask itself. In one example, the TFT mask CD tolerance is under 100 nm, much smaller than otherwise necessary for the nominal 3 microns mask CD target. One reason is that the process window for FPD lithography manufacturing can be more manageable for the existing exposure tool configuration. Unfortunately, the tighter FPD mask CD specifications required would push the already costly mask set to be even more expensive. In some situations, making a critical level mask for the G8 FPD becomes very expensive and has long delivery lead time.

Yet another problem with the conventional approach is the defect density control for the use of larger sized masks. Lithography processing with such a large size mask using multiple exposures, even starting with defect free mask, is prone to introduce detrimental defects. A defect prone process impacts yield and ultimately the cost of the mask.

FIG. 2 illustrates a conventional mask making exposure tool configuration. In this exposure tool configuration, illumination light 202 is sent to a beam splitter 204 and then partially reflected to illuminate the spatial light modulator (SLM) 206 through a Fourier lens 208. Then, the imaging light rays reflected back, pass through the Fourier lens 208, the beam splitter 204, the Fourier filter 210 and the reduction lens 212, and finally reach to the mask blank substrate 216. Mask data 214 is sent to the SLM 206 electronically to set the micro-mirror pixels. The reflected light produce bright spots on the mask blank substrate 216, or otherwise absence of reflected light would produce dark spots on the mask blank substrate 216. By controlling and composing the reflections, mask data patterns can be transferred to the mask blank substrate 216.

Note that for this type of exposure tool configuration, the illumination light path is folded in order to illuminate the SLM at a right angle incidence. This folded illumination path makes a "T" joint to the exposure imaging path. In addition to high power illumination source, this type of exposure system requires using projection lens with high reduction ratio in order to write mask pattern in high accuracy and precision. Typically, the lens reduction ratio is about 100 times. Using such a high reduction ratio of lens makes the exposure field very small with a single SLM die. The physical die size for SLM is in the neighborhood of 1 cm. After a 100-times reduction, the SLM writing field is reduced to around 100 microns. This writing field size is very small and therefore slow when attempting to write a full G8 FPD mask.

Another conventional approach is to use multiple laser beams to illuminate the SLM in succession. The multiple beams are generated by reflecting a single illumination laser source from multi-faced rotating mirrors. Multiple illumination beams speed up mask writing as they make multiple exposures at a given time. With this configuration, in one instance, the time for writing a G8 FPD mask takes nearly twenty hours. Such a long write time makes machine control expensive to sustain both mechanically and electronically, hence increases the cost of the FPD mask produced. Using the same exposure tool for the upcoming G10 or beyond, the cost of manufacturing FPD masks will be even higher.

In another conventional approach, to address the mask cost issue for low volume prototyping application, one exposure tool configuration is to make use of transparent SLM as the mask. This is done such that the mask pattern can be read into SLM to show desired mask patterns without the need to make a real physical mask. The function of such a transparent SLM mask takes place of the real mask. This saves the mask cost. From the exposure tool configuration perspective, this method is essentially the same as the mask-based projection system. Unfortunately, the SLM mask has lower image quality as compared to the image quality on an actual mask. It does not meet the pattern specification requirements for FPD manufacturing.

In yet another conventional approach, a process for roll-to-roll manufacture of a display by synchronized photolithographic exposure on a substrate web is described in U.S. Pat. No. 6,906,779 (the '779 patent). The '779 patent teaches a method to expose mask pattern on a roll of substrate. In addition, another conventional method for doing roll-to-roll lithography is described in the article "High-Speed Roll-to-Toll Nanoimprint Lithography on Flexible Plastic Substrates" by Se Hyun Ahn, etc., *Wiley-VCH Verlag GmbH & Co. KGaA, Weinheim; Advanced Materials* 2008, 20, page 2044-2049.

However, in both conventional methods described above, the mask is limited to a predetermined physical size, and the physical mask dimension essentially limits the dimension of the flexible display that can be manufactured. Another problem with the conventional methods described by the '779 patent and the Ahn article is that, to achieve a reasonable printing result, the roll of substrate must be stretched flat during the exposure stage. As a result, the surface flatness of the substrate is not as good as rigid glass substrate, typically used for LCD TV display. With such a mask-based lithography, the depth of focus (DOF) is limited due to uneven substrate surface. Thus, it can be very challenging for these conventional methods to pattern TFT feature critical dimension (CD) at 5 µm or less. To achieve decent definition display based on TFT, it is necessary to have CD for TFT mask pattern in the neighborhood of 3 µm.

The challenges discussed previously for the manufacturing of future generations of FPDs are driven by the need for cost reduction for the FPD industry. One key motivation is to achieve cost efficiency when the newer manufacturing generation is being adopted. Lithography process requires maintaining throughput efficiency while assuring product yield better than previous generations. This demands wider lithography process window and fewer process defects while contending with bigger FPD substrates. As discussed above, there are numerous shortcomings with the existing exposure tool configurations. One of the major shortcomings is associated with the use of a mask. The size of the mask is too large to be manufactured cost effectively. This shortcoming continues to grow as the size of the mask must increase in order to keep up with future generations of FPDs. Therefore, there is a need for an improved imaging writer system that addresses the issues of the conventional tools and approaches.

SUMMARY

The present invention relates to systems and methods for applying mask data patterns to substrate in a lithography manufacturing process. In one embodiment, the method includes providing a parallel imaging writer system, where the parallel imaging writer system includes a plurality of multiple charged-particle beam (MCB) imaging units arranged in one or more parallel arrays, receiving a mask data pattern to be written to a substrate, processing the mask data pattern to form a plurality of partitioned mask data patterns corresponding to different areas of the substrate, identifying one or more objects in an area of the substrate to be imaged by corresponding MCB imaging units, and performing multiple exposures to image the one or more objects in the area of the substrate by controlling the plurality of MCB imaging units to write the plurality of partitioned mask data patterns in parallel.

In another embodiment, a system for processing image data in a lithography manufacturing process includes a parallel imaging writer system, wherein the parallel imaging writer system includes a plurality of multiple charged-particle beam (MCB) imaging units arranged in one or more parallel arrays, a controller configured to control the plurality of MCB imaging units, where the controller includes logic for receiving a mask data pattern to be written to a substrate, logic for processing the mask data pattern to form a plurality of partitioned mask data patterns corresponding to different areas of the substrate, logic for identifying one or more objects in an area of the substrate to be imaged by corresponding MCB imaging units, and logic for performing multiple exposures to image the one or more objects in the area of the substrate by controlling the plurality of MCB imaging units to write the plurality of partitioned mask data patterns in parallel.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

FIG. 26 illustrates an exemplary implementation of a multiple charged-particle beam imaging unit according to embodiments of the present invention.

FIG. 27 illustrates another exemplary implementation of a multiple charged-particle beam imaging unit according to embodiments of the present invention.

FIG. 28 illustrates yet another exemplary implementation of a multiple charged-particle beam imaging unit according to embodiments of the present invention.

FIG. 29 illustrates another exemplary implementation of a multiple charged-particle beam imaging unit according to embodiments of the present invention.

FIGS. 30a-30d illustrate methods for imaging an object according to embodiments of the present invention.

FIGS. 33a-d illustrate methods for optimizing imaging objects according to embodiments of the present invention.

FIG. 34a illustrates methods for making corrections to the optical imaging writer system according to embodiments of the present invention.

Like numbers are used throughout the specification.

DESCRIPTION OF EMBODIMENTS

System and method are provided for applying mask data patterns to substrate in a lithography manufacturing process. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Embodiments of the present invention use spatial light modulator (SLM) based image project devices. Two types of SLM based image projection may be used, one is the digital micro-mirror device (DMD) and the other is the grating light valve (GLV). Both types of devices may be produced by using micro-electro-mechanical (MEM) manufacturing methods.

Figure 3:
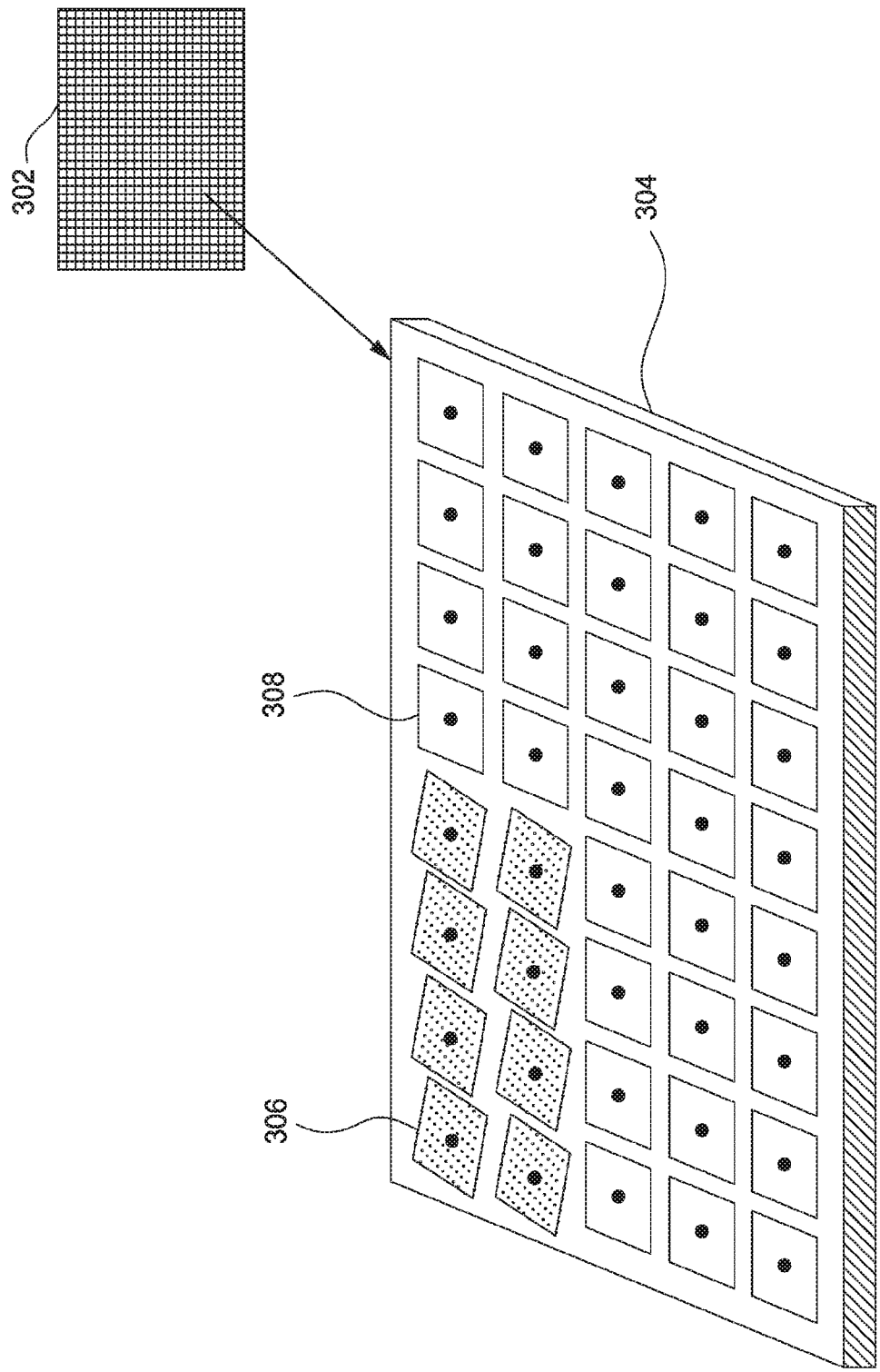
FIG. 3 illustrates an exemplary digital micro-mirror device according to embodiments of the present invention.

FIG. 3 illustrates an exemplary digital micro-mirror device according to embodiments of the present invention. In this example, a single DMD die is represented by numeral 302 and an enlarged and simplified view of the same DMD die is represented by numeral 304. DMD can be addressed by tilting micro-mirrors in fixed angles, typically around ±10° or ±12°, to act as spatial light modulator (SLM). The mirror surface of DMD is highly reflective to the incident illumination. Each micro-mirror can be manipulated to tilt (represented by numeral 306) or left un-changed (represented by numeral 308) by the transistor controller underneath. In one implementation, DMD may have pitch dimension of about 14 μm with about 1 μm space between each micro-mirror. The pixel count on a single DMD die may be 1920×1080 mirror pixels, compatible to high definition television (HDTV) display specifications.

Figure 4:
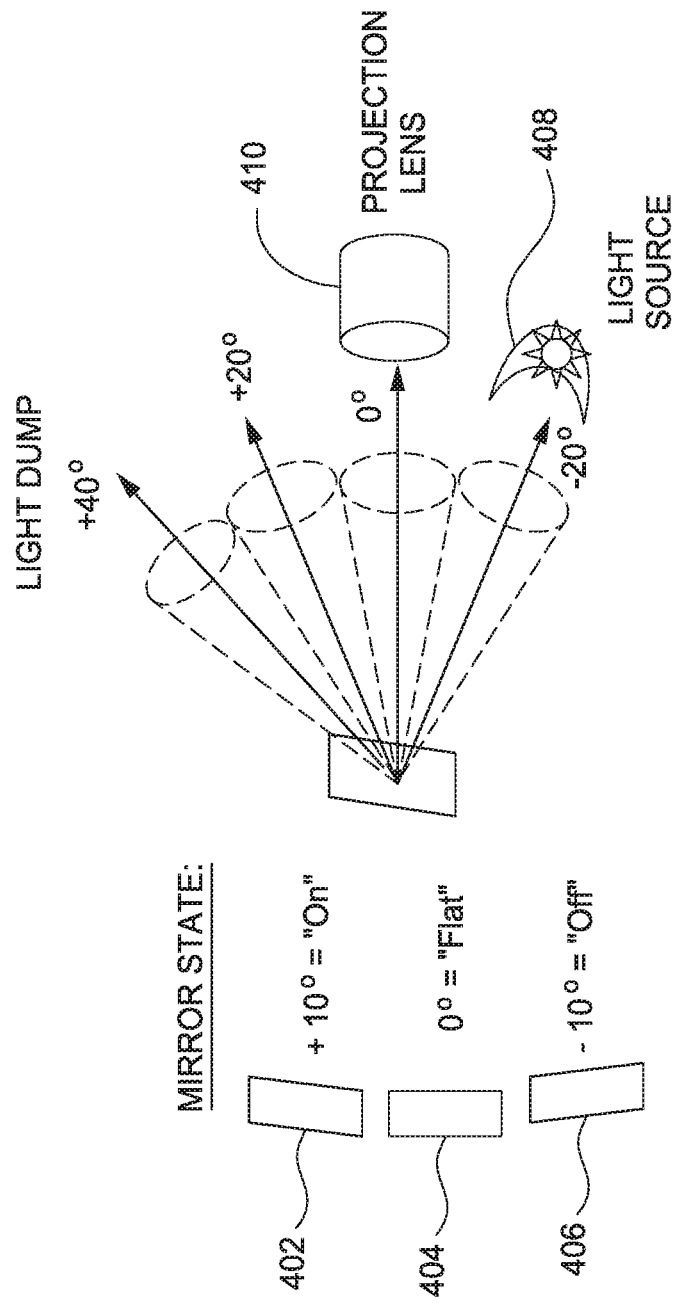
FIG. 4 illustrates a DMD-based projection system according to embodiments of the present invention.

FIG. 4 illustrates a DMD-based projection system according to embodiments of the present invention. In this example, the micro-mirror has three states: 1) "On" State 402 at about +10° tilting angle, 2) "Flat" State 404 at no tilt, and 3) "Off" State 406 at about −10° tilting angle. When a ray of light beams shine from a light source 408 located at −20° angle to the DMD, they can reflect light beams directly to pass through projection lens 410 to form bright spots on the display substrate, for the mirrors that are at "On" State or "1" in binary. For mirrors that are at "Flat" State and "Off" State, or the "0", the light beams reflected in an angle falling outside of the collection cone of the projection lens, at approximately −20° and −40° respectively. Hence no light pass though from those mirror sites, dark spots are then formed on the display substrate. Since each of micro-mirror reflection cannot be visually resolvable by human eyes, a gray shade can be constructed by combining a group of light and dark spot pixels in a ratio when projected. This method enables the projection of realistic images with million shades of grays and colors.

Note that the higher diffraction orders of diffraction beam from the "Flat" State and the $2^{nd}$ order of diffraction beam from the "Off" State can still fall within the collection cone angle of the projection lens. This may create unwanted flare that reduces the desire image contrast. According to embodiments of the present invention, a precisely aimed and focused high intensity illumination source may be used to increase the pixel diffraction efficiency to optimize the design of the projection optics using DMD for imaging writer.

According to other embodiments of the present invention, GLV is another approach for implementing image projection. The top layer of GLV device is a linear array of materials, also referred to as ribbons, which are highly reflective. In one embodiment, ribbons may be 100-1000 μm long, 1-10 μm wide and closely spaced by 0.5 μm. The imaging mechanism of GLV is essentially addressable dynamic diffraction grating. It functions as a phase modulator. A GLV device may include a group of six alternative ribbons deflected to form dynamic diffraction grating.

Figure 5:
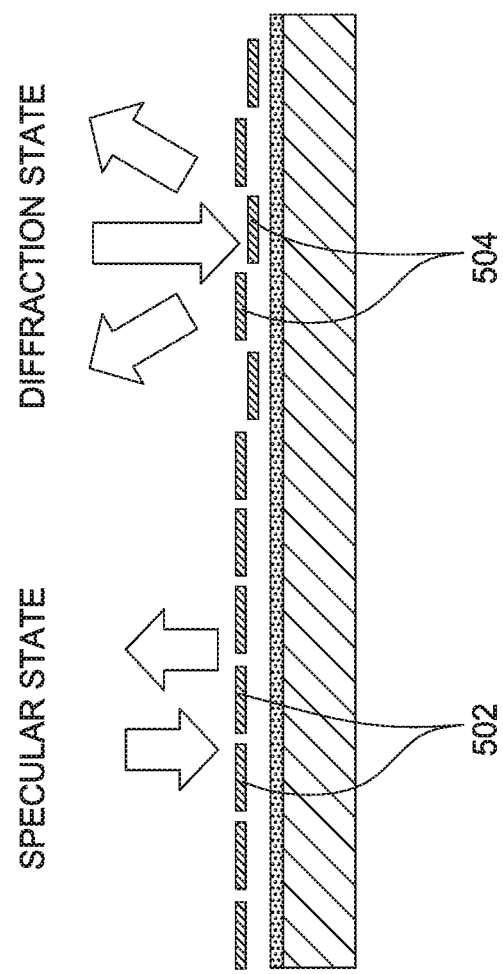
FIG. 5 illustrates an exemplary specular state and diffraction state of a grating light valve (GLV) device according to embodiments of the present invention.

FIG. 5 illustrates an exemplary specular state and diffraction state of a GLV device according to embodiments of the present invention. When the GLV ribbons (in cross-sectional view) are co-planar (represented by numeral 502), the incident light is reflected specularly, i.e. all in the $0^{th}$ diffraction order. When incident light shines on a group of ribbons, where ribbons are deflected in an alternating fashion (represented by numeral 504), a diffraction pattern is formed with strong $\pm 1^{st}$ orders but with suppressed $0^{th}$ order. A high contrast reflection image can be constructed by filtering out either $0^{th}$ or $\pm 1^{st}$ orders. That is, no image may be formed if to re-capture all of $0^{th}$ or $\pm 1^{st}$ orders in the objective lens. Unlike DMD, the entire image in a field of view as formed by GLV is based on scanning line by line since there may be one line of diffraction images are formed by the linear array of grating ribbons at one time.

Figure 1:
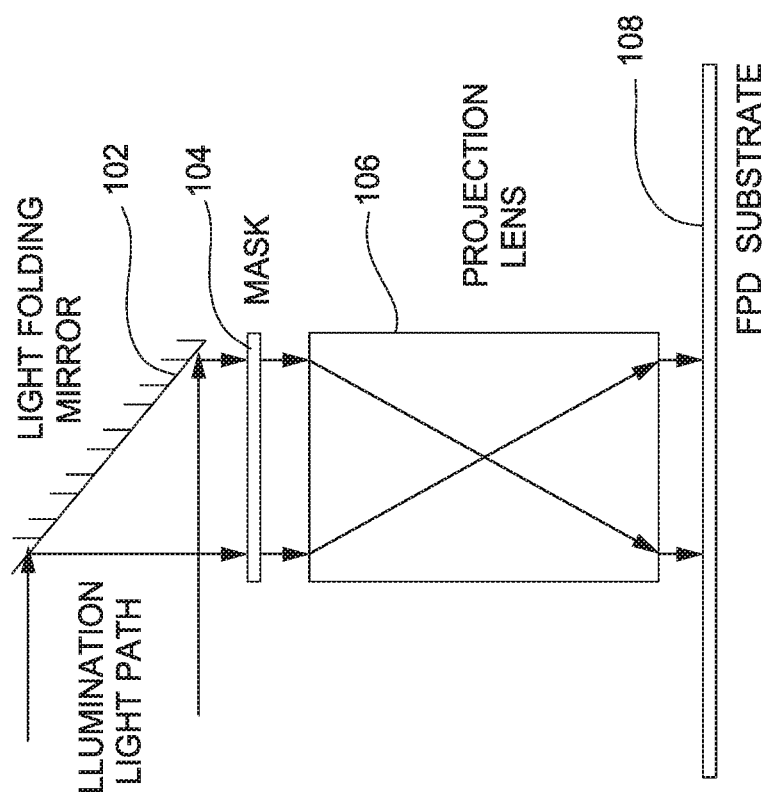
FIG. 1 illustrates a conventional configuration of projection exposure tool used for scanning mask patterns onto FPD substrate.
Figure 2:
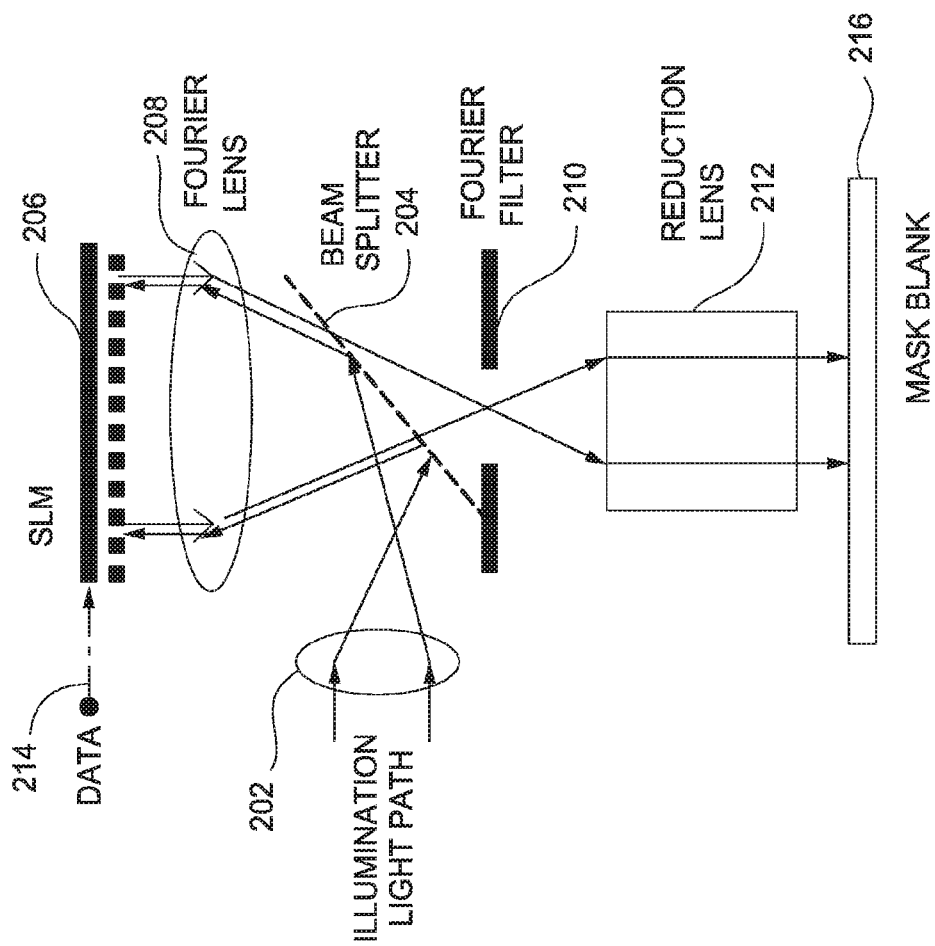
FIG. 2 illustrates a conventional mask making exposure tool configuration.

As discussed in association with FIG. 1 and FIG. 2, in order to achieve the throughput requirements, high powered illumination sources for the conventional systems are necessary. In one example, high pressure Hg short-arc lamp in the kilo-Watts range is used. Another example is to use high powered Excimer laser. Due to the use of high power illumination sources, the illumination light path needs to be directed from a distance to reduce the heat generated and then be folded for a right illumination. This type of configuration separates the illumination and SLM imaging system into two separate units and the light path and the lens are perpendicular to each other.

To address the limitation of the conventional systems and approaches, the improved exposure tool configuration reduces the need to use high-powered illumination sources. An in-line imaging system is configured where each of the imaging unit includes the SLM, the illumination sources, the alignment illumination, the electronic control, and the imaging lens. This system may have a lower exposure throughput when using low powered LED and diode laser illumination sources. However, the exposure throughput may be increased by using a larger number of imaging units. One of the benefits of using a compact SLM imaging unit is that a scalable array of such units may be packed for different imaging applications. In one application example, when arrayed with more than 1000 such compact SLM imaging units, the writing throughput exceeds the existing multi-wavelength, mask-based exposure tool configuration.

Figure 6:
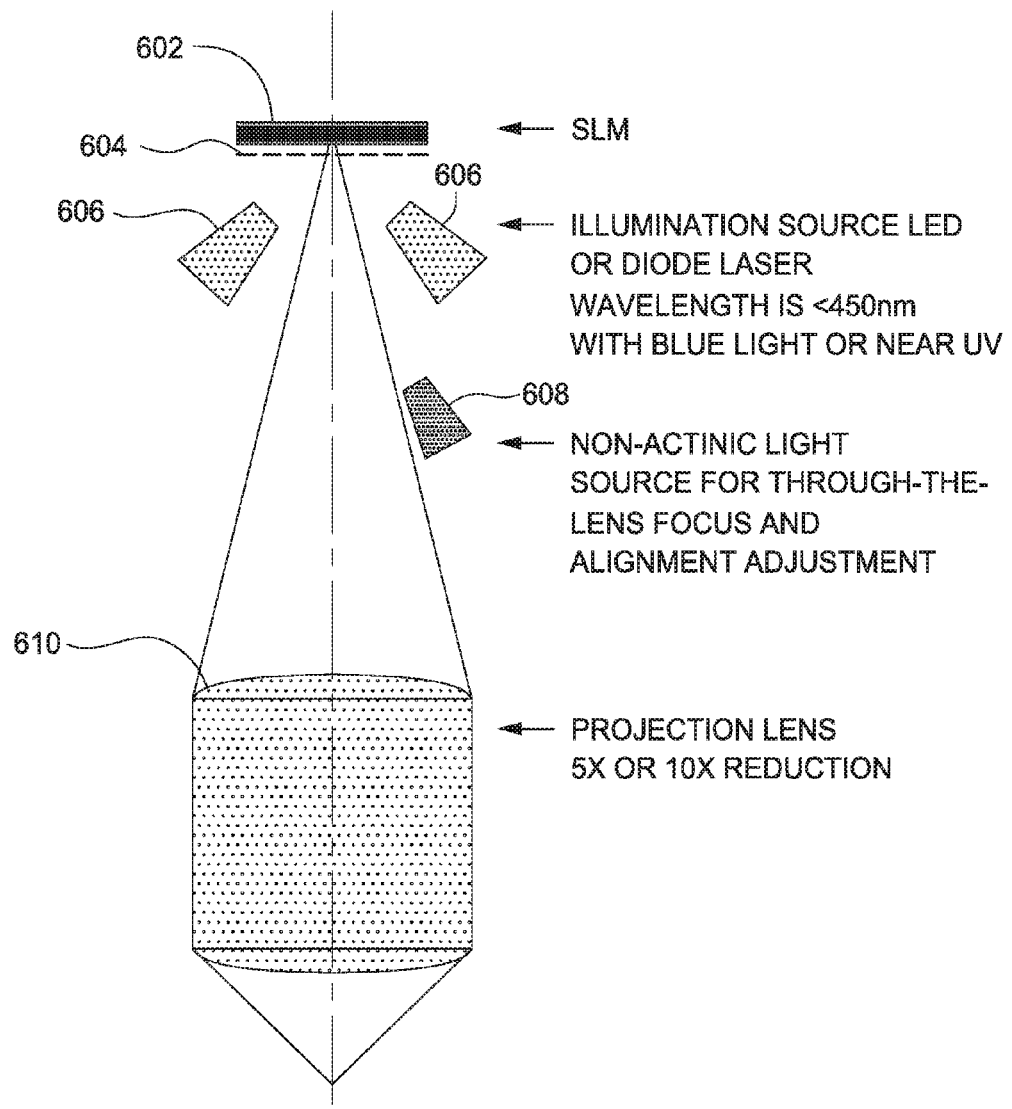
FIG. 6 illustrates an example of a compact SLM imaging unit according to embodiments of the present invention.

FIG. 6 illustrates an example of a compact SLM imaging unit according to embodiments of the present invention. In this example, the compact SLM imaging unit includes a spatial light modulator 602, a set of micro-mirrors 604, one or more illumination sources 606, one or more alignment light sources 608, and a projection lens 610. The illumination source 606 may be implemented with LED or diode laser having wavelength less than 450 nm with blue light or near UV. The alignment light source 608 may be implemented with a non-actinic laser source or LED for through-the-lens focus and alignment adjustment. The projection lens 610 may be implemented with a lens having a 5× or 10× reduction. As shown in FIG. 6, the illumination sources 606 and the alignment light source 608 are all placed outside of the collection cone angle of the projection lens. In this exemplary implementation, off-the-shelf projection lenses with numerical aperture NA of 0.25 at resolving power of about 1 μm may be used. The relatively low NA ensures better depth of focus (DOF). In one lithography process example, using NA of 0.25 for 1 μm photo resist CD target, the DOF may be >5.0 μm. The resolution and DOF calculations are based on Rayleigh criterion:

$$\text{Minimum feature resolution} = k_1(\lambda/NA)$$

$$DOF = k_2(\lambda/NA^2)$$

where, $k_1$ and $k_2$ are process capability factors. According to an implementation of lithography manufacturing process based on Novolak chemistry photoresist, $k_1$ is in the range from 0.5 to 0.7, $k_2$ is from 0.7 to 0.9, and $\lambda$ refers to the exposure wavelength.

In order to fit a compact form factor, illumination sources may be blue, near UV LED, or semiconductor diode laser. To get sufficient intensity, in one design example, the illumination sources are placed close to the SLM surface and there may be multiple illumination sources placed surrounding the SLM. The SLM may be DMD or GLV with proper optical lens design matched to each. In one example, the targeted intensity level at the substrate may be between 10-100 mW per square centimeter of the actinic exposure wavelength.

In this exposure tool configuration example, the housing for the electronic control boards for each compact imaging system conforms to a specified compact factor. It is located on the top of the SLM, away from the illumination sources. This facilitates ventilation and heat dissipation. The physical dimension for a single compact SLM imaging unit depends on the required imaging performance and the available components use off-the-shelf supply, such as the projection lens, LED or diode laser illumination sources, and focus/alignment diode laser, each with required room for heat dissipation. Another approach is to have custom design for the components so that the physical dimension for a single SLM imaging unit can be trimmed to an even more compact form. A custom designed SLM imaging unit may have a dimension of approximately 5 cm×5 cm in 2D cross-section compared to a dimension of approximately 10 cm×10 cm using off-the-shelf supply.

Figure 7:
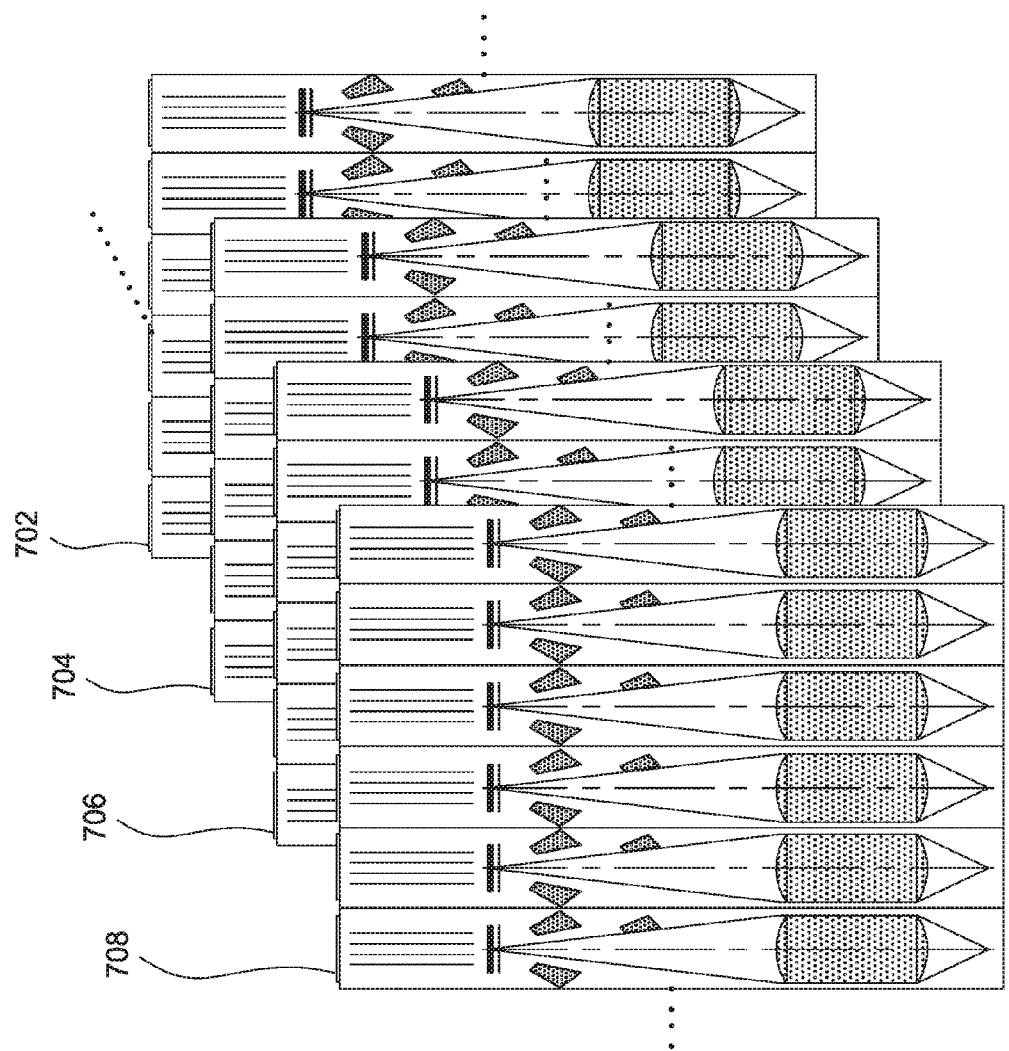
FIG. 7 illustrates an exemplary parallel array of SLM imaging units according to embodiments of the present invention.

For the G10 FPD manufacturing, a typical substrate size is 2880 mm×3130 mm. Using the physical dimension of compact SLM imaging lens, a system may include hundreds of compact SLM imaging units arranged into an array of parallel imaging units. FIG. 7 illustrates an exemplary parallel array of SLM imaging units according to embodiments of the present invention. In this example, the image writing can be performed by 600 to 2400 parallel arrays of SLM imaging units (702, 704, 706, 708, etc.) simultaneously and each parallel array may includes multiple SLM imaging units.

According to embodiments of the present invention, the exposure throughput may be determined using a known example throughput of a SLM mask writer, such as 20 hours for the mask size of 1300 mm×1500 mm, may be used as a starting point. Throughput depends on the intensity level at the substrate plane. In this approach, for the intensity level of 50 mW per square centimeter, achievable with LED or diode laser sources, and for the nominal exposure energy of 30 mJ/sq-cm-sec, the exposure time is approximately 0.6 seconds. In another approach, where the exposure tool uses high-powered illumination source, the intensity level at the substrate is at least 200 mW per square centimeter or higher. The throughput for such a mask-based stepper/scanner system is about 50 G8 FPD substrate plates per hour. By taking into account of both high-powered and low-powered illumination sources, the throughput estimation in one example is from 25 to 100 substrates per hour, depending on the density of parallel SLM imaging units used in the array. This shows that such an array parallel exposure configuration is competitive economically.

Figure 8:
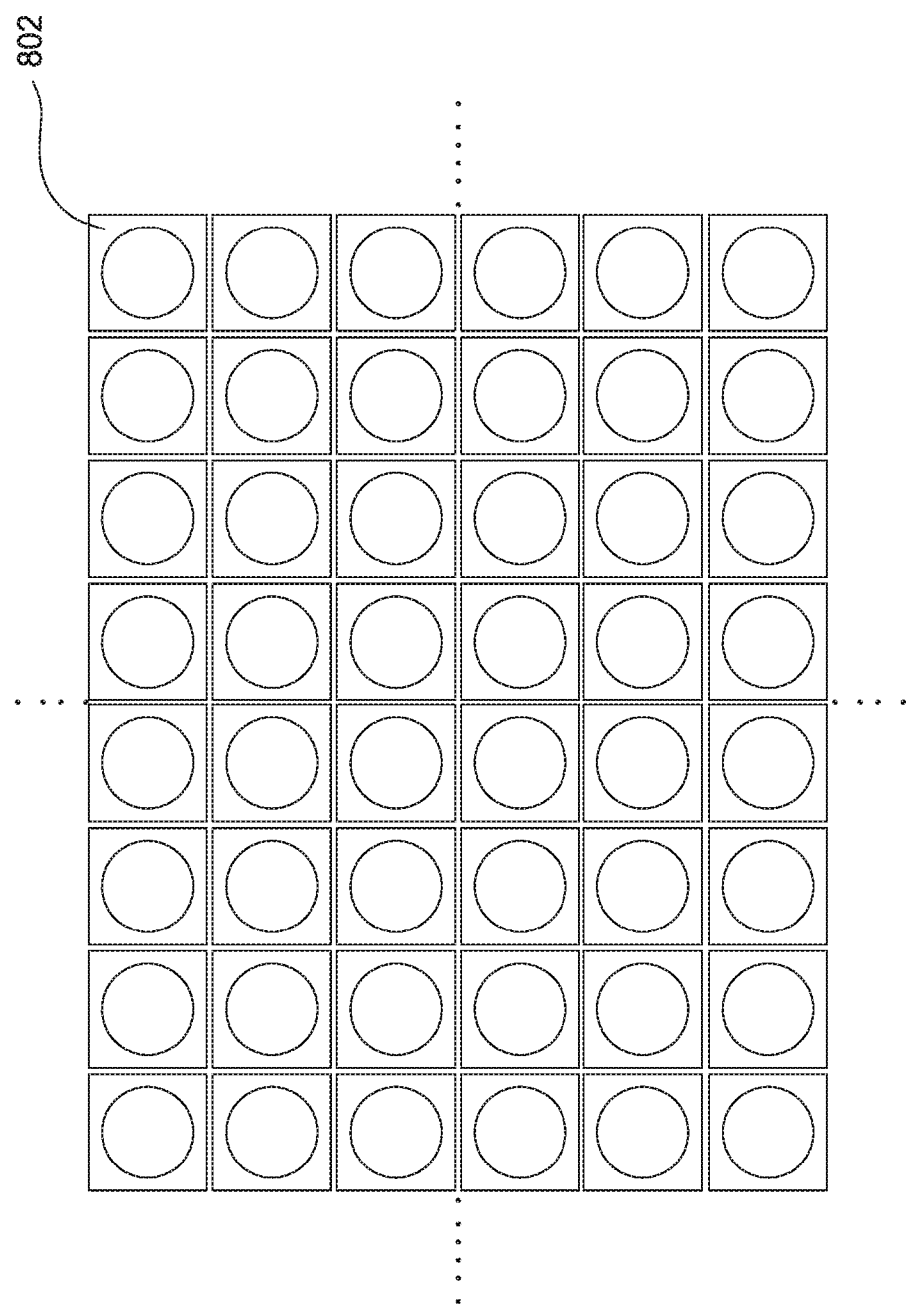
FIG. 8 illustrates the corresponding top-down view of the parallel array of SLM imaging units of FIG. 7 according to embodiments of the present invention.

FIG. 8 illustrates the corresponding top-down view of the parallel array of SLM imaging units of FIG. 7 according to embodiments of the present invention. In this example, each row or column may represent a parallel array of SLM imaging units, and each parallel array may include multiple SLM imaging units 802. Lithography manufacturing yield is directly related to process window. Here process window refers to the range focus settings in conjunction with the range of exposure dose settings that can print feature CDs within the specifications. That is, for a more robust process window, it can tolerate wider defocus settings and/or exposure dose settings. A wider process window may produce a better product yield. With bigger substrate for each newer generation, lithography window becomes smaller. This is mainly due to the more tendencies for larger and thinner substrate material to warp or sag. To address this issue, the solution calls for tightening thickness and surface uniformity specifications for substrate material. For mask-based exposure tool, maintaining uniformity and focus control over an exposure field that is larger than about two meters in one side is not only very expensive but also technologically challenging. To assure a workable process window, exposure tool need to be able to optimize focus and illumination in both local and global fashions.

As shown in FIG. 8, this array parallel exposure system addresses the issues discussed above. This is because each of the compact SLM imaging units can be optimized locally for better illumination and focus corresponding to its own exposure area. That ensures a better process window in each exposure area of the SLM imaging unit. The entire process window is then improved globally using optimized contributions from the SLM imaging units.

Figure 9:
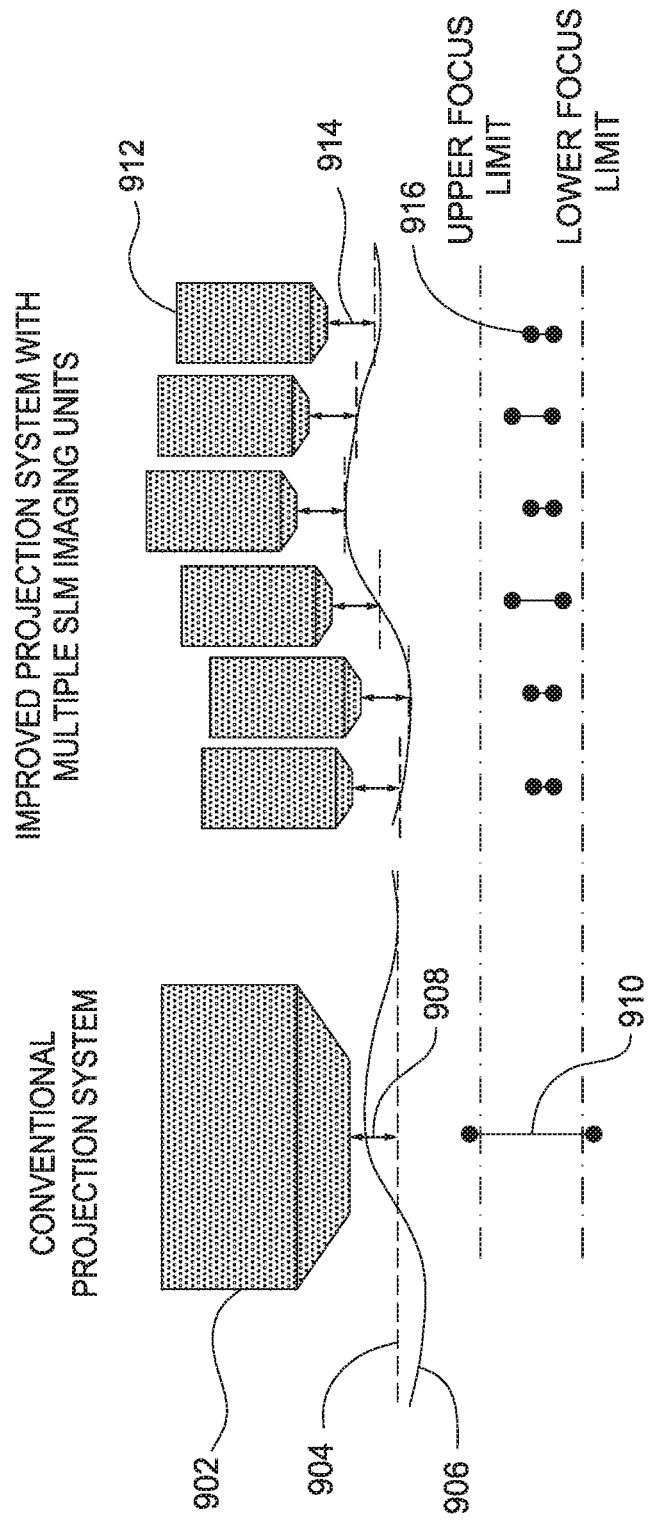
FIG. 9 illustrates a comparison of a conventional single lens projection system versus the localized process window optimization using the arrayed imaging system according to embodiments of the present invention.

FIG. 9 illustrates a comparison of a conventional single lens projection system versus the localized process window optimization using the arrayed imaging system according to embodiments of the present invention. On the left hand side of FIG. 9, the conventional single lens projection system 902 must be tuned to a compromised focal plane 904, as shown in dotted line. The solid line 906 represents the actual surface contour of the substrate in cross-sectional view. The double arrow 908 indicates the best focus setting corresponding to a single lens that is used to image the pattern. The lines with round heads 910 represent the maximum contour range correspond to each imaging lens and the dot-dashed lines indicate the upper and lower limits of the focus range.

As shown in FIG. 9, for the conventional single lens projection system, the large-sized substrate curvature may have already exceeded the focus range of the lens. The center of focus may be only marginally acceptable with respect to both of the peak and valley curvatures in the substrate. The overall process window becomes limited. On the other hand, the right hand side of FIG. 9 shows an improved projection system with imaging units arranged in an array. The focus 914 of an imaging unit 912 can be tuned individually for each localized area covered. As a result, each focus setting can be placed well within the focus control limits as represented by the lines 916. In addition to the ability to fine tune focus in each of the local area covered, the illumination of each imaging unit may also be adjusted to achieve a better uniformity compared to the adjustment may be performed by a single lens system. Therefore, a more robust process window is achieved by using the arrayed imaging unit system.

Figure 10:
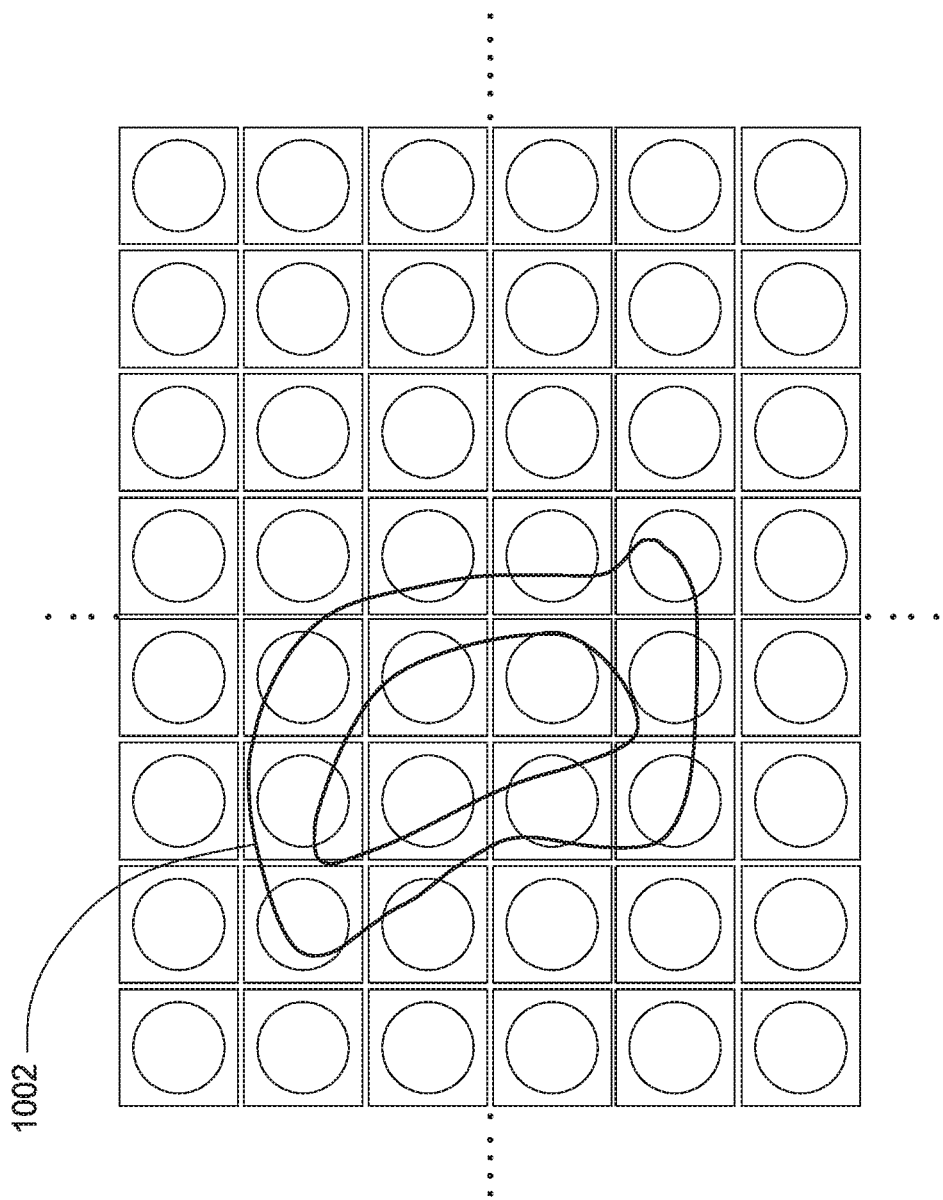
FIG. 10 illustrates a method for optimizing localized unevenness in substrate according to embodiments of the present invention.

FIG. 10 illustrates a method for optimizing localized unevenness in substrate according to embodiments of the present invention. In this example, region of uneven contours are detected in the substrate as indicated by numeral 1002. One method of tuning optimization is to apply a focus averaging scheme for the uneven local exposure areas that are associated with a SLM imaging unit as well as the surrounding areas associated with SLM imaging units in the neighborhood of the SLM imaging unit of interest. The more imaging units in the neighborhood of the uneven areas that can be included for averaging, the better globalized optimization can be achieved. A person skilled in the art would appreciate that other averaging techniques may be applied to the disclosed imaging system for the entire substrate plate to achieve a more uniform image globally across the whole substrate.

In one implementation, the mask data format for thin film transistor (TFT) based LCD display may be implemented as follows. Note that the hierarchical stream data format GDSII may be used for taping out mask data, but this type of mask data format may not be well-suited for this parallel SLM imaging system. To convert from hierarchal mask data to flat format, this can be done by using an off-the-shelf CAD software program. However, after flattened the mask data, further processing the mask data is needed. Mask data structure is used in conjunction with the arrayed parallel imaging writer system to produce higher quality images.

For the arrayed parallel imaging writer system, the mask data structure may be flattened and may be partitioned into pieces of a predefined size to properly or evenly feed to every SLM imaging unit. The mask data structure includes information that indicates the placement for each piece of mask data relative to its respective imaging unit. Moreover, the mask data structure includes information that specifies how features that span multiple imaging units will be divided among them. The data placement tuning can be recognized via the mask data structure that is related to the adjacent mask data areas from the adjacent imaging units.

Figure 11:
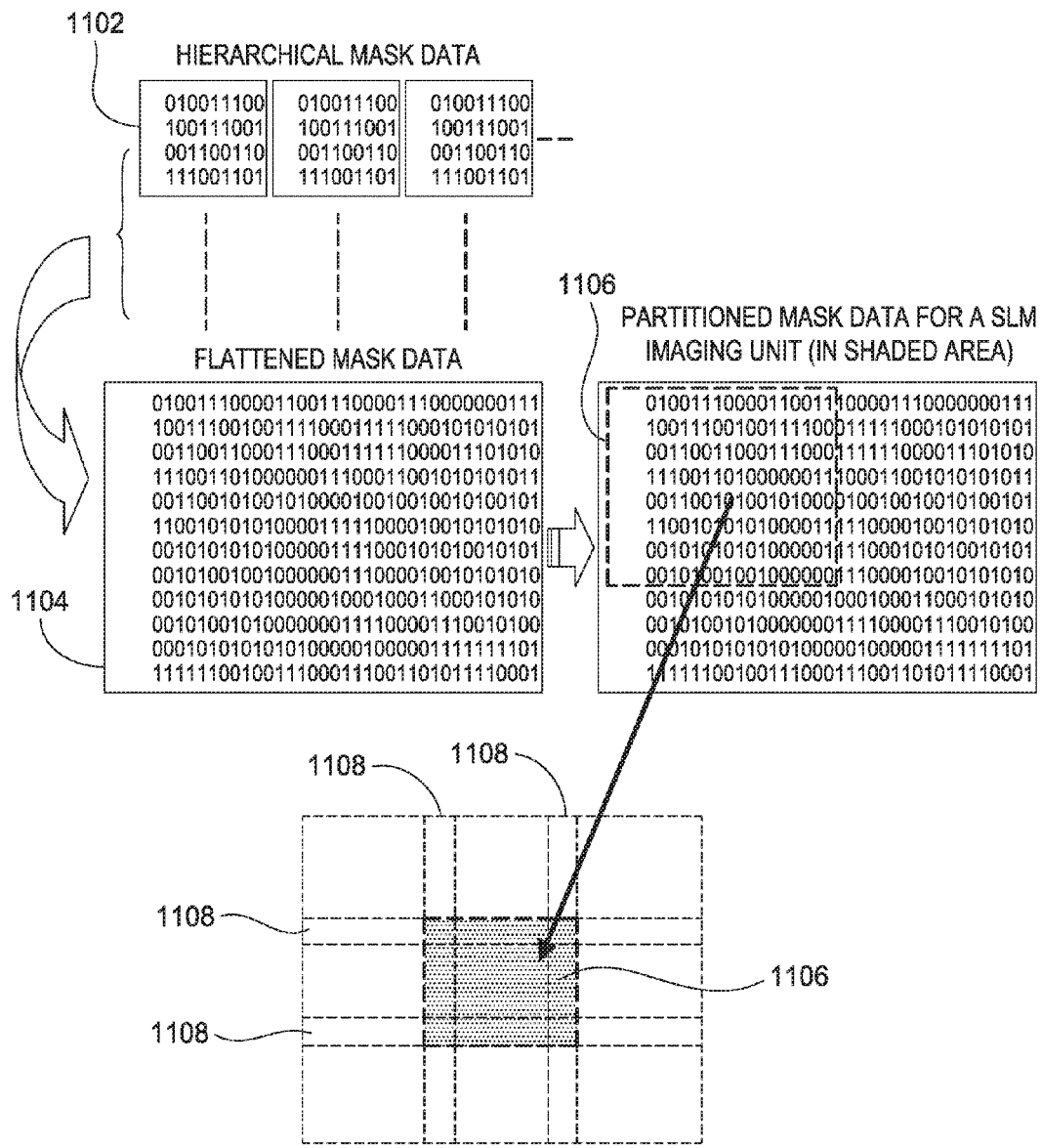
FIG. 11 illustrates an application of a mask data structure according to embodiments of the present invention.

FIG. 11 illustrates an application of a mask data structure according to embodiments of the present invention. In this example, a hierarchical description of a mask data in terms of multiple levels of mask data instances 1102 is first flattened to form a flattened mask data 1104. Then, the flattened mask data 1104 is partitioned into multiple partitioned mask data patterns. One such partitioned mask data pattern is shown as a shaded area 1106, which is also shown as the center block in the nine blocks (separated by dotted lines) at the bottom of FIG. 11. Sufficient mask patterning overlaps between the adjacent imaging units, shown as horizontal and vertical strips 1108, are needed to ensure uniform pattern blending around the borders, where each block represents a partitioned mask data to be imaged by one or more SLM imaging units. According to embodiments of the present invention, the partitioned mask data includes a first set of identifiers for identifying run-in conditions of mirror pixels within a SLM imaging unit and a second set of identifiers for identifying run-out conditions of mirror pixels within a SLM imaging unit. A run-in condition occurs where excessive pixels are found in an area between two SLM imaging units. A run-out condition occurs where insufficient pixels are found in an area between two SLM imaging units. Each partitioned mask data pattern is fed to its corresponding SLM imaging unit for processing, where each SLM imaging unit writes its associated partitioned mask data pattern in predetermined overlapped areas using adjacent SLM imaging units as references to ensure the imaging blending and uniformity meet design criteria. The partitioned mask data pattern may be optimized to enable parallel voting exposures for feature CD uniformity. In this case, a parallel voting exposure scheme is used in minimizing processing variables that may negatively impact CD uniformity. The elimination of Gaussian speckles due to the use of diode laser is accomplished by using sufficient number of micro-mirror pixel exposures for voting.

Figure 12:
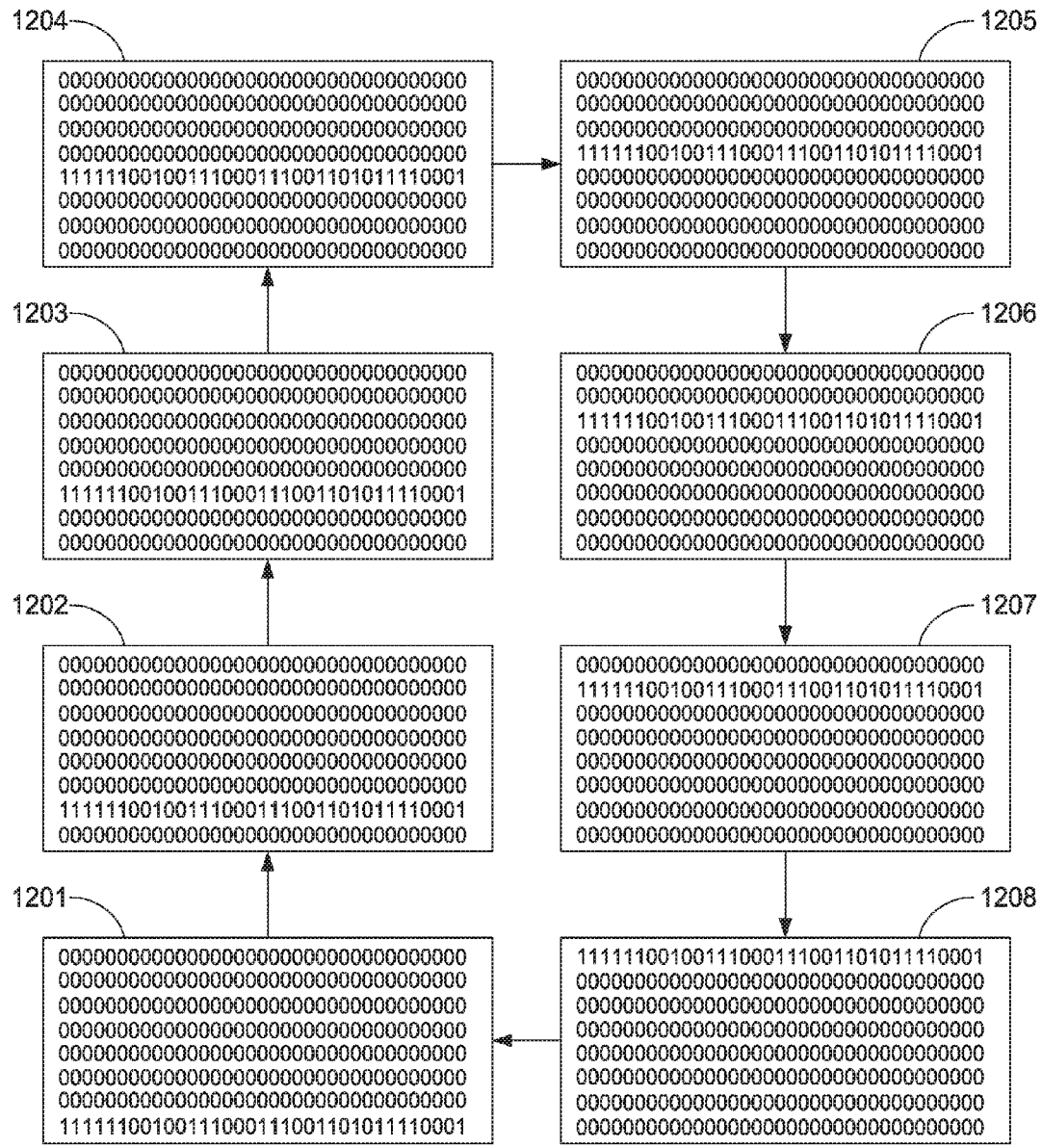
FIG. 12 illustrates a method of parallel array voting exposures according to embodiments of the present invention.

FIG. 12 illustrates a method of parallel array voting exposures according to embodiments of the present invention. The method first sends the mask data to each of SLM imaging unit in a row-by-row fashion, then to flash the row of micro-mirror pixels starting from one end of the row to the next until reaching the opposite end. In one example, the method starts with block 1201 and flashes the bottom row of micro-mirror pixels. It then moves block 1202 and flashes the second row from the bottom row of micro-mirror pixels. In block 1203, the third row from the bottom row of micro-mirror pixels is flashed. The method continues through blocks 1204, 1205, 1206, 1207 and flashes the corresponding row of micro-mirror pixels. And in block 1208, the method has traversed the last row of micro-mirror pixels (which is the top row) in this particular example. The same walking-row of micro-mirror pixels loops again and again from the start to the end. The looping of the walking-row corresponds to exposure actions for writing patterns on substrate. Because micro-mirror flashing rate is fast enough, the feature patterns are exposed by the fast moving walking-row numerous times until nominal exposures level is accumulated. Thus, such a pattern writing scheme is, in effect, done by voted exposures from numerous micro-mirror pixels. By moving substrate stage in a coordinated pace and orientation, the writing for entire substrate is carried out with the same voting exposure scheme.

The walking-row approach illustrated in FIG. 12 is one example of looping walking-row for making one style of parallel voting exposure locally or sub-locally for every imaging unit. In other embodiments, looping methods based on column or diagonal row/column may be used for effective parallel voting exposures. Additional voting schemes can be derived such as interlaced walking-rows from the two adjacent SLM imaging units or to use multiple walking orientations with several data rows, etc., may be employed to improve printing performance, although possibly at the expense of additional stage motion.

For array parallel exposure under heavy production environment, redundancy or fault-tolerance may be built-in to prevent production flow from interruption. That is, as the exposure control routine detects a failure of an SLM imaging unit, it then takes action to disable the problematic imaging unit, redistributes the mask data to one or more of the adjacent imaging units, and then has these adjacent imaging units complete the exposure tasks before unloading the exposed plate. This corrective exposure routine continues until the full batch-load of plates is done. The process continues until both the imaging performance and throughput hit are considered acceptable.

Figure 13:
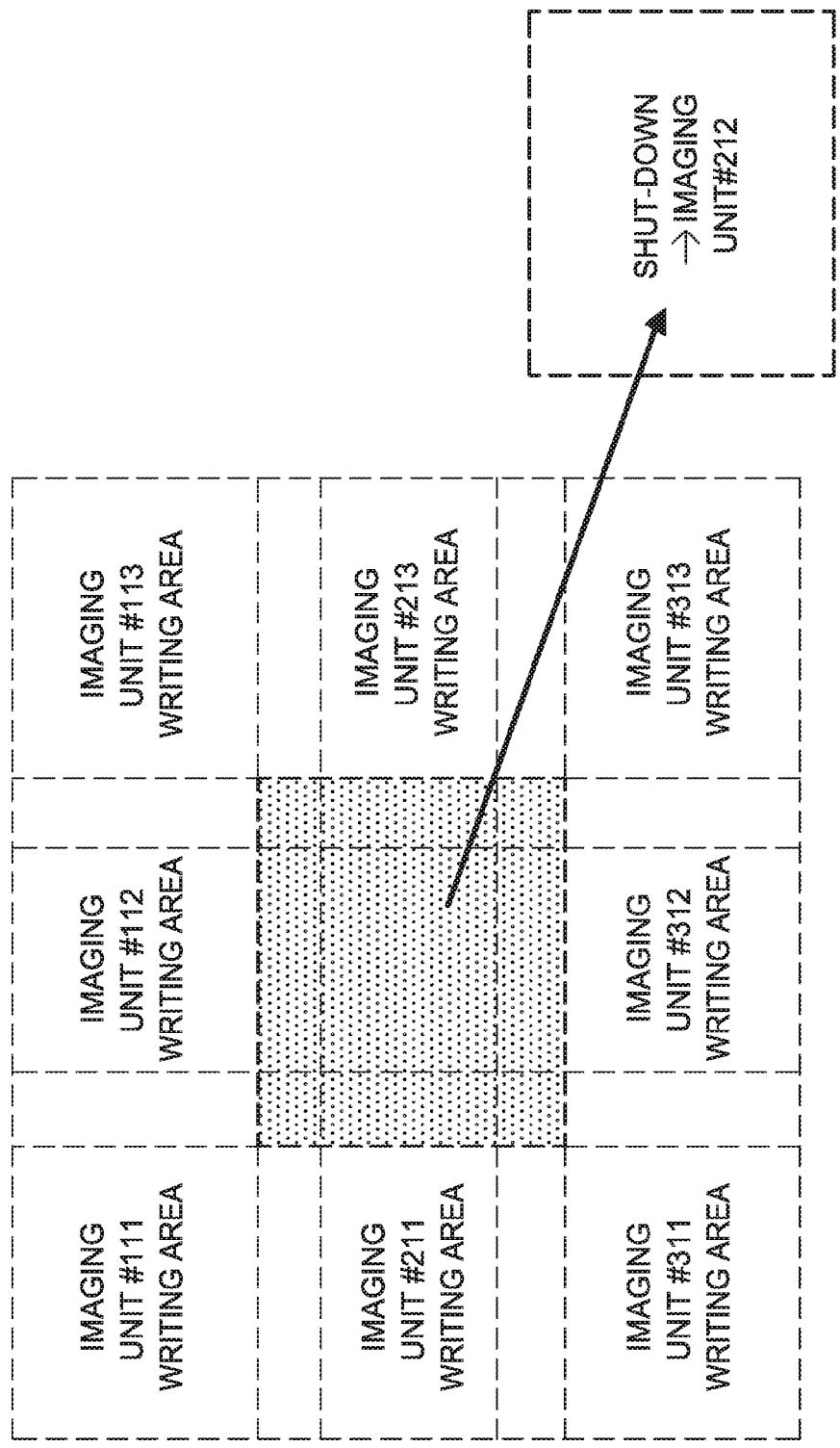
FIG. 13 illustrates a method for implementing redundancy in the imaging writer system according to embodiments of the present invention.

FIG. 13 illustrates a method for implementing redundancy in the imaging writer system according to embodiments of the present invention. In this example, after detecting that image unit 212 has malfunctioned, this unit is shut down. One of the 8 adjacent imaging units may be selected to take over. In this case, the writing for the unit 212 area is done after exposures of other areas have been accomplished.

Figure 14:
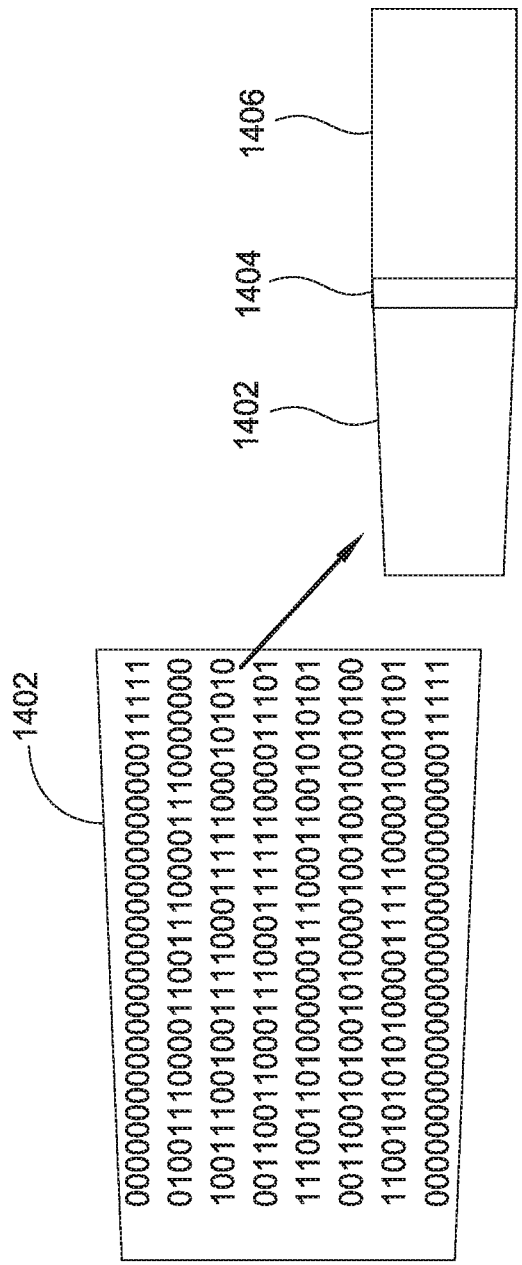
FIG. 14 illustrates the Keystone border blending method according to embodiments of the present invention.

Micro mismatched (local to local) borders from the two adjacent SLM imaging units can occur when imaging distortions result from substrate warping or sagging. This is represented by numeral 1402, where data patterns fall outside of the boxed area. In this case, the pattern blending in the overlapped areas needs to be optimized. FIG. 14 illustrates the Keystone border blending method according to embodiments of the present invention. As shown in FIG. 14, the method turns on micro-mirror pixels at the selected border end 1404 that allows better overlap matching to the adjacent imaging unit writing area 1406. Persons skilled in the art would appreciate that other approaches may be used to achieve border blending by turning on micro-mirror pixels selectively at desired sites.

According to some embodiments, blending may be performed by turning on selected micro-mirror pixels in alternate or complementary manner between the adjacent overlapping borders. According to yet some other embodiments of the present invention, mixing walking-row exposure voting action together with additional pixel turning at selected sites may be used to achieve better blending.

In order to achieve the intended alignment accuracy and precision for the array parallel imaging system, the method decomposes the alignment scheme into several accuracy precision levels in cascade. First alignment level is to aim for global alignment accuracy level, next is to narrow into intermediate level of accuracy precision. Using this bottom-up approach, the method achieves the desired accuracy precision level.

Figure 15:
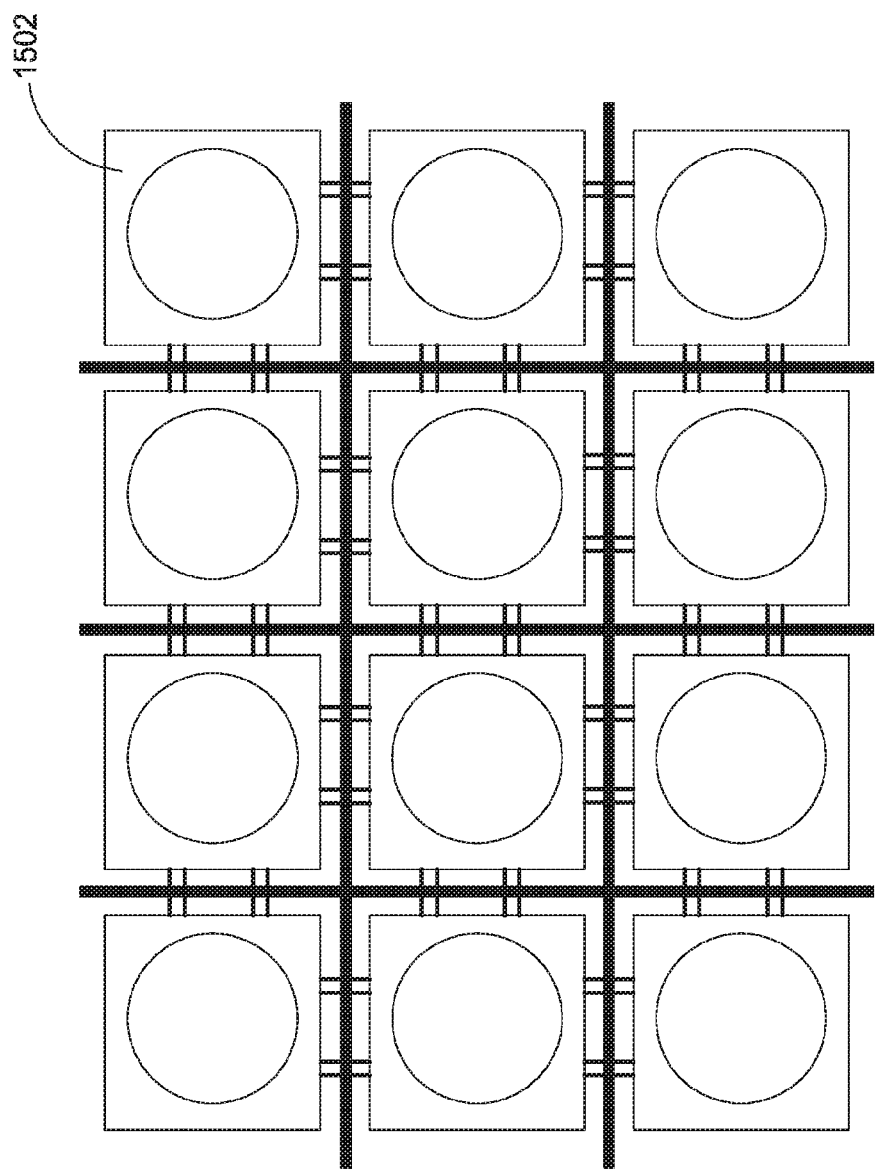
FIG. 15 illustrates a method for placing SLM imaging units in an array according to embodiment of the present invention.

In one approach, three accuracy precision levels are defined: the unit lens array placement, the lens center tuning, and the micro-mirror imaging data manipulation. FIG. 15 illustrates a method for placing SLM imaging units in an array according to embodiment of the present invention. This method provides global placement accuracy of the SLM imaging units 1502 in the millimeters range. Next, for each SLM imaging unit, the position of projection lens assembly is electronically tuned to precision in micrometer range. This is done by aligning the lens center using HeNe laser (or other non-actinic alignment light source) to a known reference position on the stage. Finally the micro-mirrors are controlled to achieve alignment requirements in precision of nanometer range.

According to embodiments of the present invention, the alignment process for making exposure may be carried out as follows:

1) Using a known reference site on the stage, the lens center for each SLM imaging unit in the array is first calibrated. This allows constructing a mathematical grid array points in reference to the physical lens array.
2) For the first masking layer, when there is no alignment marks printed, the plate alignment is done mechanically relying mainly on the stage precision.
3) When the substrate plate has alignment marks throughout the plate as printed from the previous masking layer, these alignment marks can be detected by the corresponding SLM imaging units. From this, a grid map is constructed in reference to the actual image locations that are on the substrate plate.
4) By comparing the two grid maps (SLM imaging unit vs. printed alignment marks detected from the substrate), build a grid map matching mathematical model for stage travel guide.
5) In one example, by considering 2400 array SLM imaging units for G10 substrate, the maximum stage travel distance is about 120 mm in either horizontal (X) or vertical (Y) direction. This is included for grid map matching calculation. Note that such a stage travel distance is rather small hence technologically advantageous compared to making the stage travels in full plate width and length required by using mask-based exposure tool for the G10. The G10 plate substrate can have a heavy mass. The shorter stage distance traveled while carrying such a heavy mass, the better system accuracy performance may be achieved.

6) To fine-tune sub-micron alignment accuracy, the method embeds the correction factors into the mask data that is being sent to the corresponding imaging unit. That is, the correction factors for every imaging unit may be different depending on the relative imaging locations on the substrate. They can also be different from plate to plate since the substrate warping condition may be different and may be detected ahead of the time before exposing each plate.

Figure 16:
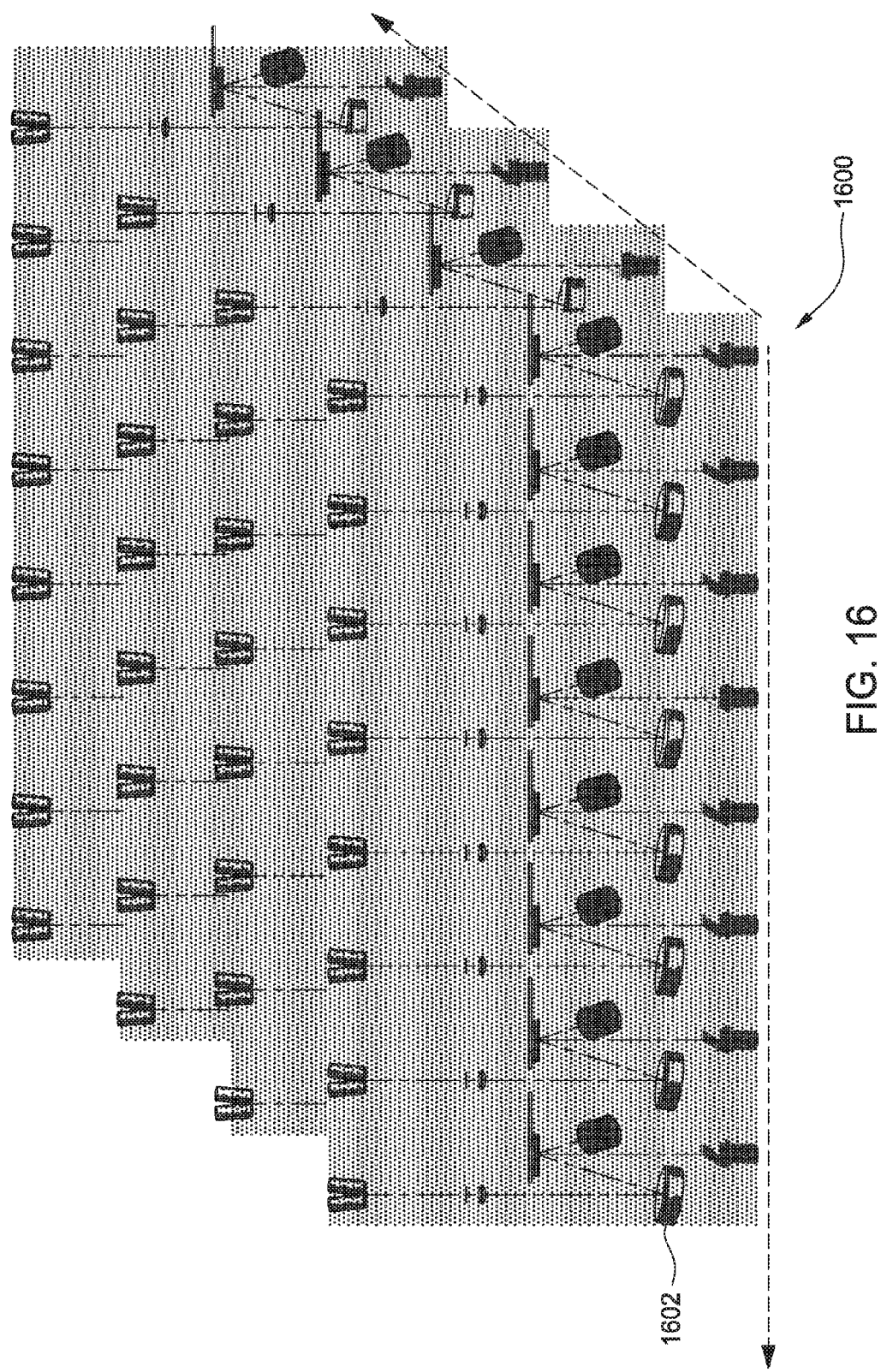
FIG. 16 illustrates an exemplary implementation of a maskless imaging writer system for making flexible display according to embodiments of the present invention.

FIG. 16 illustrates an exemplary implementation of a maskless imaging writer system for making flexible display according to embodiments of the present invention. As shown in FIG. 16 the maskless image writer system 1600 is formed by one or more arrays of SLM imaging units, where 1602 is an example of one of the SLM imaging units. The one or more arrays of SLM imaging units may be formed into a particular shape, for example circular, which may be required by a specific application. In another exemplary implementation, the maskless imaging writer system may be configured to make non-flexible displays.

Figure 17:
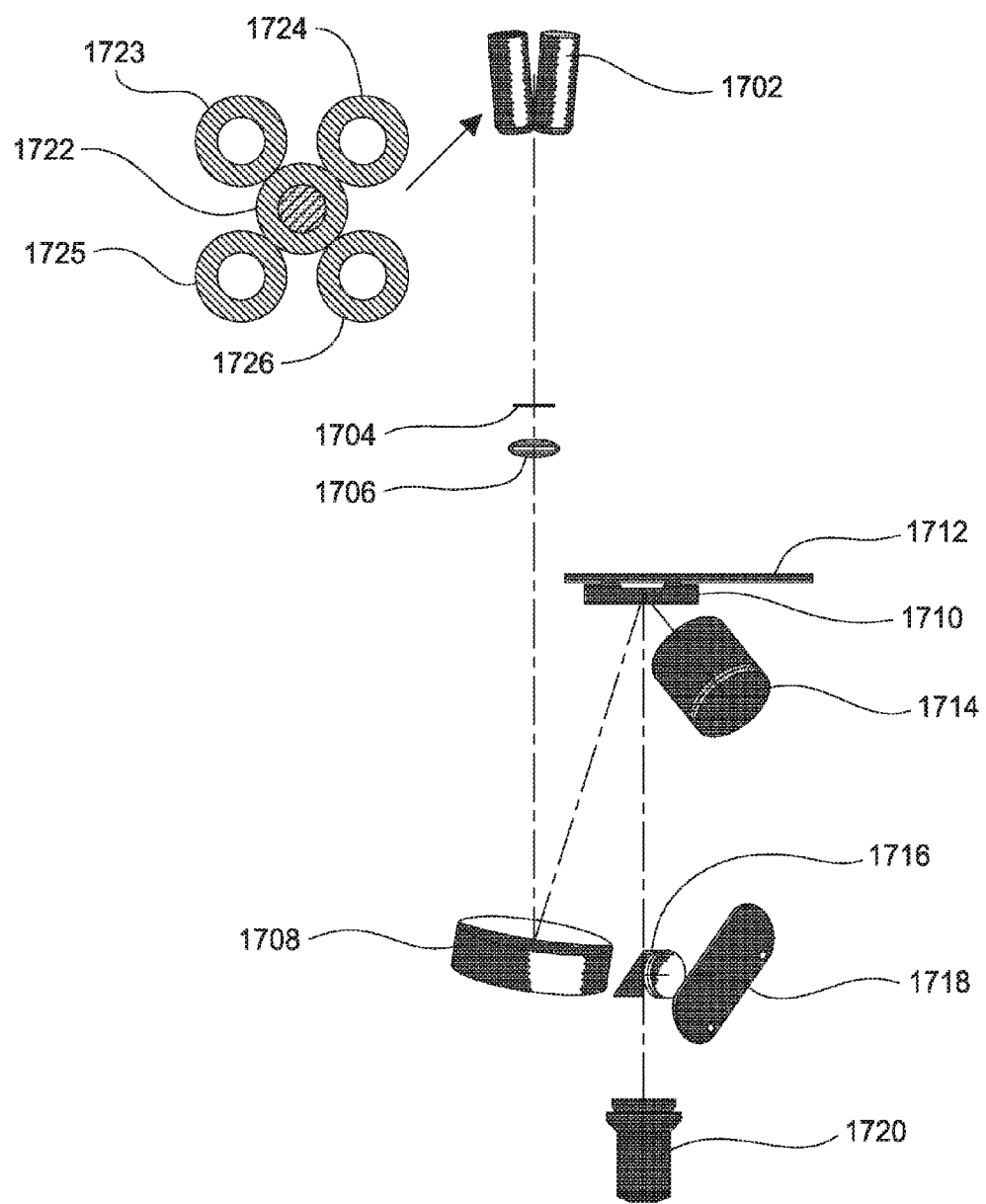
FIG. 17 illustrates a SLM imaging unit according to embodiments of the present invention.

FIG. 17 illustrates a SLM imaging unit according to embodiments of the present invention. The SLM imaging unit includes blue and red diode lasers 1702, an aperture 1704, a lens 1706, a spherical mirror 1708, a DMD 1710 mounted on a printed circuit board 1712, a beam dump 1714, a beam splitter 1716, a CCD camera 1718, and a lens assembly 1720. The blue and red diode lasers 1702 further includes a red laser diode (non-actinic) 1722 and four blue laser diodes (actinic) 1723, 1724, 1725 and 1726. The laser diodes may be arranged in the example as shown in FIG. 17. The center red laser diode is non-actinic and it is mainly used for alignment or catching for initial focus setting. The four blue laser diodes are actinic and they are used for making exposure. Depending on the physical size of the laser diode package, other types of arrangement using different numbers of laser diodes are possible as long as a uniform intensity can be achieved. In another approach, the actinic illumination can also be delivered via optical fiber bundles. In that, each laser diode shines on the one end of the optical fiber bundle and let fiber carry the actinic light to shine from the other end of the optical fiber bundle. In other embodiments, LEDs may be used instead of diode lasers. In this arrange example, the blue LEDs can be placed tightly together in such a way to achieve uniform intensity while multiple red LEDs can be placed in relative locations that may be configured to achieve alignment and initial focusing purposes. In this example, the blue and red diode lasers 1702 project light to the spherical mirror 1708 through the aperture 1704 and the lens 1706. The light is then reflected from the spherical mirror 1708 to the DMD 1710. According to the state of each mirror in the DMD, the light may be sent to the beam dump 1714, or to a substrate through the lens assembly 1720. The image thus created on the substrate reflects back upward through lens 1720 and beam splitter 1716 to CCD camera 1718.

Figure 18:
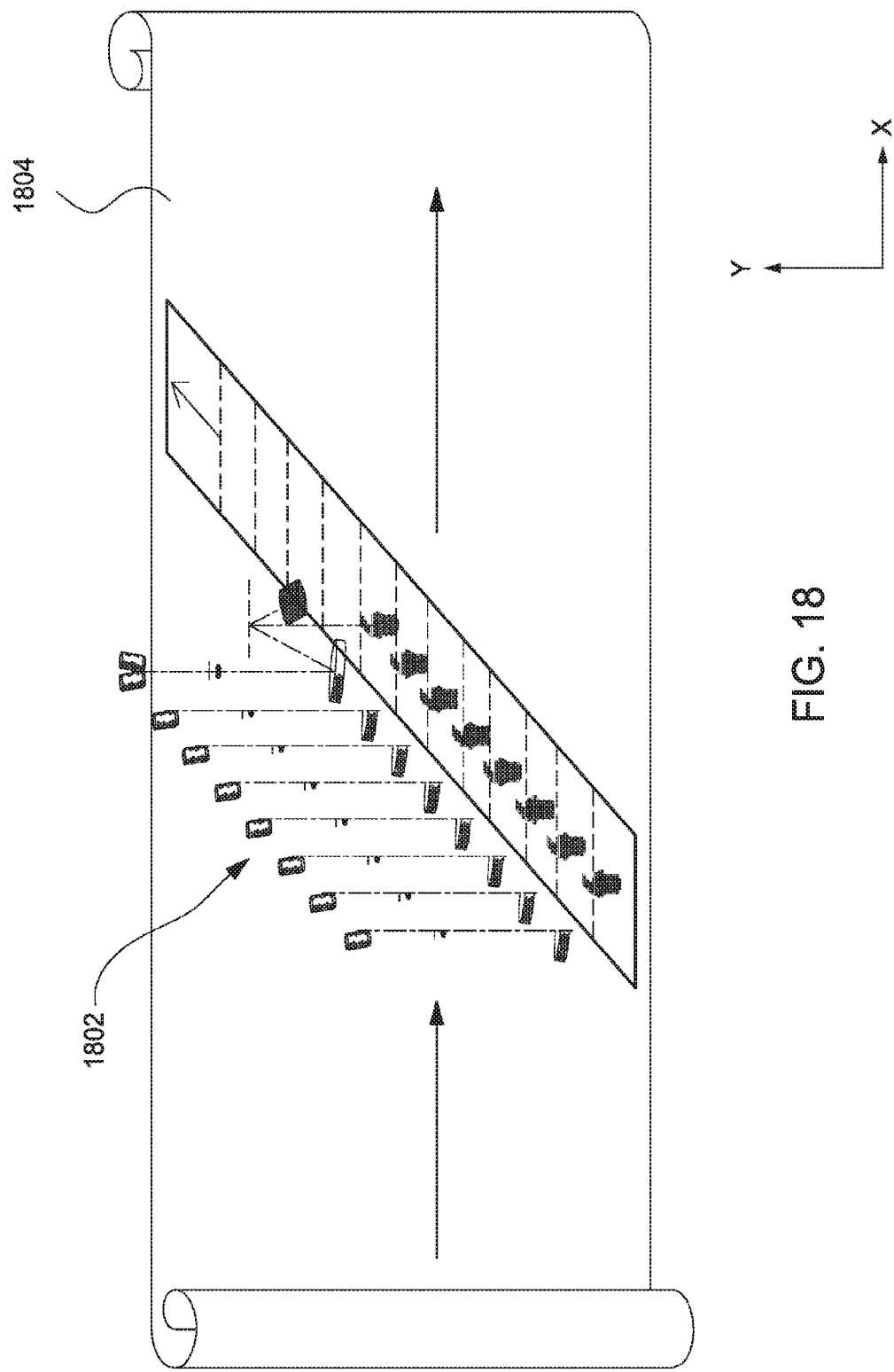
FIG. 18 illustrates a method of using a linear array of SLM imaging units for roll-to-roll maskless lithography according to embodiments of the present invention.

FIG. 18 illustrates a method of using a linear array of SLM imaging units for roll-to-roll maskless lithography according to embodiments of the present invention. In this example, the SLM imaging units 1802 are arranged as a single line array as shown in FIG. 18. The substrate 1804 may be controlled to move along the direction of substrate movement (the X direction) and the linear array of SLM imaging units 1802 may be controlled to move back and forth perpendicular to the direction of substrate movement (the Y direction) in the plane of the substrate 1804. The exposure of the linear array of SLM imaging units can be tuned to process certain area of the substrate 1804 in synchronization with the roll-to-roll substrate movement. In this way, the linear array of SLM imaging units may be controlled to image a substrate that has physical dimensions larger than the size of the linear array of SLM imaging units. Because of the ability to control the SLM imaging units to move in the direction of substrate movement as well as in the direction perpendicular to the substrate movement, the image writer system shown in FIG. 18 overcomes the size limitations of the physical masks required in the conventional methods described in the '779 patent and the Ahn article.

Figure 19:
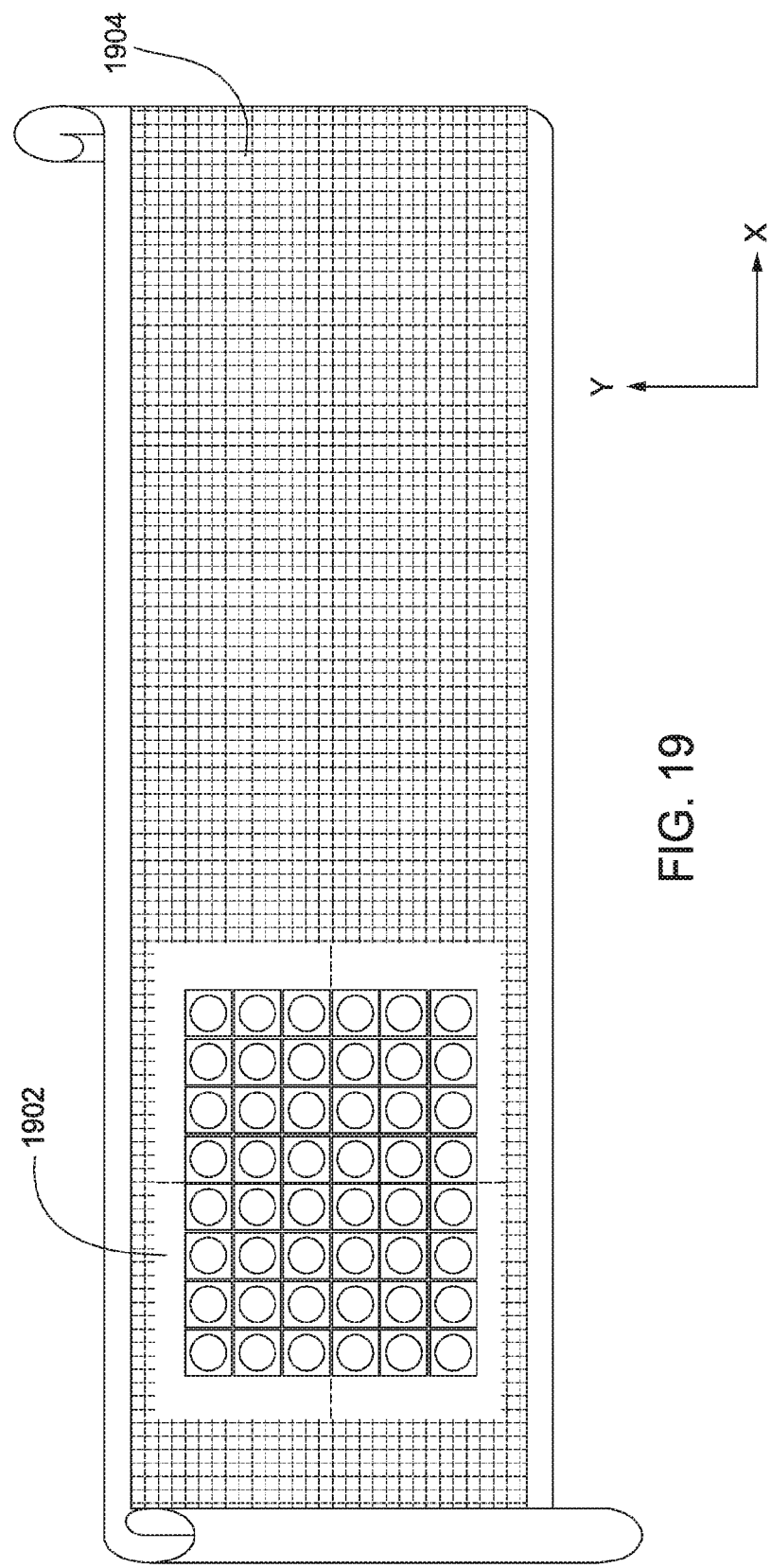
FIG. 19 illustrates a method of using a two dimensional array of SLM imaging units for roll-to-roll maskless lithography according to embodiments of the present invention.

FIG. 19 illustrates a method of using a two dimensional array of SLM imaging units for roll-to-roll maskless lithography according to embodiments of the present invention. This figure shows a top view of a two dimensional SLM imaging array 1902, where each circle represents a SLM imaging unit. Similar to the example shown in FIG. 18, the substrate 1904 may be controlled to move in the X direction and the two dimensional array of SLM imaging units 1902 may be controlled to move back and forth in the Y direction in the plane of the substrate 1904. The exposure of the two dimensional array of SLM imaging units can be tuned to process certain area of the substrate 1904 in synchronization with the roll-to-roll substrate movement. In this way, the two dimensional array of SLM imaging units may be controlled to image a substrate that has physical dimensions larger than the size of the two dimensional array of SLM imaging units. Thus, the image writer system shown in FIG. 19 overcomes the size limitations of the physical masks required in the conventional methods described in the '779 patent and the Ahn article. Note that in some embodiments, the two dimensional array of SLM imaging units may be formed in a staggered or non-staggered array formation.

Figure 20:
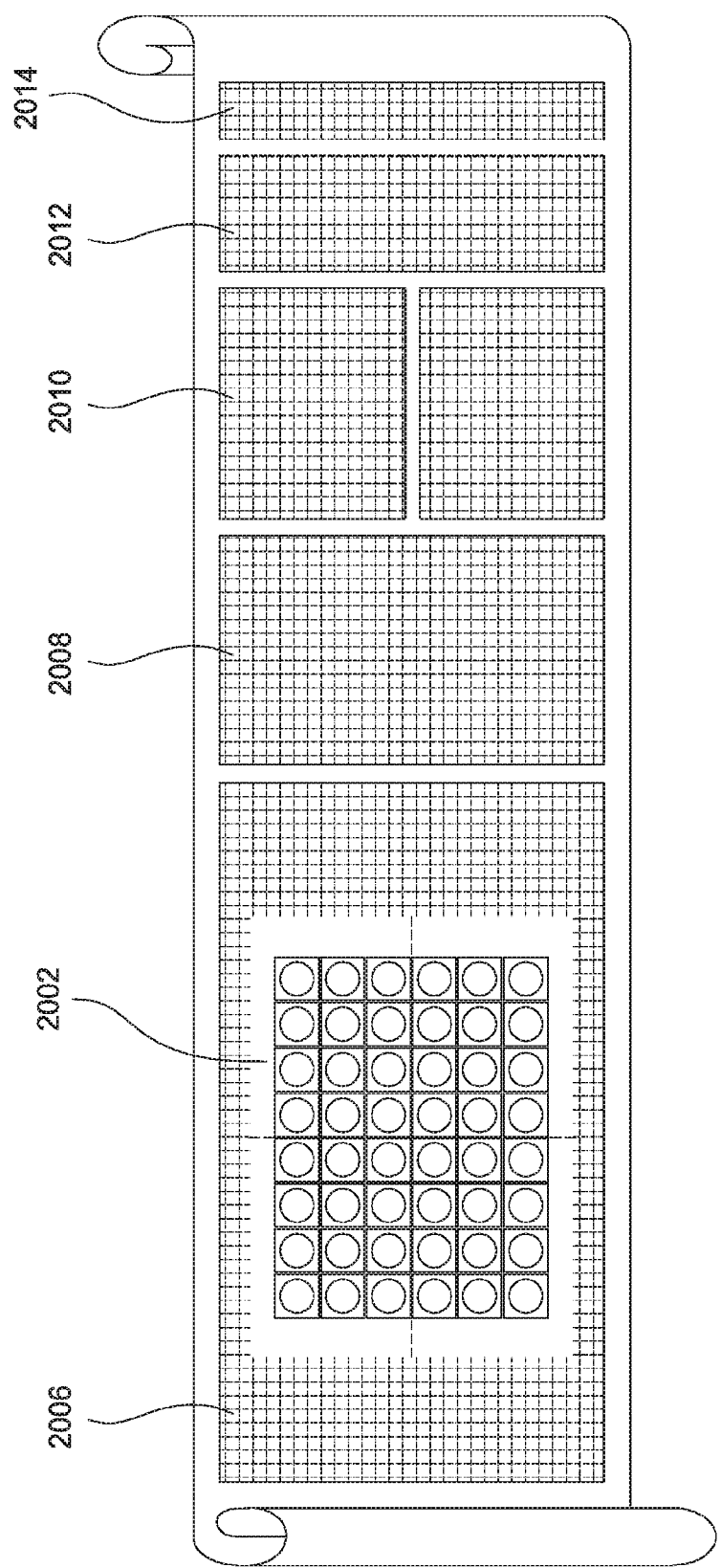
FIG. 20 illustrates a method of imaging plurality of substrate sizes using maskless lithography according to embodiments of the present invention.

FIG. 20 illustrates a method of imaging plurality of substrate sizes using maskless lithography according to embodiments of the present invention. Similar to the method described in FIG. 19, the image writer system also employs a two dimension array of SLM imaging units 2002. Since the two dimensional array of SLM imaging units 2002 may be controlled to receive and process imaging data automatically in a continuous fashion, the image writer system can transition from one substrate design to a different substrate design by loading a new TFT mask database seamlessly without the need to stop and change to a new mask as required by the conventional methods described in the '779 patent and the Ahn article. In the example shown in FIG. 20, different sized substrate designs, such as 2006, 2008, 2010, 2012, and 2014 can be processed on-the-fly as the roll-to-roll substrate containing the different sized substrate designs move by the two dimensional array of SLM imaging units 2002.

Figure 21:
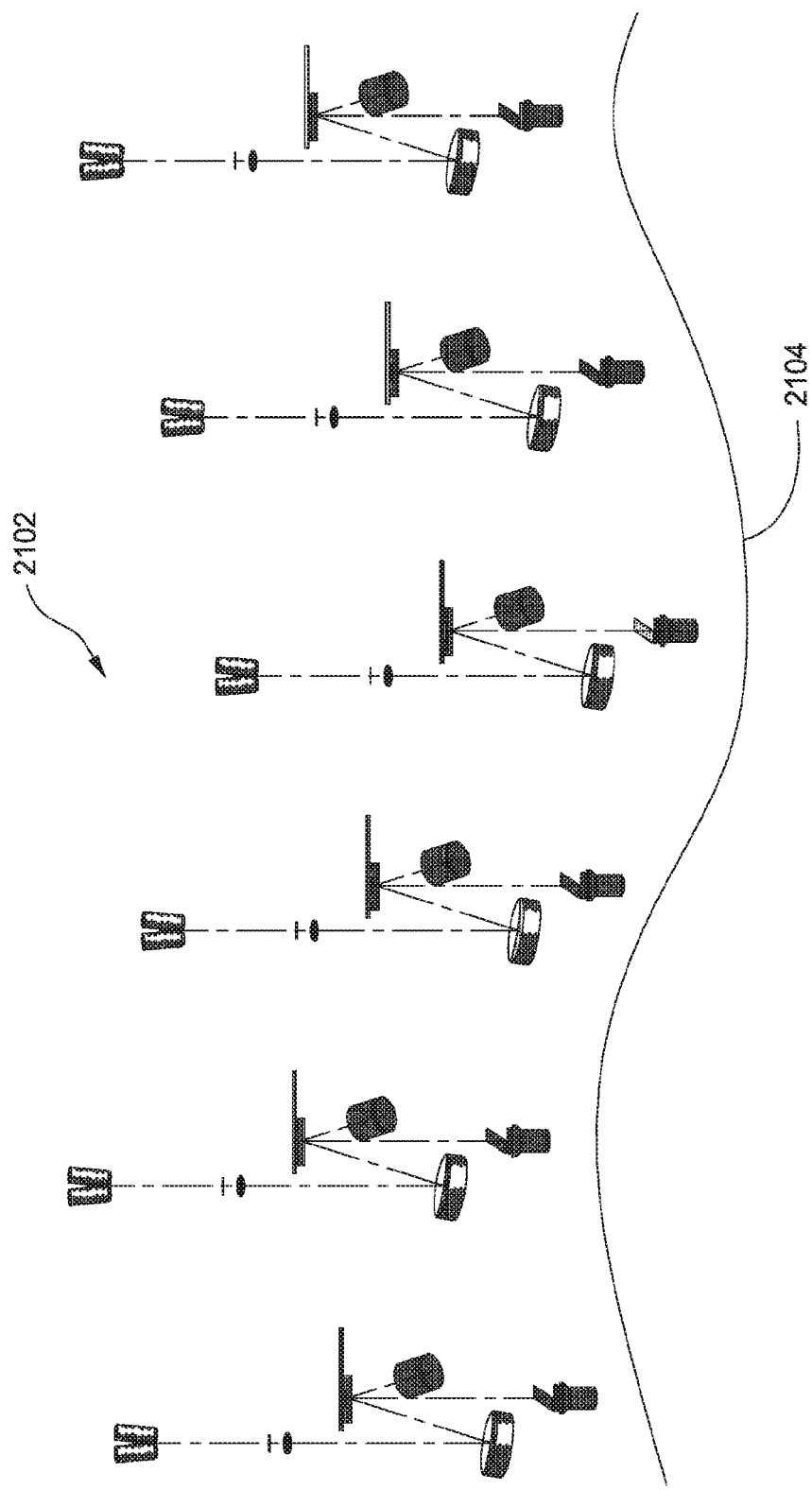
FIG. 21 illustrates a method for positioning each SLM imaging unit corresponding to conditions of localized substrate surface according to embodiments of the present invention.

FIG. 21 illustrates a method for positioning each SLM imaging unit corresponding to conditions of localized substrate surface according to embodiments of the present invention. In this example, the method examines the unevenness of the substrate surface 2104 during exposure, and adjusts the linear array of SLM imaging units 2102 accordingly. In this example, the uneven substrate 2104 is excessively shown to illustrate the benefit of having optimum height adjustment for each SLM imaging unit. This allows achieving auto-focus tuning to come within the range of DOF for intended resolution CD from 1 to 5 μm. This method is further described in the following sections.

In one approach, for printing TFT based photo voltaic (PV) panel, the minimum features CD can be more than 50 μm. In this printing resolution range, it often thought that ink jet printing could be a less costly option. However, one major drawback for ink jet printing is defect-prone due to ink mist, a side effect that comes with ink jet droplet stream Ink-jet printing is inherently not as clean as lithography process. It may be suited for patterning mask features that do not form active device or mainly for passive viewing purpose. For production worthy of making active TFT device with roll-to-roll printing, scalable array of SLM imaging units provides a better solution for maskless lithography because it produces better device yield. In this method, a magnification projection is used for maskless imaging. That is, instead of using a reduction objective lens, the exposure lens of the SLM imaging unit employs an enlargement objective lens that can magnify product feature size from 25 μm to a couple of hundred μm in a controlled fashion.

Figure 22:
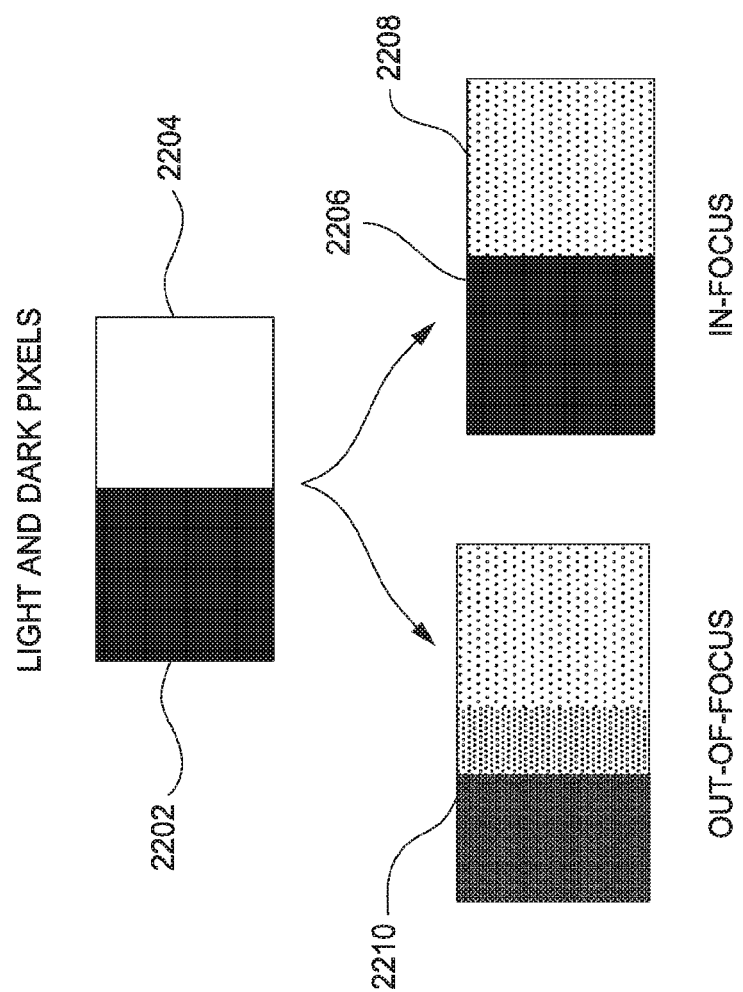
FIG. 22 illustrates a method for detecting focus of pixels according to embodiment of the present invention.

In order to maintain best focus over a substrate that may not be perfectly flat, one way is to monitor and adjust the focus of the SLM imaging unit during exposure. FIG. 22 illustrates a method for detecting focus of pixels according to embodiments of the present invention. One approach for monitoring focus is to use a through-the-lens monitoring camera to capturing images of the exposure in progress. After images are captured, an analysis of dark-light pixel image captured, in comparison with what would be expected for the exposure pattern, can readily derive a relative measure of the amount of defocus. As shown in the example of FIG. 22 is a pair of light and dark pixels (2202 and 2204) with in-focus (2206 and 2208) and an out-of-focus 2210 conditions. At the boundary transition from dark to light area, the in-focus pair exhibits a sharper transition pattern, whereas the out-of-focus pair has a blurred transition. The degree of blurred transition can be mapped to refer to the amount of defocus. In other approaches, one may monitor and analyze spatial frequencies in the image. Since focus errors preferentially reduce the higher spatial frequencies, one may assess the amount of defocus by comparing the loss of high frequency components of the image captured. Yet another method is to monitor and analyze the image contrast from a group of light-dark patterns, with image contrast being the best at optimum focus setting. And the degrees of contrast lost can be referred to the amount of de-focus.

Figure 23A:
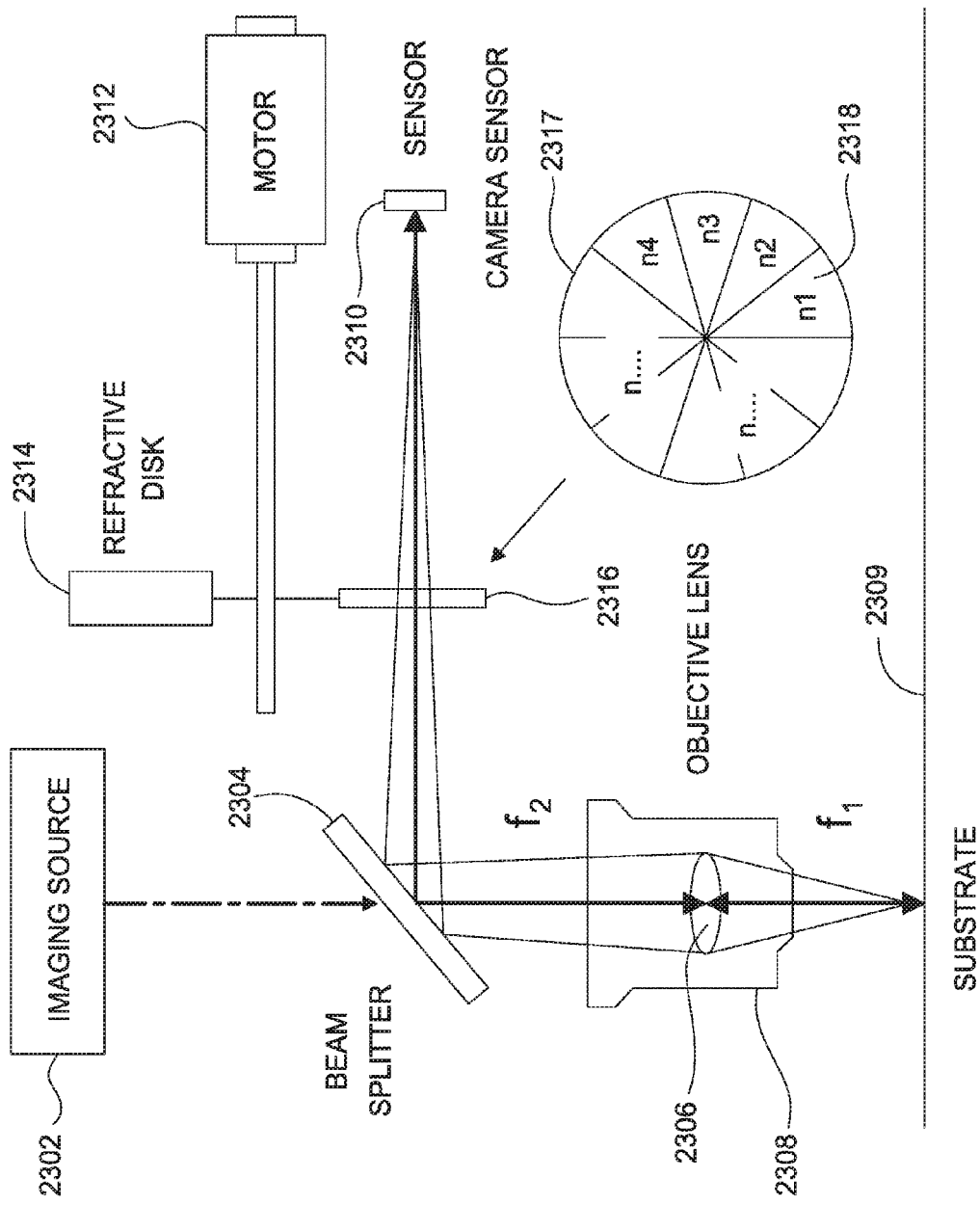
FIGS. 23a-23c illustrate exemplary apparatuses for detecting focus of a SLM imaging unit on-the-fly according to embodiments of the present invention.

Although the methods described above are effective focus monitors of the size of focus error, they do not directly provide any indication of the direction of the error. To address this issue, the system may, under software control, constantly vary the focus slightly over a range centered on the target focus, and update the target focus position to keep it at the best focus. This can most sensitively be determined by balancing the errors at the two extremes of the range. It may be advantageous, however, to avoid the need to intentionally defocus the exposure image. One way to achieve this is to perturb the focus of the camera in a controlled fashion, without altering the focus of the exposure image. This can be done on a through-the-lens monitor camera by altering the effective optical path length between the camera and the objective lens. To a first order approximation, changing the focal length on the camera side of the lens ($f_2$ in the diagram) has the same effect as changing $f_1$ by the same percentage. This focus change can be effected by vibrating the camera in and out, reflecting the image off a mirror that vibrates, or as shown in FIG. 23a, by passing the light through a spinning disk with segments having different thicknesses and/or refractive indices, to give the desired variation in effective optical path length. This is as shown as the first OPD 2316 and the second OPD 2326. Similarly, the image could be reflected off a mirrored disk, with segments at different heights.

FIG. 23a illustrates an exemplary apparatus for detecting focus of a SLM imaging unit on-the-fly according to embodiments of the present invention. As shown in FIG. 23a, the apparatus includes an imaging source 2302, a beam splitter 2304, an objective lens 2306 and its housing 2308. An example of the imaging source 2302 is shown in FIG. 17, including the components 1702 to 1714. The apparatus also includes a first camera sensor 2310 (also referred to as the camera or sensor for short), a first motor 2312, a first refractive disk 2314, and a first optical path difference (OPD) modifier 2316. The first OPD modifier 2316 may be formed from a circular optical device 2317, where the circular optical device 2317 may be made with multiple sectors (for example 2318) and each sector is made with different refraction index material, or made with the same refractive index material but with different thickness than can cause optical path difference.

Figure 23B:
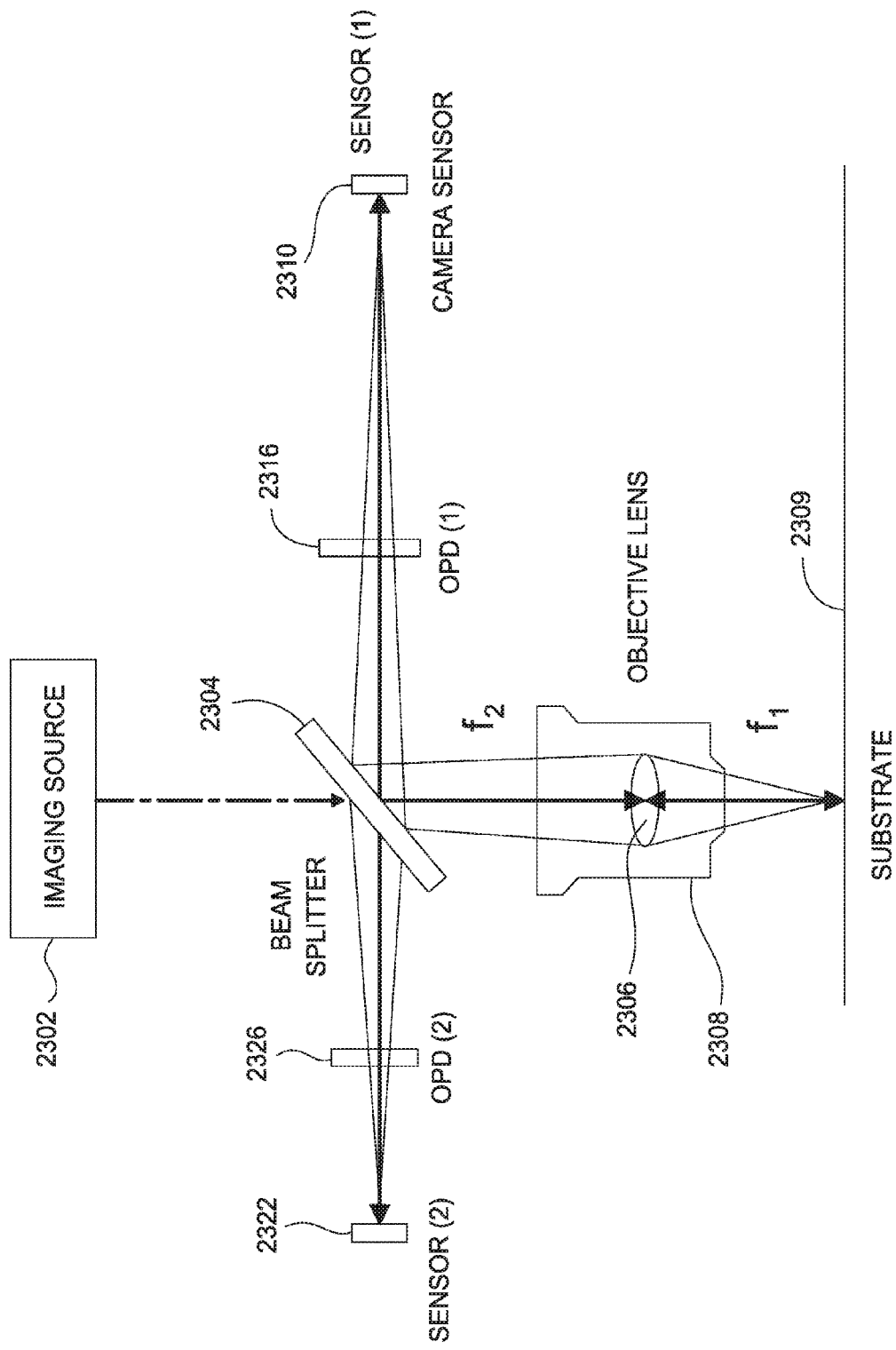
Figure 23C:
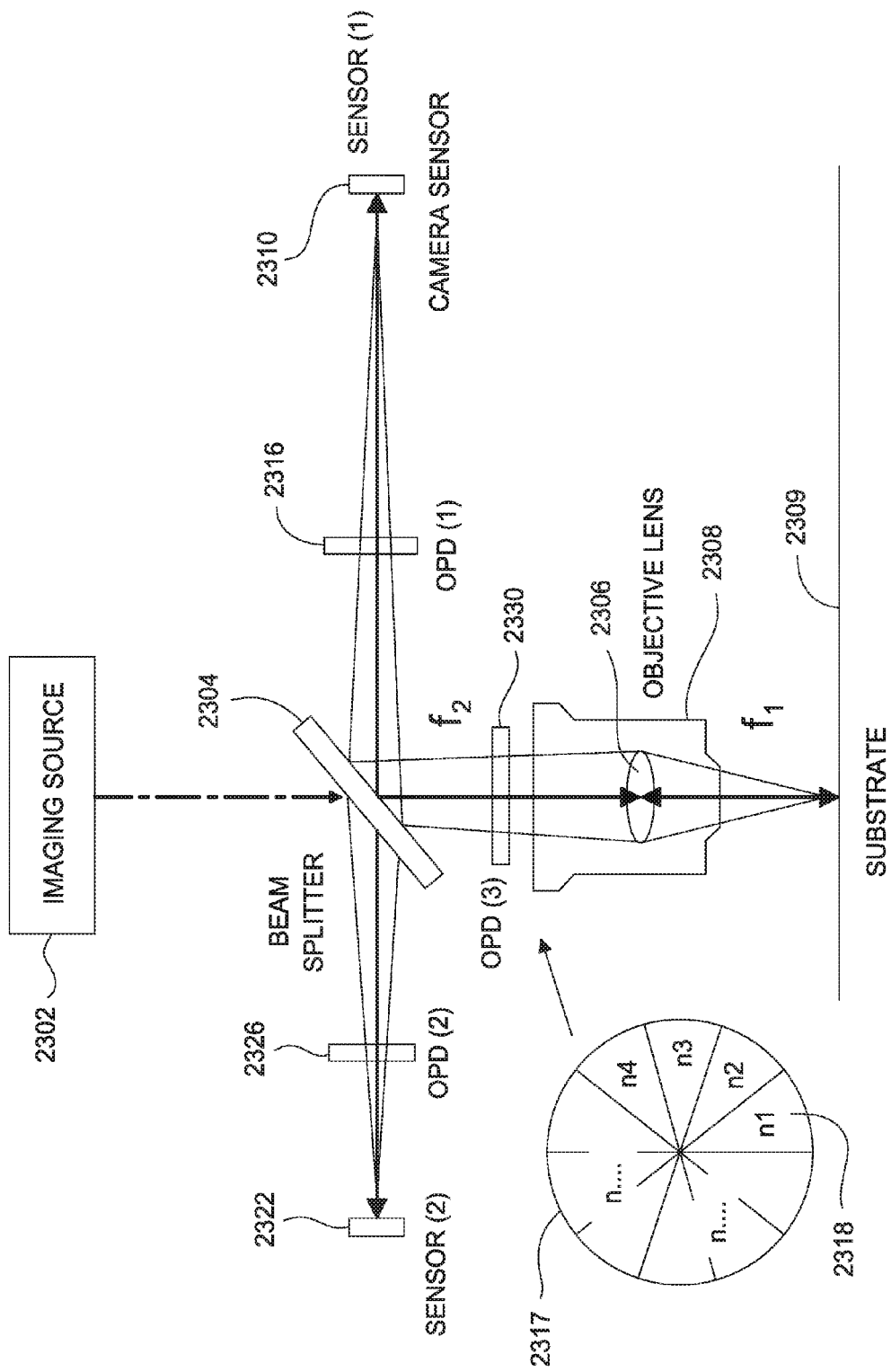

Another way of determining the focus adjustment direction is to have two cameras that can capture the images from different optical path lengths as shown in FIGS. 23b and 23c. FIGS. 23b-23c illustrates two other exemplary apparatuses for detecting focus of a SLM imaging unit on-the-fly according to embodiments of the present invention. In addition to the elements shown in FIG. 23a, these exemplary apparatus further includes a second camera sensor 2322 (also referred to as the camera or sensor for short), and a second optical path difference (OPD) modifier 2326. FIG. 23c also includes a third OPD modifier 2330. The second and third OPD modifiers 2326 and 2330 may be formed in a similar fashion as the first OPD modifier 2316. When with two camera sensors 2310 and 2322 are used, the two respective OPDs 2316 and 2326 with different refractive indexes can be set up to determine focus adjustment direction. In another embodiment, the different OPDs 2316 and 2326 are effected simply by placing the respective cameras 2310 and 2322 at different physical distances, The examples shown in FIGS. 23b-23c examine the images from first camera sensor to second camera sensor to compare and analyze the focus adjustment direction, and adjust focus setting to equalize the defocus observed in the two camera sensors, thus assuring that the best focus is achieved at an OPD midway between the two camera sensors. Here, the first and second camera sensors are configured to observe the substrate with complementary focus offsets to determine direction of a target focus. Yet another method is to avoid adjusting focus by moving the objective lens up and down, this is to place the third OPD 2330 above the housing 2308 of the objective lens 2306 to effect the focus adjustment by changing the effective optical path length.

The on-the-fly focus monitor and adjustment may be performed as follows:
1) The separation of substrate surface from the objective lens is set within the focusing range.
2) To begin with, image is formed and captured by using non-actinic illumination. This will not cause any damage to the photo sensitive material for exposure. That is, the initial focus is set by using non-actinic illumination; the objective is then adjusted accordingly for best focus.
3) As the exposure stage starts to move along the direction of substrate movement (the X direction), the actinic exposure starts.
4) Image captured is then monitored under the actinic illumination. The Objective lens is adjusted accordingly.
5) Note that each focus adjustment is for the next exposure site but based on best focus determined for the previous exposure location.
6) The amount of focus adjustment for the objective lens is based on the optical path difference measured for f1 vs. f2.

Figure 24:
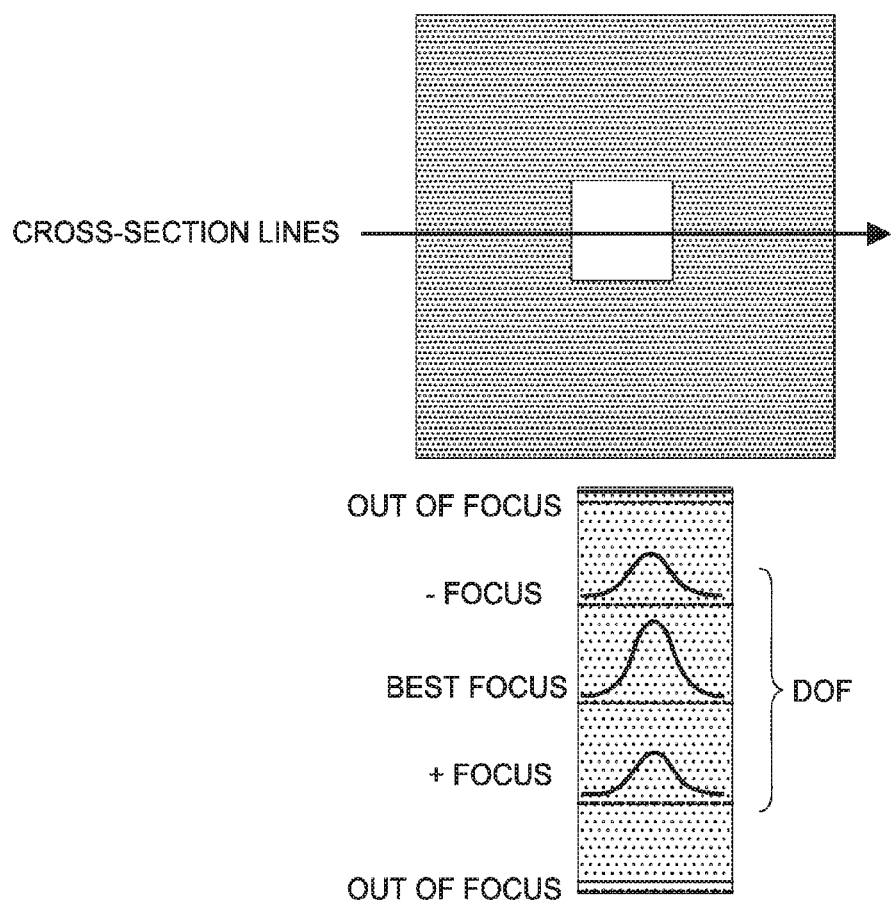
FIG. 24 illustrates an exemplary imaging pattern where pixel voting exposure may be applied according to embodiments of the present invention.

As described above, the image writing may be monitored by one or more cameras on-the-fly while exposure is taking place. By using a mirror pixel voting scheme for exposure, each image pattern is being exposed and formed by many DMD mirror pixels. This exposure scheme inherently permits more margin of focusing error at the initial stage of exposure since each mirror pixel exposure only contributes a small fraction of the total exposure energy required. As pixel voting exposure progresses, the focus of each SLM imaging unit may be tuned and adjusted on-the-fly. This margin of focus error is important for writing the features that are either isolated "hole-like" patterns surrounded by dark field, or isolated "island-like" patterns surrounded by a clear field such as the example shown in FIG. 24. This is because both aforementioned feature patterns are not easy to set optimum focus initially due to the lack of image variation while perturbing the focus setting. However, the optimum focus can be determined after a number of exposures have been progressed.

Figure 25:
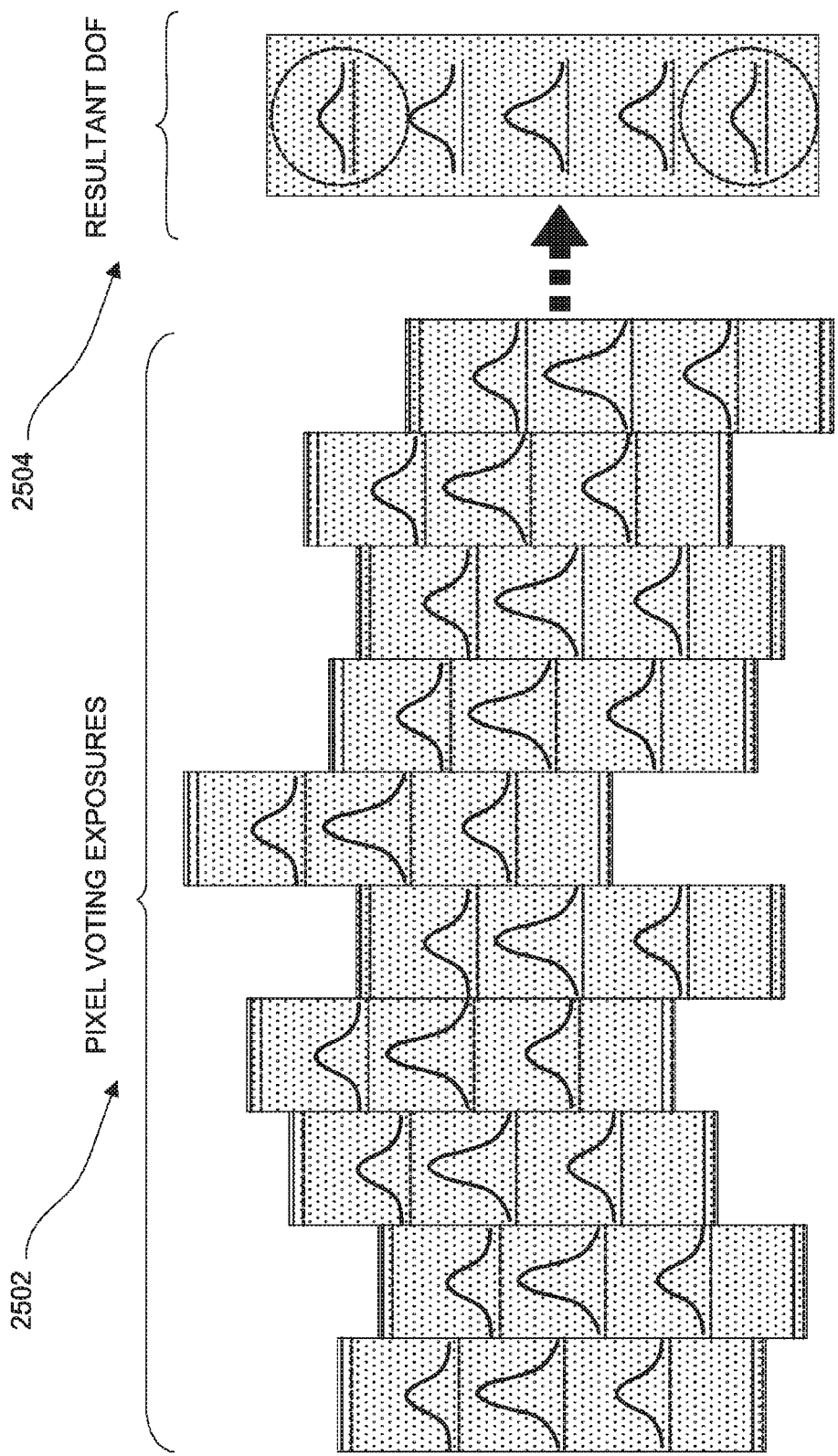
FIG. 25 illustrates a method for improving DOF through pixel voting exposures according to embodiments of the present invention.

In another approach, the type of auto-focusing mechanism described above may be used to accomplish "focus voting exposure" to expand the overall DOF. FIG. 25 illustrates a method for improving DOF through pixel voting exposures according to embodiments of the present invention. In the example shown in FIG. 25, the optimum exposure setting can be dynamically tuned during the pixel voting exposure. This allows the pixel voting exposures to be accomplished by a different best focus levels that are still within the DOF. This scheme enables the final image pattern to be exposed and formed by many votes of the focus settings 2502 that may extend to the overall resultant DOF 2504.

FIG. 26 illustrates an exemplary implementation of a multiple charged-particle beam imaging unit according to embodiments of the present invention. According to aspects of the present disclosure, a SLM imaging unit as shown in FIG. 2, FIG. 6, or FIG. 17 may be modified to form a multiple charged-particle beam (MCB) imaging unit as shown in FIG. 26, which may then be used to as a unit in an array of MCB imaging units similar to the array of SLM imaging units as shown in FIG. 7, FIG. 8, FIG. 15, and FIG. 16. In one embodiment, the MCB imaging unit 2600 may include an electron source, a programmable aperture plate, a blanking plate, electron beam projection optics. The electron beam projection optics may include electrostatic multi-electrode accelerating lenses, a first set of magnetic lenses, a stopping plate, a beam steering multiple, and a second set of magnetic lenses. The MCB imaging unit may optionally include a resist coated mask blank.

According to aspects of the present disclosure, for simplicity, the term multiple charged-particle beam(s) (MCB) can mean either multiple electron beam(s) or multiple ion beam(s), or a combination of multiple electron beam(s) and multiple ion beam(s). The multiple electron beams and/or the multiple ion beams are collectively referred to as multiple charged-particle beams. The methods of exposure described herein can be applied to both electron beams and ion beams. The optical lens configurations can be substantially similar for both the electron beams and ion beams, except for the way the source of charged particles (electron beams or ion beams) are being generated. In addition, different types of photons may be used for making exposures, including but not limited to visible, UV, vacuum UV (VUV), deep UV (DUV), Extreme UV (EUV), and X-ray. Note that for photon acting exposures, total exposure energy can be referred in the unit of milli-Joule (mJ), and for charged-particle beam exposures, the accumulated exposure charge energy can be referred in the unit of micro-Coulomb (uC), both the photon and charged-particle beam exposures are measured in unit area of square centimeters.

In one implementation, electrons extracted at gun-level may first pass through a multi-electrode stack, which acts as a condenser and generates a broad, homogeneous beam of 25 mm in diameter. This electron beam may then impinges perpendicularly onto a programmable aperture plate, where micrometer sized beams can be formed. Additionally, each beam can be deflected individually by CMOS-controlled micro-deflectors, then the beams (deflected and un-deflected) may enter the projection optics of the MCB imaging unit where they get accelerated (for example from 5 keV to 50 keV beam energy) in the electrostatic multi-electrode lenses and be de-magnified by one or more magnetic lenses located at the bottom of the MCB imaging unit. Un-deflected beams can be passed to the substrate level. Deflected beams can be filtered out at the stopping aperture plate in the projection optics. The multiple charged-particle beams may be switched on and off according to the data fed into the MCB imaging unit 2600 via a data path.

FIG. 27 illustrates another exemplary implementation of a multiple charged-particle beam imaging unit according to embodiments of the present invention. Similar to the MCB imaging unit 2600 as describe above, the MCB imaging unit 2700 may also be adapted to be used to as a unit in an array of MCB imaging units similar to the array of SLM imaging units as shown in FIG. 7, FIG. 8, FIG. 15, and FIG. 16. In one embodiment, the MCB imaging unit 2700 may include an electron source, one or more collimator lenses, an aperture array, a beam blanker array, a beam deflector array, and a projection lenses array.

FIG. 28 illustrates yet another exemplary implementation of a multiple charged-particle beam imaging unit according to embodiments of the present invention. Similar to the MCB imaging unit 2600 as describe above, the MCB imaging unit 2800 may also be adapted to be used to as a unit in an array of MCB imaging units similar to the array of SLM imaging units as shown in FIG. 7, FIG. 8, FIG. 15, and FIG. 16. In one embodiment, the MCB imaging unit 2800 may include an electron source, a programmable aperture plate, a blanking plate, electron beam projection optics. The electron beam projection optics may include electrostatic multi-electrode accelerating lenses, a first set of magnetic lenses, a stopping plate, a beam steering multiple, and a second set of magnetic lenses.

FIG. 29 illustrates another exemplary implementation of a multiple charged-particle beam imaging unit according to embodiments of the present invention. Similar to the MCB imaging unit 2600 as describe above, the MCB imaging unit 2900 may also be adapted to be used to as a unit in an array of MCB imaging units similar to the array of SLM imaging units as shown in FIG. 7, FIG. 8, FIG. 15, and FIG. 16. In one embodiment, the MCB imaging unit 2900 may include an electron source, a programmable aperture plate, a blanking plate, electron beam projection optics. The electron beam projection optics may include electrostatic multi-electrode accelerating lenses, a first set of magnetic lenses, a stopping plate, a beam steering multiple, and a second set of magnetic lenses.

According to aspects of the present disclosure, when a positive resist is exposed by an electron beam, some molecular chains in the resist molecules can break, thereby reducing the average molecular weight. This is accompanied by an increase in solubility and increases the etch rate. For electron beam lithography it may be desirable to know the three dimensional distribution of energy deposition in the resist after exposure by the charged-particle beam. Typical electron beam lithography machines nowadays use electron beams with 10-100 keV energy per electron. Therefore, the free path of an electron may be 10 um or more, which is at least an order of magnitude more than the resist thickness. Thus, the electrons can easily penetrate the resist layer and reach the substrate. As the electrons penetrate the resist and the substrate, they can experience scattering events, such as forward scattering and backscattering.

In forward scattering, an electron can collide with an electron from one of the atoms in the substrate or resist. The incident electron may change its direction and transfer part of its energy to the atom. Because of the extra energy, the atom can become exited (one of its electrons goes to an exited level) or ionized (one electron leaves the atom, creating a secondary atom in the material). When the target atom becomes part of a resist molecule, the molecular chain may break due to this excitation or ionization. The scattering angle due to inelastic scattering is typically small.

In backscattering, an electron may collide with the much heavier nucleus, which may result in an elastic scattering event. In most cases, the electron retains its energy, but changes its direction. The scattering angle may be large in this case. After large angle scattering events in the substrate, electrons may return back through the resist at a significant distance from the incident beam, thereby cause additional resist exposure. This backscattering can cause the proximity effect, which is further described in the sections below.

As the primary electrons slow down, much of their energy may be dissipated in the form of secondary electrons with energies in the range 2 to 50 eV. Majority of the resist exposure may be due to these electrons. Since they have low energies, their range can be a few nanometers, and they contribute little to the proximity effect. However, this phenomenon, together with the forward scattering, may cause a widening of the exposure region, which can be a limiting factor in resolution of charged-particle beam lithography exposure systems. The distance an electron travels before losing its energy depends on both the energy of the primary electrons and the type of material it is traveling in. The fraction of electrons that are backscattered, namely e, is roughly independent of beam energy, which relates to the substrate material being used. For example, substrates with a low atomic number may give less backscattering than substrates with a high atomic number.

For head-on collisions with the nucleus, the transfer of energy E can be determined by:

$$E=E_0(1.02+E_0/10^6)/(465.7A)$$

where $E_0$ is the incident beam energy and A is the atom number of the target. If E exceeds some displacement energy $E_d$, which depends on the atomic weight, bond strength and crystal lattice, the nuclei can be displaced and the crystal structure may be damaged.

In addition to possible damage due to nuclei displacement, damage may be caused by substrate heating due to high exposure doses. Heating can also modify resist sensitivity, which can cause unwanted line width variations. This issue is addressed below in association with the descriptions of FIG. 33*e* and FIGS. 34*b*-34*d*.

Figure 30A:
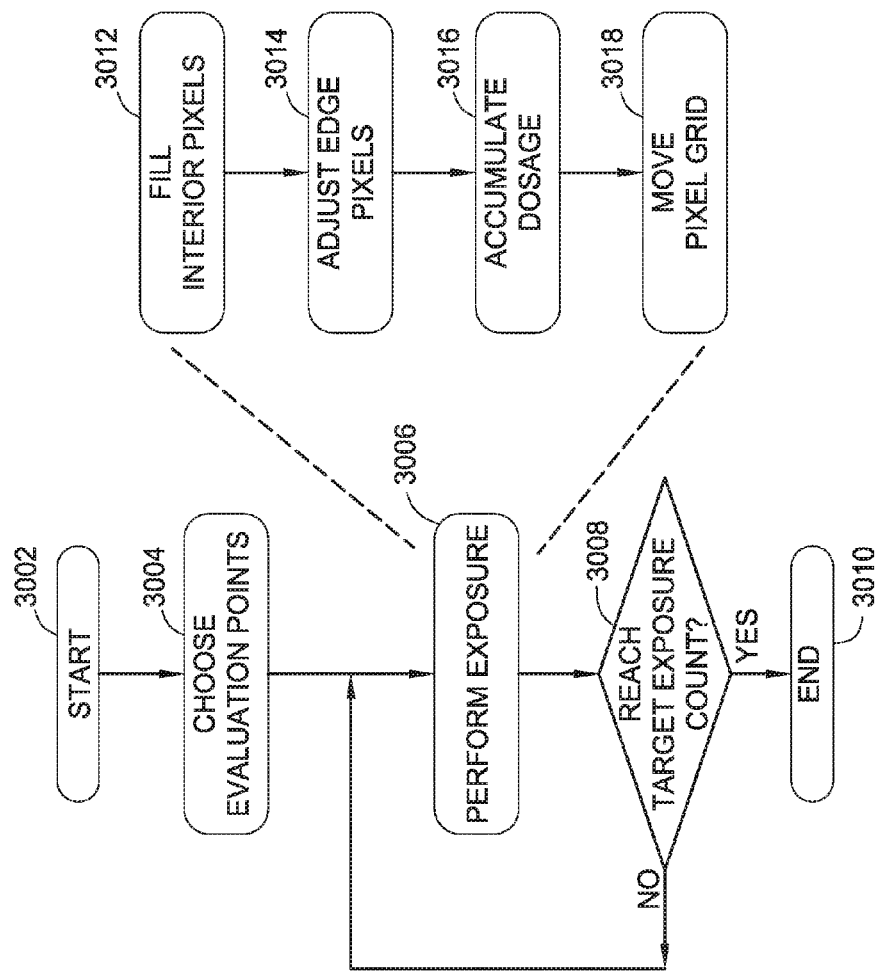

FIGS. 30*a*-30*d* illustrate methods for imaging an object according to embodiments of the present invention. In an exemplary approach shown in FIG. 30*a*, the method starts in block 3002 and then moves to block 3004 where the method chooses evaluation points along edges of an object to be imaged. FIG. 30*b* illustrates an example of choosing evaluation points along edges of an object. As shown in FIG. 30*b*, a trapezoid represents the object 3022 to be imaged. Evaluation points (black dots) 3024 are selected and used for monitoring the exposure at the edges of the object 3022. Locations of the object 3022 are referenced to a pixel grid 3026, where each square 3028 in the pixel grid 3026 represents a pixel. A data structure may be created to store information associated with each evaluation point, including the location of each evaluation point relative to the pixel grid, the angle of an edge relative to the pixel grid, and the number of times an evaluation point is within an exposure field (i.e. the number of times an evaluation point has been exposed), and the exposure dose accumulated at this evaluation point so far. According to embodiments of the present invention, the distance between any two evaluation points 3024 is less than half a pixel and the distance between evaluation points is equally spaced. In other words, the evaluation points are selected in such a way that the Nyquist criterion is met, as the sampling frequency of the object 3022 to be imaged is higher than twice the frequency of the original signal as represented by the frequency of the pixel grid. In other implementations, the distance of evaluation points may be chosen to be ⅓, ¼, or other fractions of a pixel as long as the Nyquist criterion is met.

In block 3006, the method performs an exposure to image the object 3022. Within each exposure performed by the block 3006, the method further performs the following operations. First, in block 3012, the method first fills the interior pixels of the object 3022 using a scan line geometric algorithm for example. This is shown by the shaded area 3030 in FIG. 30*b*. Note that the example shown in FIG. 30*b* assumes an image transition from white to black, where multiple dosages of exposures may be received within the boundaries of the object 3022. Persons skilled in the art would appreciate that a similar but inverse operation may be performed to image an object that has a transition from black to white.

In block 3014, the method examines the edge pixels of the object and makes exposure adjustments according to a number of factors, including the area of a partial edge pixel with respect to the pixel grid, the current exposure dosage level with respect to a target exposure dosage level, the influence of exposures from neighboring pixels, the amount of error/distortion corrections, and other performance optimization considerations. If a pixel is primarily outside the edge (and its corresponding evaluation points) of the object, for example pixel 3025 in FIG. 30*b*, dithering of the associated evaluation points is turned off for most of the exposures. On the other hand, if a pixel is primarily inside the edge (and its corresponding evaluation points) of the object, for example pixel 3027 in FIG. 30*b*, dithering of the associated evaluation points is turned on for most of the exposures.

In block 3016, the method accumulates exposure dosage of the imaging writer system. FIG. 30*c* and FIG. 30*d* illustrates such accumulation of exposure dosage from an initial dosage level to a target exposure dosage level. In both scenario shown in FIG. 30*c* and FIG. 30*d*, although the total amount of exposure dosage is the same (target exposure dosage), different effects of edge transitions may be achieved by adjusting the edge pixels for each exposure. The accumulation and use of the exposure dosages from each exposure provides a feedback mechanism to allow the imaging writer system to adaptively adjust imaging profile at the boundaries of the object being imaged and at the same time ensure the total target exposure dosage is maintained. In block 3018, the method moves the pixel grid 3026 for subsequent exposure. This is further described in association with FIGS. 33*a*-33*d* below.

In block 3008, a determination is made as to whether a predetermined target exposure count has been reached. If the target exposure count has not been reached (3008_No), the method moves to block 3006 and performs another exposure to image the object 3022. In such a way, multiple exposures are performed in order to image an object. Alternatively, if the target exposure count has been reached (3008_Yes), the method moves to block 3010 and imaging operation of the object is ended.

According to embodiments of the present invention, multiple exposures may be performed on the object. Such multiple exposures may be achieved by multiple passes of an imaging area by different SLMs to provide a predetermined amount of exposure to the imaging area of interest. In one implementation, about 400 exposures may be performed for each imaging location, and the dosage of each exposure is accumulated at each evaluation point. Typically, the first exposure is arbitrary. For subsequent exposures, the method compares the accumulated dosage at an imaging location to a fraction of the target exposure dosage (N/400*total target exposure dosage) for that imaging location. If the accumulated dosage is lower than the target exposure dosage, then the pixel may be turned on for that exposure. On the other hand, if the accumulated dosage is higher than the target exposure dosage, then the pixel may be turned off for that exposure. For subsequent exposures, the method compares the accumulated dosage at an imaging location to a fraction of the target exposure dosage for that imaging location, pro-rated by the number of exposures completed (for exposure N of 400, compare against N/400*total target exposure dosage).

According to embodiments of the present invention, FIG. 30*c* and FIG. 30*d* illustrate different implementations in adjusting the edge pixels. In FIG. 30*c*, the vertical axis represents the accumulated amount of exposure dosage, and the horizontal axis represents the number of exposures administered during the imaging process of the object 3022. In this example, the exposure dosage increases relatively linearly as the number of exposures increases. The exposure dosage of an edge increases from an initial dosage level to the target exposure dosage following the step function 3032. As a result, a smeared or smoothed transition is produced at the edges of the object being imaged. Note that the total target exposure dosage may be determined experimentally, theoretically, or determined by a combination of experimental and theoretically analysis prior to performing the multiple exposures. In other approaches, the exposure dosages in early exposures may overshoot or undershoot relative to the step function 3032. However, such exposure dosage overshoot or undershoot may be corrected in subsequent exposures as the number of exposure count increases, and converge to the target exposure dosage towards the end of the exposure count.

On the other hand, in FIG. 30*d*, the amount of exposure dosage increases slowly initially, then increases relatively sharply in the mid section of the exposures, and slows down towards the end of the exposures, as shown by a step function 3034. This or any other step function can be used, provided it ends at the desired target dosage. An exemplary total target dosage may be 20 milli-Joules per square centimeter (mJ/cm$^2$).

In the examples of FIG. 30*c* and FIG. 30*d*, the threshold ratio for each exposure may be controlled. For example at the boundary of an object, if a pixel is primarily outside the edge (and its corresponding evaluation points) of the object, for example pixel 3025 in FIG. 30*b*, the threshold ratio of exposure may be set higher to create a higher probability that the pixel would be turned off. But if a pixel is primarily inside the edge (and its corresponding evaluation points) of the object, for example pixel 3027 in FIG. 30*b*, the threshold ratio of exposure may be set lower to create a higher probability that the pixel would be turned on. In situations where an edge (and its corresponding evaluation points) falls roughly in the middle of a pixel, for example pixel 3029 in FIG. 30*b*, then the pixel will be turned on for approximately half of the exposures and the pixel will be turned off for approximately the other half of the exposures. By adjusting the threshold to favor exposing an edge pixel when the pixel grid is such that the majority of the pixel is in the interior, instead of simply exposing the edge pixel in any intermediate exposure where the dosage is found to be below target, a sharper image profile at the edge can be obtained.

Figure 31A:
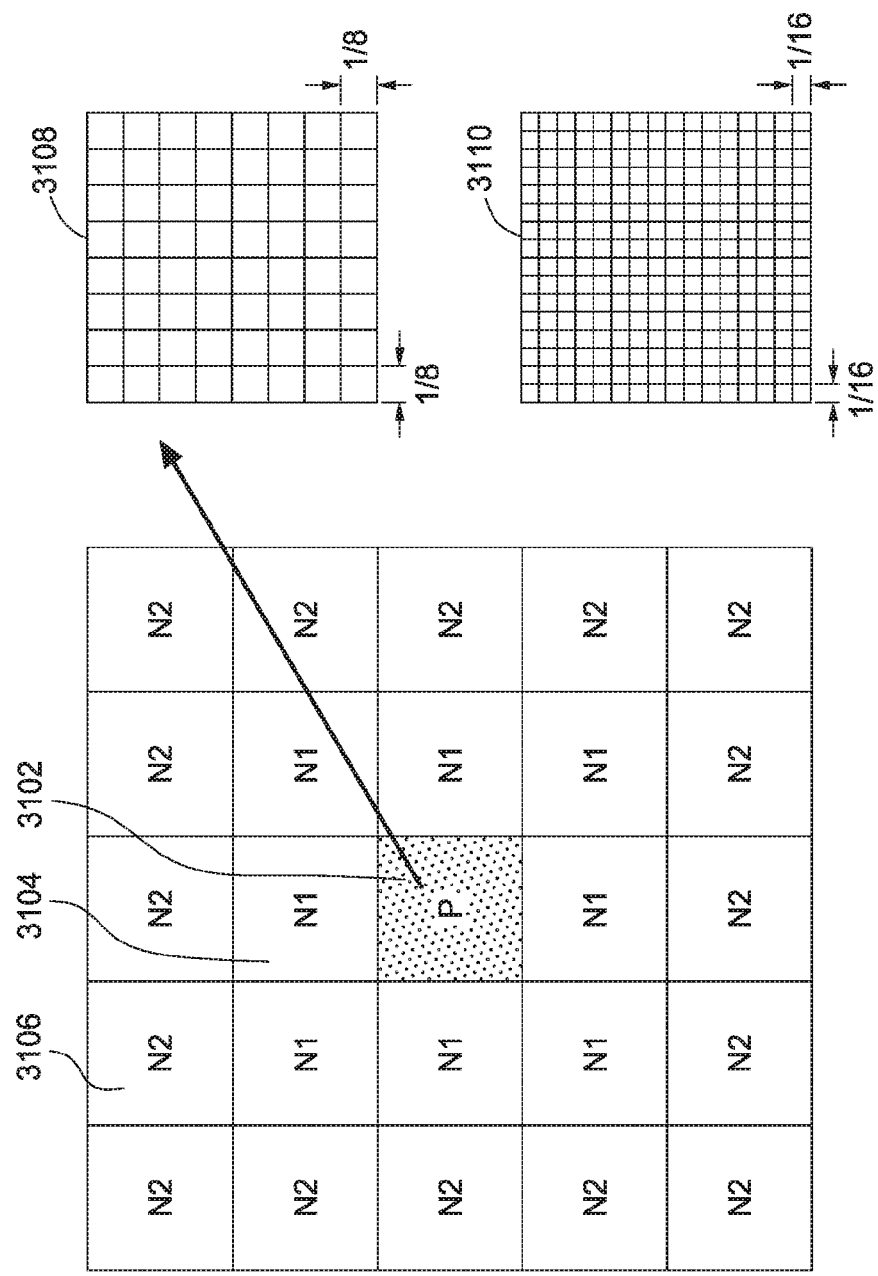
FIGS. 31a-31b illustrate methods for computing the accumulated dosage for evaluation points according to embodiments of the present invention.
Figure 31B:
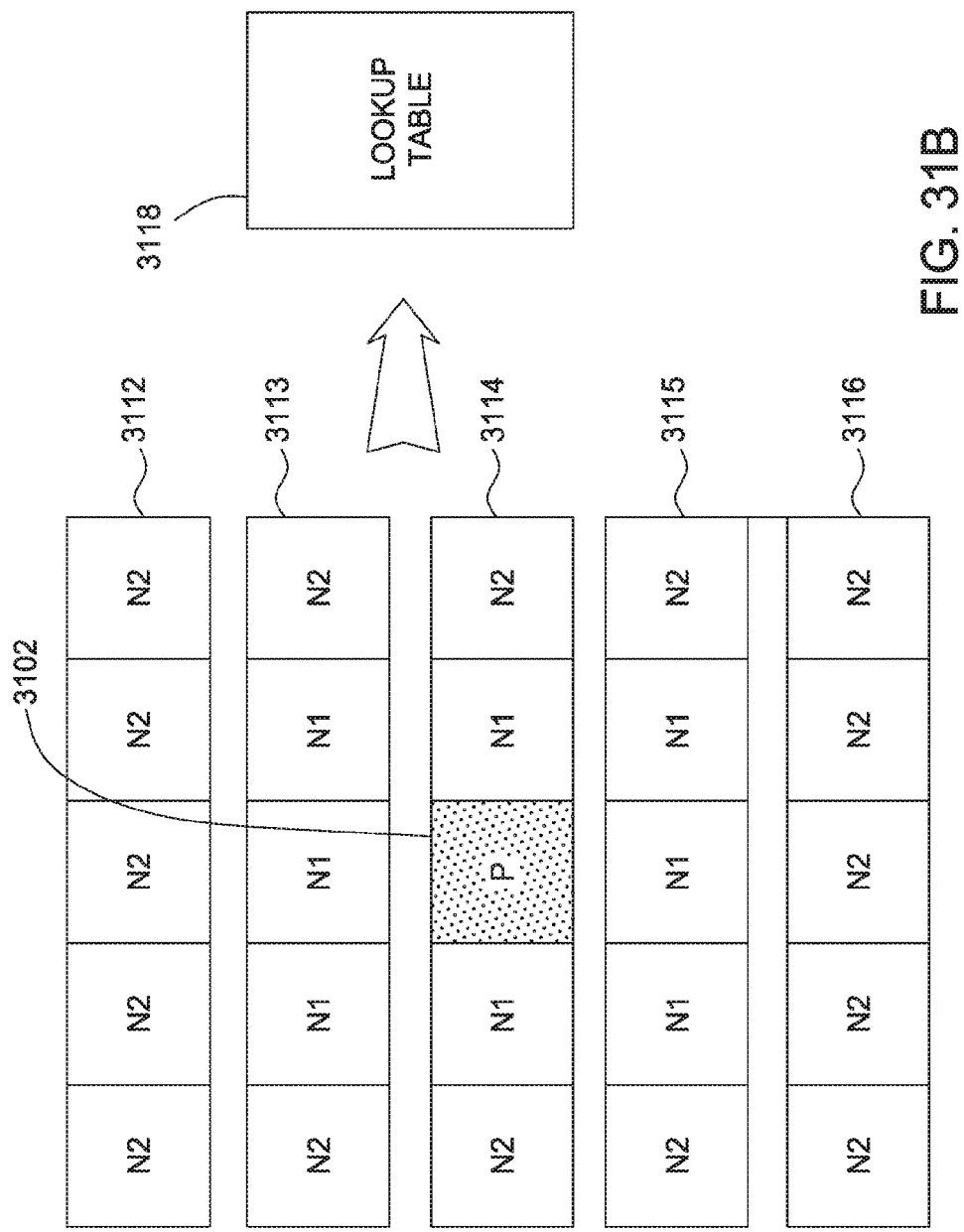

FIGS. 31a-31b illustrate methods for computing the accumulated dosage at evaluation points according to embodiments of the present invention. The method computes the accumulated dosage for evaluation points within a pixel P 3102 by taking into consideration contributions by exposures of that pixel and its neighboring pixels. In one implementation, dosage contributions to locations within pixel P3102 from its immediate neighboring pixels N1 3104 and second neighboring pixels N2 3106 are determined and stored. In general, the contribution of a pixel to its neighbors may have a waveform of shape similar to $(\operatorname{Sin} X/X)^2$, and the contribution diminishes significantly outside of the second order neighbors N2 3106. In the example shown in FIG. 31a, the width of a pixel is chosen to be 1 square micron and the contributions of pixel P 3102 to its neighbors 2 um away is negligible. In other embodiments, effects of the pixel P 3102 to higher orders ($3^{rd}$ order or higher) may be considered based on desired accuracy of the image writer system.

As shown in the example of FIG. 31a, a pixel may be further quantized to a granularity of ⅛ of a pixel, shown by the sub-pixel grid 3108, to take into account of finer accuracy in imaging the pixel P 3102. The dosage contribution of each neighboring pixel is pre-computed at each of these finer grid points, and the value at the nearest of these points (or a combination of a few nearest finer grid points) is used when accumulating the dose at an evaluation point. Depending on the accuracy requirement of the image writer system, the pixel P may be quantized to 1/16 (shown by the numeral 3110) or other finer quantization factors according to embodiments of the present invention.

Prior to imaging an object, simulations are performed to collect information to create a series of lookup-tables (LUTs). The LUTs are used to compute the exposure dosage for each exposure of the object during imaging operations. In one approach, a LUT may be created as follows. As discussed in association with FIG. 31a above, an exposure of a pixel may have contributions to its first order neighbors (N1) and second order neighbors (N2). Each pixel may be further divided into 64 sub-pixel regions, using a quantization granularity of ⅛ of a pixel. In addition, 400 exposures may be accumulated for one imaging area and a threshold ratio is about half of its total exposure intensity. Thus, each exposure may deliver $\frac{1}{800}^{th}$ of the complete exposure. Assuming a 2.5% (1/40) precision for each exposure, then the method needs to quantize to 1/32,000 of a full dose, which may be represented by approximately 15 bits. Rounding the 15 bits to 16 bits, it means that 16 bits (2 bytes) may be used to represent the dose contribution of one pixel at each of the 64 sub-pixel location. In other words, for each evaluation point considered in the imaging process, a 5×5 array of pixels are being examined; each pixel has 64 sub-pixel regions; and each sub-pixel region is represented by 2 bytes. As a result, each table may have a size of approximately 3200 bytes (25×64×2). Person skilled in the art would appreciate that to achieve different desired accuracy, a different array (e.g. 6×6, 8×8, etc) of pixels may be considered; different number of exposures (e.g. 500, 1,000, etc.) maybe taken; different precision percentage (e.g. 1%, 2%, etc) may be used, and different number of bits (e.g. 20, 21 bits, etc) may be used to represent each of the 64 sub-pixel location. For example, for the example of 21 bits representing a sub-pixel region, a 64-bit long word may be used to represent three of such sub-pixel regions. Depending on the desired accuracy of the image writer system, corresponding LUTs having different sizes may be created.

For the example shown in FIG. 31a, to calculate the dose contributed by an exposure at each evaluation point would require 25 table lookups using conventional approaches, which include table lookups for neighboring pixels (N1s, and N2s) of the pixel P 3102. Such approaches may take a long time and consumes lots of processing power. FIG. 31b illustrates a method for processing the pixel P of FIG. 31a according to an embodiment of the present invention. In one approach, the pixel P 3102 and its first order neighbors N1 and second order neighbors N2 may be arranged in five rows of five pixels, which are shown in FIG. 31b as 3112, 3113, 3114, 3115, and 3116 in FIG. 31b. The lookup table 3118 may be arranged in such a way that each table lookup would retrieve information for a row of five pixels. Note that in this approach, instead of having 25 separate tables for each pixel, a combined table of roughly 100K bytes (3.2K×32) may be created and used for retrieving information for a 5-pixel group together. In such a way, the efficiency of performing table lookup may be increased by a factor of 5.

In yet another approach, the lookup table 3118 may be arranged in a different way that each table lookup would retrieve information for a column of five pixels. In that approach, the pixel P 3102 and its first order neighbors N1 and second order neighbors N2 may be arranged in five columns of five pixels (not shown). To access the lookup table 3118, part of the address may be derived from bit pattern of a column of five pixels. For example, a bit pattern of 10101 may be used to represent a column of five pixels, where a bit value of 1 may indicate a pixel is ON and a bit value of 0 may indicate a pixel is OFF, or vice versa based on design engineers' implementation choices. With the arrangement of group of five pixels, each table lookup is more efficient because it is capable of retrieving data for five pixels instead of retrieving data for one pixel in conventional approaches.

Figure 32:
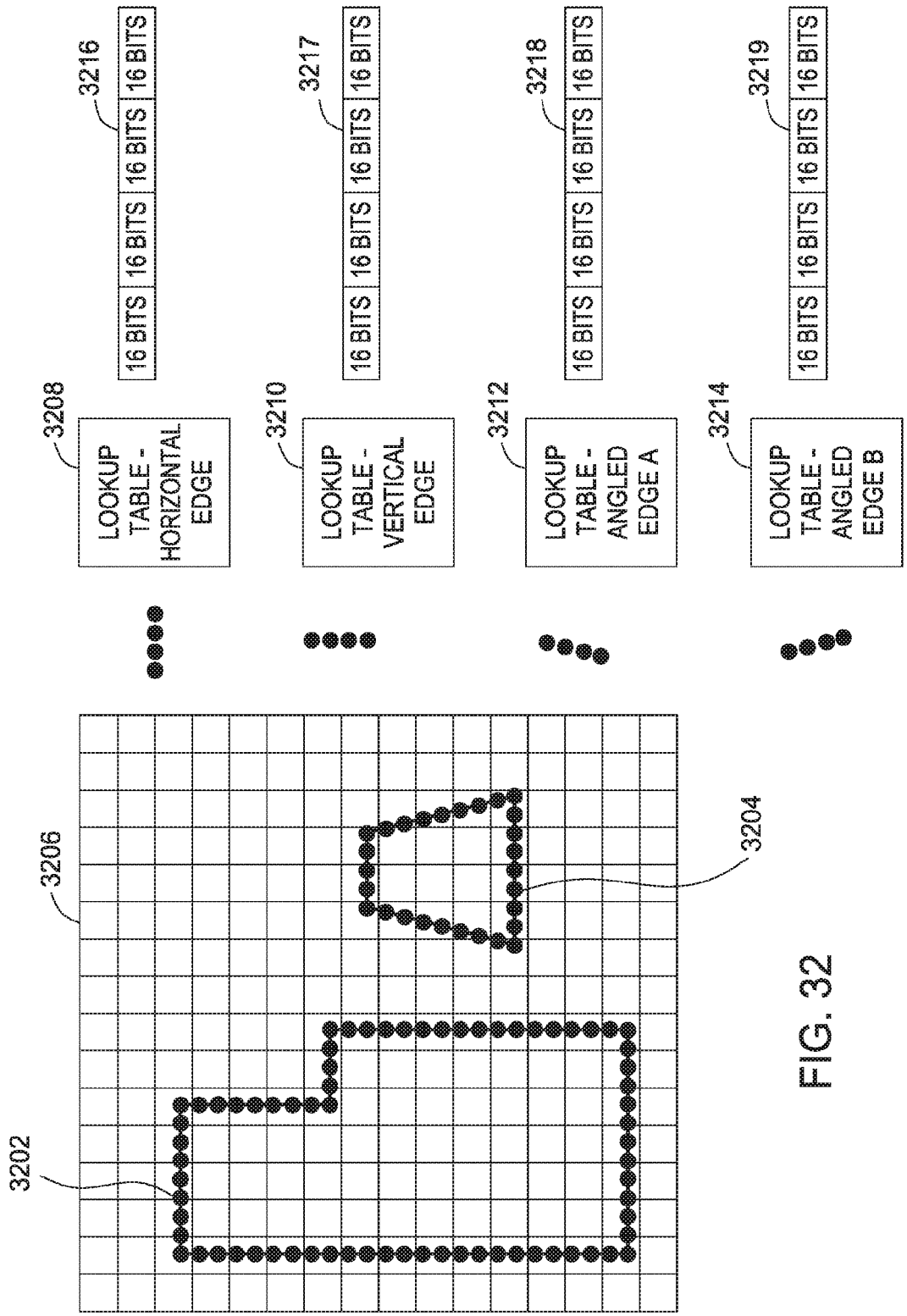
FIG. 32 illustrates methods for imaging objects by processing a group of evaluation points according to embodiments of the present invention.

Note that the distance between evaluation points is substantially the same and they are chosen to be close to each other. Taking these properties into consideration, FIG. 32 illustrates methods for imaging objects by processing a group of evaluation points according to embodiments of the present invention. In this example, two objects 3202 and 3204 are being imaged and they are referenced by a pixel grid 3206. As described above, evaluation points, represented by black dots, are chosen along the boundaries of each object. In one implementation, the evaluation points may be processed in groups of four and corresponding lookup tables may be constructed for processing particular types of edges. For example, a lookup table 3208 may be provided for processing horizontal edges; a lookup table 3210 may be provided for processing vertical edges; a lookup table 3212 may be provided for processing edges with angle A 3212, and a lookup table 3214 may be provided for processing edges with angle B 3214, etc. As seen in this example, the number of tables may depend on a number of factors, such as the shapes (angles of edges) of objects to be imaged. In general, a reference table is created for the whole image writer system and various composite tables, such as tables 3208, 3210, 3212, and 3214, are created for addressing different situations.

As shown in FIG. 32, a group of 4 evaluation points may be processed as a group. Taking the group of 4 evaluation points oriented vertically for example, which may span a distance of approximately less than 2 pixels. Note that in some situations, a group of 4 evaluation points may span over 3 pixels; and in those situations, the 3 pixels and their corresponding neighboring pixels will be considering in imaging the group of 4 evaluation points. Assuming a pixel may be affected by its neighbors from 2 pixels away, 2 neighboring pixels are appended on each end of the 4 vertical evaluations points to form a group of 6 to 7 vertical pixels. According to embodiments of the present invention, the lookup table for vertical edge may be created to allow storing and retrieving the dose contributions to 4 vertical evaluation points at a time. Since each of these dose contributions may be represented by 16 bits, the group of 4 vertical evaluation points may be combined to form a long word of 64 bits, as shown by the numeral 3217. In such a way, to compute the group of 4 vertical evaluation points for imaging, about 6 to 7 table lookups are performed as opposed to the conventional method of each evaluation point would require 5 table lookups, which is an improvement of by a factor about 3 times. With the above description, person skilled in the art would appreciate that the similar approach may be applied to create a table for certain specific angle, such as a lookup table for horizontal edge 3208, a lookup table for angled edge A 3212, and a lookup table for angled edge B 3214, etc.

Note that each long word of 64 bit is constructed in such a way that each of the 16 bit unit would not overflow during simulation. This is done by controlling the scaling of each dose value represented by the 16 bit word. By packing the dose contributions for 4 evaluation points in a long word of 64 bits, the size of the table is increased by a factor of 4. Taking the table described in association with FIG. 31 for example, the new table size would be 400K bytes (100K×4). Also note that an edge of an object may not always be broken up to groups of 4 evaluation points. To address the remainder evaluation points near the end of an edge, such remainders may still be processed as a group of 4 evaluation points, except nothing would be done with the evaluation points that are not being used ("don't care" evaluation points). For example, the top half of the 64 bit long word is not used and masked out. In the special case that an edge goes off at a weird angle for which no special table was constructed, that edge's evaluation points can be divided into groups of 1, and simulated using the tables for any edge angle, with only 1 evaluation point used in each group of 4 evaluation points. Thus this edge may still be processed using the method described above, but only one evaluation point will be processed at a time and 3 of the 4 evaluation points are ignored. In this special case, a very small percentage (perhaps 1%) of the cases would be three times slower, but then special tables only need to be constructed for the common edge angles found in the design. Note that it is important to control the size of the lookup tables such that they can be stored in cache memory to avoid retrieving data from disk during simulation. For example, when processing horizontal edges, the lookup table for horizontal edge 3208 should be cached; when processing vertical edges, the lookup table for vertical edge 3210 should be cached.

It is desirable to minimize the amount of data created during image processing. This is important because it would reduce the time spent in adjusting edge pixels 3014 and accumulating exposure dosage 3016 as described in association with FIG. 30*a*. In addition, it would reduce the amount of data transmission to each of the SLMs. FIGS. 33*a*-33*d* illustrate methods for optimizing imaging objects according to embodiments of the present invention. In the example shown in FIG. 33*a*, objects 3301 and 3303 to be imaged are referenced by a pixel grid 3302 (grid not shown for better illustration, but it is similar to the one shown in FIG. 30*b*). In other embodiments, one or more objects may be referenced by the pixel grid 3302 and be processed simultaneously. It is assumed that multiple objects may occupy any area within the pixel grid 3302. In one implementation, the pixel grid 3302 has a width of 768 pixels and length of 1024 pixels. In other implementations, pixel grids of different sizes may be employed. For the first exposure, every pixel position of the entire pixel grid is computed and the results of computation are stored.

After the first exposure, the pixel grid 3302 is shifted horizontally by an amount of Delta X 3305 and vertically by an amount Delta Y 3307. In one implementation, the amount of Delta X 3305 may be 8.03 pixels and the amount of Delta Y 3307 may be 0.02 pixels. Note that the offsets Delta X and Delta Y are not integer multiple of pixels. The intent is to achieve consistency in imaging all figure edges. If the offsets were chosen to be integer multiple of pixels, the pixel grids would be aligned from one to the other. In that case, if an edge falls on the pixel grid, a sharper edge may be imaged; but if an edge falls in-between the pixel grid, a blurrier edge may be imaged. With offsets being non-integer multiple of pixels, the edges are imaged in similar manner when about 400 exposures are overlaid and accumulated, with different pixel grid positions, having the edges fall on pixel boundaries occasionally and fall in other locations of a pixel at other times. This method of jittered pixel averaging (JPA) provides sub-pixel edge position resolution, with consistent imaging performance for all edges.

FIG. 33*b* illustrates the pixel grid 3302 has shifted by Delta X and Delta Y and is shown as 3304. Note that this drawing is not to scale and the amount of Delta X and Delta Y have been exaggerated for illustration purposes. In general, the pixel grid may be shifted by a small amount from one pixel location (as in FIG. 33*a*) to a next pixel location (as shown in FIG. 33*b*) so that majority of computations performed for the previous exposure may be used for the current exposure. Therefore, the amount of computation is minimized. Note that the vertical shift is merely 0.02 pixels, which is practically negligible, even after a few vertical shifts. Within the pixel grid 3304, pixels in the leftmost strip 3306 (8.03×1024) are computed because it may be the last time the exposure dosage for these pixels are computed and adjusted (pixels to be shifted-out of the pixel grid). The rightmost strip 3310 (8.03×1024) are also computed because these pixels are newly introduced and have not been computed previously (pixels shifted-in). The middle strip 3308 (approximately 752×1024, shaded, also known as overlapping pixels) are copied from the previous computation performed in FIG. 33*a*. Since the middle strip 3308 is not recomputed each time the pixel grid is shifted, performance of the image writer system is significantly improved.

FIG. 33*c* illustrates the pixel grid 3304 has shifted by another Delta X and Delta Y and is shown as 3312. Similarly to the situation in FIG. 33*b*, within the pixel grid 3312, pixels in the leftmost strip 3314 (8.03×1024) are computed because it may be the last time the exposure dosage for these pixels are computed and adjusted. The rightmost strip 3318 (8.03×1024) are also computed because these pixels are newly introduced and have not been computed previously. The middle strip 3316 (approximately 752×1024, shaded) are copied from the previous computation performed in FIG. 33*b*.

FIG. 33*d* illustrates the pixel grid 3312 has shifted by another Delta X and Delta Y and is shown as 3320. Similarly to the situation in FIG. 33*c*, within the pixel grid 3320, pixels in the leftmost strip 3322 (8.03×1024) are computed because it may be the last time the exposure dosage for these pixels are computed and adjusted. The rightmost strip 3326 (8.03×1024) are also computed because these pixels are newly introduced and have not been computed previously. The middle strip 3324 (approximately 752×1024, shaded) are copied from the previous computation performed in FIG. 33*c*.

After three successive shifts of the pixel grid, the process may start anew and repeat the processes described in FIGS. 33a-33d.

One of the benefits of copying pixels from a previous exposure is that the processes of filling interior pixels 3012 and adjusting edge pixels 3014 as described in association with FIG. 30a may be skipped. In addition, the computation associated with block 3016 may be optimized by creating another dose table that represent the effect of four exposures, with constant pixel data and with the known Delta X and Delta Y values between them. Then for the pixels that are kept unchanged within a group of four exposures, a single set of table lookups may be performed in block 3016 instead of performing four sets of table lookups. Another benefit is that the amount of data transmission to SLMs is reduced. As a result, the overall performance of the image writer system is increased. A tradeoff resulted from copying pixels from a previous exposure is that both exposures assumes the same amount of dosage, which means there is fewer opportunities to adjust brightness of the edges. However, in a system having about 400 exposures, this is a small compromise in edge resolution for a large gain in system performance.

Note that after three successive shifts, the total amount of shifts in the Y direction is 0.06 pixels, which is a negligible amount. The total amount of shifts in the X direction is 24.09 pixels, and these pixels are being tracked closely and computed after each shift of the pixel grid. FIGS. 33a-33d illustrate a system implementing a sequence of three shifts. Applying the same principle, person skilled in the art would appreciate that a system may be designed to implement different number of shifts, such as one, two, four, or other number of shifts. In addition, different Delta X and Delta Y values, such as 8.10 pixels for Delta X and 0.03 pixel for Delta Y may be used.

Comparing to exposing with photons that do not carry electrical charge, in high throughput multiple charged-particle beam imaging systems, the imaging approach may involve using high current densities and high flash rates. Both may induce unwanted local feature shape distortions or critical dimension (CD) errors, which can be worse for some particular feature shapes. According to aspects of the present disclosure, various causes of local feature CD errors may be related to energy transfer and accumulation of the charged-particle beams, including but not limited to beam energy, resist type, resist thickness, exposure time (dose), development time, pattern density, and dose exposure rate.

In some embodiments, a MCB imaging system of the present disclosure can be configured to address the issue of heating effect that caused local feature CD error, which can be time dependent. In addition, the MCB imaging system of the present disclosure can also be configured to address the issue of charged-particle beam proximity effect, which may be less time dependent, but caused by the Coulomb's repulsion effect. Both of these issues may be minimized by the MCB imaging system as further described below.

According to aspects of the present disclosure, local heating that may induce feature placement error due to uneven substrate expansion, which can be mitigated by controlling heat dispassion in the substrate. For example, one method to reduce local heating is to perform multiple exposure passes of a given data pattern, where each exposure pass may have a reduced beam current and with an effective time delay that functions as a heat relaxation time between imaging exposure passes.

In comparing a single pass exposure using a full dose current against a four-pass exposure using less dose of current for each pass but with the same total dose, the outcome of exposure dose accumulated can be quite different between the two methods of different exposure passes. It is noted that using multiple exposure passes, and each pass having a smaller dose current can be effective in reducing local heating. Also, using time delay in a multiple charged-particle beam imaging system may be effective in reducing feature CD error since it allows relaxation time, which in turn allows heat to dissipate and thus reduces local heating.

Figure 33E:
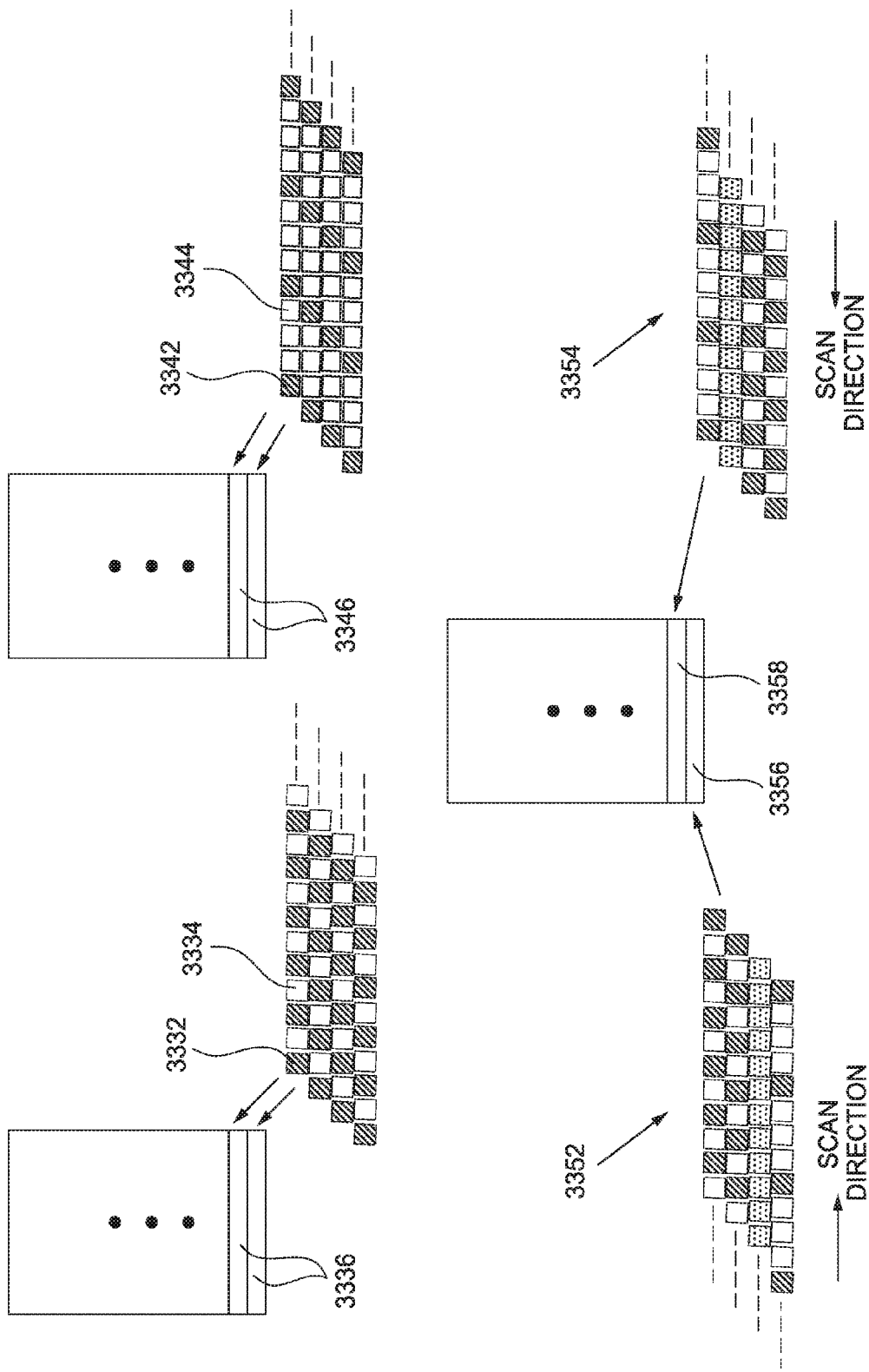
FIG. 33e illustrates methods of performing pixel blending exposures according to embodiments of the present invention.

FIG. 33e illustrates methods of performing pixel blending exposures according to embodiments of the present invention. In an exemplary implementation, each beam pixel exposure may already be at much reduced beam current dose since each feature may be formed by the overlap of multiple partial exposures, such as between 20 to 200 exposures, for example. This method may inherently have reduced the local heating as each exposure can be administrated at a lower dosage. In addition, the MCB imaging system may be configured to further minimize the local heating issue by analyzing the shapes of a target feature and then selectively turning on/off particular beam pixel exposures intermittently in a successive scanning exposure, i.e., to enable the modulation of the flash rate of exposure based on features identified, where it is likely to have local heating that may cause CD error. In this approach, a relaxation time between "on" pixel beams can then be "built-in" while each of the partial exposure doses can be compensated to achieve the intended nominal dose. Note that this approach may not suffer from a measureable throughput penalty since a large number of pixel beams may be statistically distributed in the process of pixel blending exposures.

In a scanning pixel blending exposure example, a set of pixel beams may be assigned to expose a particular region of a feature. For example, a number of pixel beams in succession are being turn on accordingly during the scan in making the scanning exposures. These pixel beams may be assigned to expose the region of the feature, where each pixel beam can contribute a fixed fraction of a nominal exposure dose. For another example, when it has been determined to have a need to reduce local heating effect, a larger fraction of the nominal exposure dose can be assigned to each of the "on" pixel 3332 beams but to turn "off" every other pixel 3334 beams in exposing a region of a feature 3336. This approach has effectively reduced the flash rate, or inserted a time delay of the successive mode of pixel blending exposure to allow a relaxation time for heat dissipation between each exposure. For yet another example, additional time delay but with higher fraction of the nominal dose for each "on" pixel 3342 beam but to have three "off" pixels 3344. In other implementations, different "on" and "off" pixel sequences may be employed for exposing a different region 3346 of a feature in accordance with conditions of beam energy, resist type, resist thickness, exposure time, development time, pattern density, and dose exposure rate.

According to aspects of the present disclosure, different pixel scan line may use different pixel patterns as shown in the two sets of pixel scan lines 3352 and 3354. For example, in the first set of pixel scan lines 3352, the first pixel scan line may include a repetitive pixel pattern on-off-off-off with a first nominal dose, the second pixel scan line may include a repetitive pixel pattern on-on-on-on with a second nominal dose, the third pixel scan line may include a repetitive pixel pattern on-off-on-off with a third nominal dose, and the four pixel scan line may have the same pixel pattern and electron energy level as the third pixel scan line. This example shows that the MCB imaging system may be configured to turn on or turn off a pixel, as well as administer any predetermined energy level (dosage) to any pixel in exposing a feature. In the example shown in FIG. 33e, the MCB imaging system may also be configured to apply a spatially inverted pixel pattern, for example the pattern 3354 is a spatially inverted pattern of 3352. Different exposing patterns, such as 3352 and 3354, may be applied to different regions of a feature, such as 3356 and 3358, respectively. Moreover, the pattern 3352 may be applied in a first scan direction, and the pattern 3354 may be applied in a second scan direction, which is different from the first scan direction. As a result, the MCB imaging system of the present disclosure may be configured to sufficient statistical distribution of exposures by using multiple passes. In some implementations, a pixel may be exposed with a single MCB imaging unit. In some other implementations, a pixel may be exposed with multiple MCB imaging units configured to work in a coherent fashion.

When the image writer system is built, various sources of inaccuracies may be introduced, such as inaccuracies in the alignment of the various components used in the system, inaccuracies from manufacturing defects of the lenses and other optical components. The following sections discuss methods to determine and correct such inaccuracies according to embodiments of the present invention.

To determine the accuracy of the image writer system, measurements are made to determine: 1) distances between adjacent SLMs; 2) amount of rotation or tilt of the DMD mirror array; and 3) amount of optical magnification/reduction from a SLM (DMD) to the substrate. In one approach, known patterns are placed on the stage and measurements are made to collect data of the above parameters of interest. Images are taken through the lens of a SLM, and the size of a camera pixel in real terms may be determined. To measure rotation/tilt of a SLM, a Fourier transformation is performed on the collected data to determine the angle of rotation. In another approach, a premade calibration substrate may be placed on stage and examined at first through lens camera from the center point of view. Then move the stage by certain predetermined distances along a user defined axes (for example by delta x, and delta y), and repeat the examination of the premade calibration substrate through the camera of each SLM.

After the parameters of the system have been measured, such data can be used to correct inaccuracies of the system. In one approach, the substrate may be divided into areas to be imaged by corresponding SLMs. Based on the spacing of 100 mm between the SLMs, the system provides sufficient overlap between two adjacent SLMs, for example up to a few millimeters, to ensure any area of the substrate can be adequately covered by displacing a pattern correspondingly in the coordinate space of the SLMs. In another approach, when a pixel grid is placed on the substrate, the pixel grid may be expanded or contracted to correct the magnification/reduction variation from a SLM to the substrate. For example, if a target reduction ratio is 10:1, a reduction ratio of 10.1:1 would have introduced a 1% variation to the optical path and such variation may be compensated by the pixel grid. In yet another approach, the location of a reference evaluation point is determined, and then the distance and/or angle of a corresponding evaluation point can be determined using the reference evaluation point and the variations due to the inaccuracies measured from the actual system. Note that such corrections would typically affect the edges of objects, the basic flow of the imaging process as described in association with FIG. 30a would remain the same.

In addition to the inaccuracies from the assembly of the system, distortions may be introduced by the lenses or other elements in the projection mechanism. According to embodiments of the present invention, a distortion effect, such as pin cushion distortion, may be described as a location in polar coordinate, where r is modified by certain amount, for example, $r'=r-0.02*r^3$. Note that this approach of correcting distortion error is similar to the approach of correcting a scaling error. In both cases, in order to determine which pixel an edge (or evaluation point) is in, the method needs to measure the size of the pixel, which may have changed slightly due to geometric variations and other effects.

In practice, the amount of distortion is related to the quality of lenses used in the imaging writer system, with high-quality lenses producing less distortion. Such distortion may be determined by simulation during the design process, or by measurement after the lenses are made. In one approach, an image writer system may use reasonably high quality lenses and apply the methods described herein to correct the relatively small fraction of distortions. To correct errors due to distortion, the system first determines the function of the distortion; it then applies an inverse function of the distortion when imaging the object to correct the distortion. Note that, this approach of correcting distortions may be applied to other forms and shapes of distortions, as long as the distortion function is found, an inverse function may be created to correct the distortion. This approach is further described in association with FIG. 34a below.

FIG. 34a illustrates methods for making corrections to the optical imaging writer system according to embodiments of the present invention. In the example shown in FIG. 34, the numeral 3402 represents a simplified pixel grid and the numeral 3404 represents a distorted pixel grid. The numeral 3406 represents an object to be imaged and the numeral 3408 represents an inverse function for correcting distortion of the object 3406. Note that, near the middle, the center square of the distorted pixel grid 3404 is substantially the same as the original pixel grid 3402. But out at the corner, the "square" of the distorted pixel grid looks more like trapezoidal. Person skilled in the art would appreciate that other form and shape of pixel grid may be used, such as a rectangular pixel grid having a size of 1024×768 pixels.

Note that the pixel grid 3402 describes an area to be imaged with one SLM or describes a portion of an area to be imaged by the SLM. In different exposures administered by the SLM, the area described by the pixel grid may be moved around relative to the location of the SLM and its exposure field. Thus, the shape of the distortion may change depending on the location of the SLM and exposure. In general, an area near the middle gets little distortion; but an area near the corners gets more distortion.

As shown in the example of FIG. 34, in order to sample the object 3406, the system transforms the coordinates of the object into coordinates of the SLM array, which is represented by the transformation of the object from 3406 to 3408. In essence, the system takes the shape of the object 3406, distorting it in an inverse way (represented by 3408), and then the distorted lens of the SLM, which sees the original pixel grid 3402 in the form of distorted pin cushion 3404, may be used to image the object.

As described in FIGS. 30a and 30b, evaluation points are chosen along the edges of the object 3406. The circular region 3409 illustrates a small section of the edges 3406 and its corresponding inverse function 3408. The numeral 3410 represents four evaluation points along the object 3406 and the numeral 3412 represents corresponding four evaluation points would fall along the inverse function 3408. The circular region 3409 is enlarged and shown on the right hand side of FIG. 34.

Note that for the groups of 4 evaluation points, the spacing between them is determined by Nyquist theory of maximum resolution of the lens. Typically, the spacing between evaluation points may be a fraction of a pixel, such as ½ or ⅓ of a pixel, etc. In such situations, the distortion may be even smaller fraction of a pixel. Over the range of the distance of four evaluation points, the distortion is likely to be very small, for example in the order of 1/25 of a pixel, and the curvature of the four evaluation points due to distortion may be negligible.

As shown in the circle of FIG. 34a (drawing not to scale, with the distortion exaggerated), the four exemplary evaluation points along a vertical line 3414 on the left hand side may be mapped to four evaluation points along a distorted line 3416 on the right hand side to form an inverse of the distortion function. Accordingly, the center point 3418 of the vertical line is mapped to the center point 3420 of the distorted line, which acts as a reference of the 4 evaluation points of the distorted line. Note that FIG. 34a has exaggerated the deviation of the evaluation points from the distorted line. According to implementations of the present invention, the deviation is very small, typically less than about 0.1 percent of a pixel off from the reference center point 3420. With the above framework, the group of four distorted evaluation points may be computed using the methodologies described above from FIG. 30 to FIG. 33.

According to embodiments of the present invention, considering the group of four evaluation points in view of the quantization of ⅛ pixel as discussed in association with FIG. 31a, if there is a distortion of 1/25 of a pixel, and the center point is snapped to the ⅛ of a pixel grid, which gives an error of 1/16 of a pixel. Over the course of imaging through multiple exposures with different SLM and exposure locations, there is a tendency for these errors to cancel out each other. For example in some exposures, the SLMs may be tilted one way, and in other exposures the SLMs may be tilted the other way. As a result, the image may get a smoothed edge. In other words, the errors may be averaged out, which is in addition to the situation that they may be small enough to be considered negligible. In the process of determining which ⅛ of pixel grid the 4 evaluation points falls on, the correction is made using the new location of the center of the distorted 4 evaluation points 3420. Note that in this example, the center point 3420 may be shifted both vertically and horizontally.

Figure 34C:
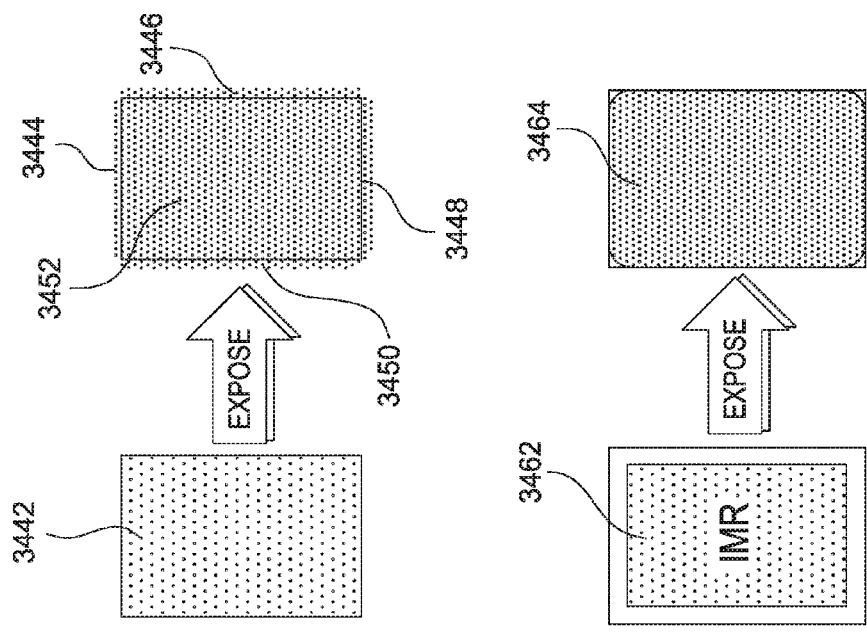
FIG. 34c illustrates another method of applying pixel blending exposure for charged-particle beam proximity effect correction according to embodiments of the present invention.
Figure 34B:
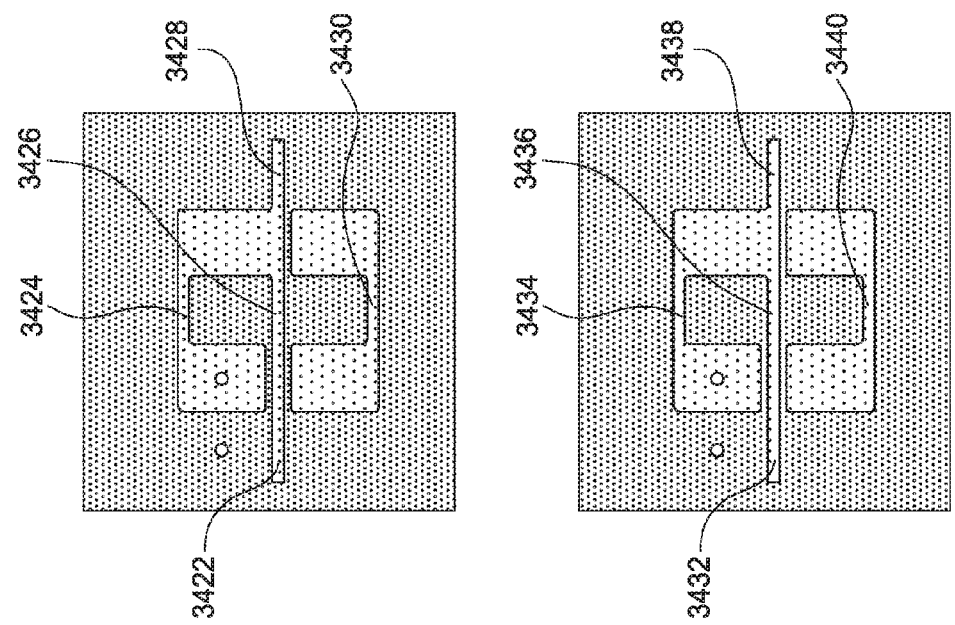
FIG. 34b illustrates a method of applying pixel blending exposure for charged-particle beam proximity effect correction according to embodiments of the present invention.

FIG. 34b illustrates a method of applying pixel blending exposure for charged-particle beam proximity effect correction according to embodiments of the present invention. According to aspects of the present disclosure, a proximity effect correction method requires an accurate knowledge of the energy density profile deposited in the electron resist layer due to a point or pixel exposure. In general, this profile is a function of the system setup. One property of this profile is that the shape can be independent of dose as well as position, assuming a planar and homogeneous substrate. This profile may be approximated by the sum of two Gaussian distributions $$f(r) = C_1 \exp(-(r/B_1)^2) + C_2 \exp(-(r/B_2)^2)$$

representing the forward and the backscattered electrons. $C_1$, $C_2$, $B_1$ and $B_2$ are constants and r is the distance from the point of electron incidence. One approach is to write this expression as follows $$f(r) = \frac{1}{1+\eta}\left(\frac{1}{\pi\alpha^2}\exp\left(-\frac{r^2}{\alpha^2}\right) + \frac{\eta}{\pi\beta^2}\exp\left(-\frac{r^2}{\beta^2}\right)\right)$$

where $\eta$ is the ratio of the backscattered energy to the forward-scattered energy, $\alpha$ is the forward scattering range parameter and $\beta$ is the backscattering range parameter. The above equation can be normalized so that where $\eta$ is the ratio of the backscattered energy to the forward-scattered energy, $\alpha$ is the forward scattering range parameter and $\beta$ is the backscattering range parameter. The above equation can be normalized so that $$\int_0^\infty f(r) 2\pi r \, dr = 1$$

In some embodiments, since the energy deposition profile gives the response of a single pixel (point) exposure, the exposure of a circuit pattern can be mathematically described by a convolution:

$$E(x,y) = f(r) * d(x,y) \text{ with } \sqrt{r = x^2 + y^2}$$

where E(x,y) is the energy deposited in the resist, f(r) the point exposure profile and d(x,y) the input dose as a function of position. The developed image E'(x,y) can be obtained from E(x,y) by $$E'(x, y) = \begin{cases} 0 & E(x, y) < \tau \\ 1 & E(x, y) \geq \tau \end{cases}$$

where $\tau$ is an experimentally determined development threshold. E'(x,y)=0 and E'(x,y)=1 are denoting undeveloped and developed resist respectively.

According to aspects of the present disclosure, small pixel sizes may be employed to obtain an accurate image by using cumulative distribution function of primitive shapes, such as rectangles. Furthermore, the memory requirements may be reduced by separating the total exposure in two components, one due to the forward scattering component (i.e. due to local exposure), which is sharp and has a short range, and one due to the backscattering component (i.e. due to global exposure), which may be flat and has a long range. The local exposure can be evaluated in a small window around a critical point of interest, while the global exposure can be evaluated in a coarser grid without compromising much accuracy degradation.

Referring to FIG. 34b, the upper image shows a test pattern without applying the technique of proximity effect correction. As a result, there are a number of unresolved regions in the test pattern, as indicated by numerals 3422, 3424, 3426, 3428, and 3430. On the other hand, by applying proximity effect corrections as described herein, the lower image shows the previously unresolved regions being resolved as indicated by numerals 3432, 3434, 3436, 3438, and 3440.

According to aspects of the present disclosure, three methods may be applied for proximity effect correction, namely background correction exposure, shape modification, and dose modification. For example, in dose modification, a different dose can be applied to each pixel. In one approach, the MCB imaging system can be configured to implement a dose correction algorithm as described in association with FIG. 30c and FIG. 30d may be employed, in order to determine a dose for each pixel. Let $Q_j$ be the dose applied to pixel j and let N be the total amount of pixels. The total energy on pixel i will be:

$$E_i = \sum_{j=1}^{N} R_{ij} Q_j$$

with $$R_{ij} = \frac{\overline{\Delta V_f}}{t}\left(\frac{1}{\pi\alpha^2}\exp\left(-\frac{r_{ij}^2}{\alpha^2}\right) + \frac{\eta}{\pi\beta^2}\exp\left(-\frac{r_{ij}^2}{\beta^2}\right)\right)$$

where $r_{ij}$ is the distance between pixel centers of i and j. This equation can be written in matrix notation for all i:

$$[E_i] = [R_{ij}][Q_j]$$

Solving this set of equations with matrix operations can provide a proximity effect corrected pattern.

FIG. 34c illustrates another method of applying pixel blending exposure for charged-particle beam proximity effect correction according to embodiments of the present invention. In some implementations of shape modification, a single dose may be used for a circuit feature. In some other implementations, multiple doses may be used for the circuit feature. The shapes found in the pattern image can be modified that the developed image can be made closely resemble the intended image. For example, a pattern may be partitioned into rectangular circuit elements. Each of the circuit elements may then be individually adjusted. In one particular implementation, each rectangle can be replaced with a corresponding inner maximal rectangle (IMR), as shown in FIG. 34c. Referring to FIG. 34c, the upper image shows a rectangular circuit element 3442 that is exposed without shape modification. Thus, the resulting exposed image 3452 may contain inaccuracies (relative to the rectangle) as shown with numerals 3444, 3446, 3448, and 3450. The lower image shows the same rectangular circuit element 3442 that is exposed with shape modification, by applying an inner maximal rectangle 3462. As a result, the resulting exposed image 3464 may contain fewer inaccuracies as compared to the exposed image 3452 in the upper image.

Then, the effect of interaction among the different circuit elements can be corrected. Each edge facing other circuit elements can be adjusted so that the midpoint of the edge may be equal to the experimental determined development threshold. Then, the shapes of the circuit elements may be modified at critical points, such as junctions between adjacent rectangles as shown in FIG. 34d.

Figure 34D:
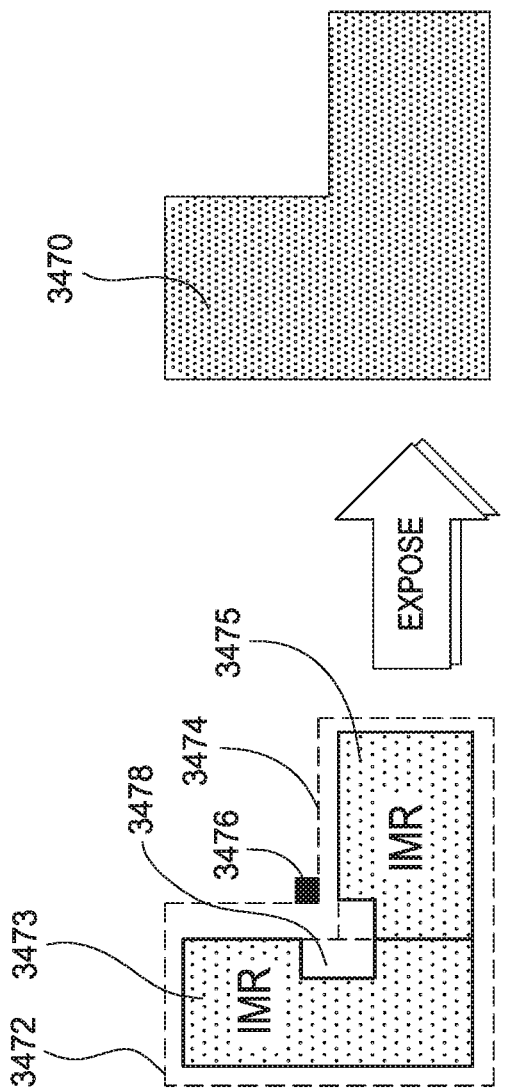
FIG. 34d illustrates yet another method of applying pixel blending exposure for charged-particle beam proximity effect correction according to embodiments of the present invention.

FIG. 34d illustrates yet another method of applying pixel blending exposure for charged-particle beam proximity effect correction according to embodiments of the present invention. In the example shown in FIG. 34d, to achieve the resulting exposed image 3470 shown on the right, one approach is to partition the circuit feature into two or more rectangular circuit elements (3472 and 3474), apply a corresponding IMR to each of the rectangular circuit elements (3473 and 3475), identify a critical area 3476 where possible excessive exposure may have occurred, remove parts of the interior 3478 from the two or more rectangular circuit elements. As a result, by applying the above method, the issue of backscattering can be reduced substantially, as shown in the resulting exposed image 3470 on the right.

Embodiments of the present invention not only are applicable and beneficial to the lithography for manufacturing of FPD and mask for FPD manufacturing, the making of one-of-the-kind or precision duplicates of life-sized art on glass substrate, they are also applicable and beneficial to the manufacturing of integrated circuits, computer generated holograms (CGH), printed circuit board (PCB), for large imaging display applications in both micro and meso scales.

Embodiments of the present invention are further applicable and beneficial to lithography manufacturing processes without using mask, such as writing intended mask data patterns to substrates directly. In this way, the mask cost and associated issues of concern are eliminated. Embodiments of the present invention enable exposure tools for mask-less exposure that exceeds the throughput requirements for the upcoming G10 and beyond. More importantly, this configuration comes with improved process window to ensure better lithography yield.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method for processing image data in a lithography manufacturing process, comprising:
   providing a parallel imaging writer system, wherein the parallel imaging writer system includes a plurality of multiple charged-particle beam (MCB) imaging units arranged in one or more parallel arrays;
   receiving a mask data pattern to be written to a substrate;
   processing the mask data pattern to form a plurality of partitioned mask data patterns corresponding to different areas of the substrate;
   identifying one or more objects in an area of the substrate to be imaged by corresponding MCB imaging units; and
   performing multiple exposures to image the one or more objects in the area of the substrate by controlling the plurality of MCB imaging units to write the plurality of partitioned mask data patterns in parallel, wherein performing multiple exposures to image the one or more objects further comprises:
    selectively exposing a first set of pixel locations using a first dose having a first electron energy level; and
    selectively exposing a second set of pixel locations using a second dose having a second electron energy level wherein
    the first set of pixel locations are exposed in a first scan direction;
    the second set of pixel locations are exposed in a second scan direction;
    wherein the first scan direction is different from the second scan direction; and
    wherein the first electron energy level is different from the second electron energy level.

2. The method of claim 1, wherein performing multiple exposures to image the one or more objects further comprises at least one of:
    performing multiple exposures of a pixel using one of the MCB imaging unit; or
    performing multiple exposures of a pixel using a set of the MCB imaging units.

3. A system for processing image data in a lithography manufacturing process, comprising:
    a parallel imaging writer system, wherein the parallel imaging writer system includes a plurality of multiple charged-particle beam (MCB) imaging units arranged in one or more parallel arrays;
    a controller configured to control the plurality of MCB imaging units, wherein the controller includes
    logic for receiving a mask data pattern to be written to a substrate;
    logic for processing the mask data pattern to form a plurality of partitioned mask data patterns corresponding to different areas of the substrate;
    logic for identifying one or more objects in an area of the substrate to be imaged by corresponding MCB imaging units; and
    logic for performing multiple exposures to image the one or more objects in the area of the substrate by controlling the plurality of MCB imaging units to write the plurality of partitioned mask data patterns in parallel, wherein logic for performing multiple exposures to image the one or more objects further comprises:
        logic for selectively exposing a first set of pixel locations using a first dose having a first electron energy level; and
        logic for selectively exposing a second set of pixel locations using a second dose having a second electron energy level wherein
        the first set of pixel locations are exposed in a first scan direction;
        the second set of pixel locations are exposed in a second scan direction;
        wherein the first scan direction is different from the second scan direction; and
        wherein the first electron energy level is different from the second electron energy level.

4. The system of claim 3, wherein logic for performing multiple exposures to image the one or more objects further comprises at least one of:
    logic for performing multiple exposures of a pixel using one of the MCB imaging unit; or
    logic for performing multiple exposures of a pixel using a set of the MCB imaging units.

\* \* \* \* \*